United States Patent
Li et al.

(10) Patent No.: US 11,817,531 B1
(45) Date of Patent: Nov. 14, 2023

(54) PHOSPHOR-CONVERTED RED LEDS AND COLOR-TUNABLE MULTI-LED LIGHTING DEVICES

(71) Applicant: Bridgelux, Inc., Fremont, CA (US)

(72) Inventors: Yl-Qun Li, Danville, CA (US); Jingqiong Zhang, Xiamen (CN); Jungang Zhao, Suzhou (CN)

(73) Assignee: Bridgelux, Inc., Fremont, CA (US)

( * ) Notice: Subject to any disclaimer, the term of this patent is extended or adjusted under 35 U.S.C. 154(b) by 0 days.

(21) Appl. No.: 18/306,780

(22) Filed: Apr. 25, 2023

Related U.S. Application Data

(63) Continuation-in-part of application No. PCT/US2023/060694, filed on Jan. 13, 2023, which
(Continued)

(51) Int. Cl.
*H01L 33/50* (2010.01)
*H01L 25/075* (2006.01)
(Continued)

(52) U.S. Cl.
CPC ............ *H01L 33/504* (2013.01); *C09K 11/02* (2013.01); *C09K 11/617* (2013.01);
(Continued)

(58) Field of Classification Search
CPC ... H01L 33/504; H01L 25/0753; C09K 11/02; C09K 11/617; C09K 11/77342; C09K 11/77348
See application file for complete search history.

(56) References Cited

U.S. PATENT DOCUMENTS 7,893,631 B2   2/2011  Speier
2012/0223657 A1*  9/2012  Van De Ven .......... H05B 45/46
315/297
(Continued)

FOREIGN PATENT DOCUMENTS

WO    2021007123 A1    1/2021

OTHER PUBLICATIONS

PCT/US2023/060694 International Search Report & Written Opinion, dated Apr. 5, 2023.
(Continued)

*Primary Examiner* — Ratisha Mehta
(74) *Attorney, Agent, or Firm* — Shirley A. Recipon

(57) ABSTRACT

A lighting device comprising: a first LED having a wavelength of maximum emission intensity from 620 nm to 640 nm; a second LED having a wavelength of maximum emission intensity from 500 nm to 565 nm; a third LED having a wavelength of maximum emission intensity from 430 nm to 480 nm; and a fourth LED for generating light comprising a CCT in a range from 1800K to 5000K. The first LED comprises a Phosphor-Converted LED comprising a first LED chip having a maximum emission intensity wavelength from 400 nm to 480 nm, and a narrowband red phosphor with a FWHM less than 55 nm. Light generated by the device comprises a combination of light generated by the first, second, third, and fourth LEDs and a CCT of light generated by the device is tunable by independently controlling power to the first, second, third, and fourth LEDs.

22 Claims, 36 Drawing Sheets

Related U.S. Application Data is a continuation of application No. PCT/CN2022/120875, filed on Sep. 23, 2022.

(60) Provisional application No. 63/299,408, filed on Jan. 13, 2022.

(51) Int. Cl.
  *C09K 11/77* (2006.01)
  *C09K 11/61* (2006.01)
  *C09K 11/02* (2006.01)

(52) U.S. Cl.
  CPC .. *C09K 11/77342* (2021.01); *C09K 11/77348* (2021.01); *H01L 25/0753* (2013.01)

(56) References Cited

U.S. PATENT DOCUMENTS

| | | |
|---|---|---|
| 2013/0141013 A1 | 6/2013 | Kodama et al. |
| 2015/0034980 A1 | 2/2015 | Windisch |
| 2018/0108816 A1* | 4/2018 | Todorov ............... H01L 33/507 |
| 2019/0341531 A1 | 11/2019 | Zhang et al. |
| 2021/0376200 A1 | 2/2021 | Kim et al. |
| 2021/0259074 A1 | 8/2021 | Petluri et al. |

OTHER PUBLICATIONS

PCT/CN2022/120875 International Search Report & Written Opinion, dated Jan. 12, 2023.

\* cited by examiner

SECTION A-A

SECTION A-A

SECTION B-B

SECTION A-A

SECTION B-B

SECTION C-C

SECTION D-D

SECTION A-A

SECTION B-B

SECTION A-A

SECTION B-B

US 11,817,531 B1

PHOSPHOR-CONVERTED RED LEDS AND COLOR-TUNABLE MULTI-LED LIGHTING DEVICES

CROSS REFERENCE TO RELATED APPLICATIONS

This application is a Continuation-In-Part bypass application of PCT application No. PCT/US23/60694, filed Jan. 13, 2023, entitled "Phosphor-Converted Red LEDs and Color-Tunable Multi-LED Lighting Devices" which claims the benefit of priority to: (i) International Patent Application PCT/CN2022/120875, filed Sep. 23, 2022, entitled "Phosphor-Converted Red LEDs and Color-Tunable Multi-LED Packaged Light Emitting Devices" and (ii) U.S. Provisional application No. 63/299,408, filed Jan. 13, 2022, entitled "Phosphor-Converted Red LEDs", each of which are hereby incorporated by reference in their entirety.

FIELD OF THE INVENTION

A first aspect of the invention relates generally to Phosphor-Converted (PC) Color LEDs that generate light of a selected color. More particularly, embodiments of the invention concern Phosphor-Converted Red LEDs (PC Red LEDs) for generating narrowband red light. Another aspect of the invention concerns color-tunable multi-LED (Light Emitting Diode) lighting devices that can generate light with a color temperature from 2200K to 6500K and optionally light of colors from red to blue. More particularly, though not exclusively, the invention concerns color-tunable multi-LED lighting devices and packaging arrangements that utilize PC Red LEDs.

BACKGROUND OF THE INVENTION

Phosphor-Converted Color LEDs (Light Emitting Diodes), also known as "PC Color LEDs", typically comprise a blue LED chip and a phosphor (photoluminescence) material that converts substantially all of the excitation light generated by the LED chip to light of a selected color such as, for example, green, yellow, orange or red through a process of photoluminescence wavelength conversion. Since all light generated by the LED chip is converted to light of a selected color, such PC Color LEDs can be referred to as Fully Phosphor-Converted (FPC) Color LEDs. PC Color LEDs are to be contrasted with PC White LEDs in which there is only partial conversion of blue light generated by the LED chip, with the remainder of the blue light contributing to the final white light emission product. Light produced by a PC Color LED is typically broadband and has a FWHM (Full Width at Half Maximum) of 70 nm to 120 nm depending on the phosphor composition. The color (peak emission wavelength) of light generated by a PC Color LED depends on the phosphor material composition.

PC Color LEDs are to be contrasted with Direct-Emitting "Color LEDs" that directly generate substantially monochromatic light (FWHM 20 to 25 nm) without photoluminescence (phosphor) wavelength conversion, with the color of the light being determined by the semiconductor material system of the LED chip. For example, Direct-Emitting Green LEDs use a InGaN-based (indium gallium nitride) LED chip, Direct-Emitting Red LEDs use an AlInGaP-based (aluminum indium gallium phosphide) LED chip, and Direct-Emitting Blue LEDs use an InGaN-based (indium gallium nitride) LED chip.

Due to their narrowband emission characteristics, Direct-Emitting red, green and blue Color LEDs find particular utility in RGB (Red Green Blue) systems, such as, for example, display backlights, for improving the color gamut of the display and color-tunable multi-LED packages (multi-LED packaged lighting devices) for general lighting. Current color-tunable multi-LED lighting devices typically contain red, green, and blue Direct-Emitting "Color LED" chips.

An example of a known color-tunable multi-LED packaged lighting device (Surface Mount Device—SMD) is shown in FIGS. 1A and 1B in which FIG. 1A shows a top view and FIG. 1B shows a sectional side view through A-A of the multi-LED package. The known multi-LED device 1 comprises a lead frame 2 for providing power to the red, green and blue direct-emitting LED chips 3R, 3G, 3B. A housing 4 is molded onto the lead frame and comprises a single cavity (recess) 5 (e.g., circular in shape). The red, green, and blue LED direct-emitting LED chips 3R, 3G, 3B are mounted on the floor of the cavity 5 and electrically connected to the lead frame 2. To protect the LED chips 3 from the external environment, the cavity 5 is typically filled with a light-transmissive encapsulant 6 such as a silicone material. Portions of the lead frame 2 extend laterally to the outside edges of the housing 4 and form respective electrical terminals 7R, 7G, 7B, 8R, 8G, 8B along opposing edges and base of the package allowing electrical power to be independently (individually) applied to the anode and cathode of each of the red, green and blue direct-emitting LED chips 3R, 3G, 3B. PC white LEDs are to be contrasted with Direct-Emitting Color LED chips, wherein PC white LEDs comprise a Direct-Emitting blue LED chip and a photoluminescence material, typically a phosphor material, that converts a portion blue excitation light generated by the LED chip, with the remainder of the blue light contributing to the final white emission product. The phosphor material can be incorporated in the light-transmissive encapsulant used to fill the cavity 5, for example.

A disadvantage of multi-LED lighting devices based on Direct-Emitting Color LEDs, however, is that, since they are based on different semiconductor material systems, each Color LED typically has different characteristics relating to thermal stability, ageing characteristics, drive requirements etc. As a result of these different characteristics, the light output of Red, Green and Blue LEDs will change differently to one another with temperature and time. The color composition of light generated by an RGB system based on Color LEDs will consequently change with temperature and time and such RGB systems may employ complex drive circuitry to compensate for these differing characteristics which can lead to additional cost during manufacture and maintenance. In contrast, PC Color LEDs eliminate the need for such measures since they are all based on blue LED chips with the same semiconductor material and have the same drive requirements, thermal stability etc.

Current PC Red LEDs typically use broadband red nitride phosphors and have a peak emission wavelength from 620 nm to 630 nm. In many applications, including, for example, display backlighting, brake lights and turn signals for vehicles, traffic signals, emergency vehicle lights etc., it is desirable if they could generate narrowband red light with a FWHM comparable with, or shorter than, that of direct-emitting Color LEDs (FWHM≈20 to 25 nm).

Narrowband red phosphors such as, for example, manganese-activated fluoride-based phosphors (narrowband red fluoride phosphors) such as $K_2SiF_6:Mn^{4+}$ (KSF), $K_2TiF_6:Mn^{4+}$ (KTF), and $K_2GeF_6:Mn^{4+}$ (KGF) have a very narrow red emission spectrum (Full Width at Half Maximum of less than 10 nm for their main emission line spectrum) which makes them highly desirable for attaining high brightness and luminous efficacy in PC White LEDs (about 25% brighter than broadband red phosphors such as europium-activated red nitride phosphor materials such as CASN—CaAlSiN$_3$:Eu). While narrowband red fluoride phosphors appear on the face of it to be an ideal choice for PC Red LEDs, there are drawbacks that make their use in PC Red LEDs challenging. For example, the absorption efficiency of narrowband red fluoride phosphors is substantially lower (typically about a tenth) than that of red nitride phosphors currently used in PC Red LEDs. Thus, to attain full conversion of blue light to red light would require 5 to 20 times a greater amount of usage of narrowband red fluoride phosphor compared with the usage amount of red nitride phosphor. Such an increase in the amount of overall phosphor usage would significantly increase the cost of manufacture and particularly since narrowband red fluoride phosphors are significantly more expensive than europium-activated red nitride phosphors (e.g., at least five times more expensive) making them prohibitively expensive for use in PC Red LEDs.

Moreover, it is found that the very low absorption efficiency of narrowband red fluoride phosphors can result in unconverted blue light generated by the LED chip ending up in the emission product, so called "blue pass through", that reduces the "color purity" of the red-light emission. While "blue pass through" may be acceptable in white light systems, such as, for example, display backlighting, where blue light is a constituent component of the white light, for applications requiring a "pure red" (substantially monochromatic) light—"blue pass through" will degrade the color purity of the red light and is, therefore, highly undesirable.

Another problem with utilizing, in terms of photoluminescence material, only narrowband red fluoride phosphors is that, while they provide a narrowband red emission, they suffer from readily reacting with water or moisture causing damage to the dopant manganese which leads to a reduction, or loss, of the photoluminescence emission (i.e., quantum efficiency) of the phosphor. Moreover, the reaction of the fluoride-based compound with water can generate very corrosive hydrofluoric acid that can react with LED packaging material, such as for example bond wires, thereby leading to premature device failure.

The present invention intends to address and/or overcome the limitations discussed above by presenting new designs and methods not hitherto contemplated nor possible by known constructions. More particularly, although not exclusively, embodiments of the invention concern improvements relating to increasing the luminous efficacy of color tunable multi-LED lighting devices, increasing color purity of PC red LEDs by reducing "blue pass through"; reducing narrowband red fluoride phosphor usage; and isolating narrowband red fluoride phosphor from water/moisture in the surrounding environment through innovative phosphor packaging structures that effectively improve the blue absorption efficiency of narrowband red fluoride phosphors.

SUMMARY OF THE INVENTION

A first aspect of the invention relates generally PC Red LEDs utilizing InGaN-based blue emitting LEDs that contain a combination of a narrowband red fluoride phosphor (e.g., manganese-activated fluoride narrowband red phosphor) and a red phosphor having a higher absorption efficiency such as, for example, a broadband red phosphor. The inclusion of a broadband red phosphor having a higher absorption efficiency than the narrowband red fluoride phosphor converts blue light that is not converted by the narrowband red fluoride phosphor to red light and substantially reduces, or even eliminates, blue pass through and improves color purity. It could be said that the inclusion of the red phosphor having a higher absorption efficiency than the narrowband red fluoride phosphor compensates for the lower absorption efficiency of the narrowband red fluoride phosphor in this way. The combination of a narrowband red fluoride phosphor (e.g., manganese-activated fluoride narrowband red phosphor) and a red phosphor having a higher absorption efficiency such as, for example, a broadband red phosphor thus providing a synergistic effect of at least improved color purity, for instance.

The broadband red phosphor and the narrowband red fluoride phosphor can be provided in the same (single) layer, for example as a mixture. This may improve the ease by which the PC Red LEDs can be manufactured by simplifying the process, thus reducing manufacturing costs and time.

In other embodiments, the broadband red phosphor and narrowband red fluoride phosphor can each be provided in a respective layer with the layer containing the narrowband red fluoride phosphor being disposed in closer proximity to the LED chip than the layer containing the broadband red phosphor. Such an arrangement can effectively increase the absorption efficiency of the narrowband red fluoride phosphor and substantially reduces usage amount of the narrowband red fluoride phosphor. The layer containing the narrowband red fluoride phosphor can be in direct contact with at least one of the light emitting faces of the LED chip. The layer containing the broadband red phosphor can be in direct contact with and may completely cover (encapsulate) the layer containing the narrowband red fluoride phosphor. Such a configuration/arrangement can provide environmental protection to the layer containing the narrowband red fluoride phosphor and improve overall device reliability.

According to an aspect of the invention, there is provided a red-light emitting device comprising: an LED chip having a peak emission from 400 nm to 500 nm; and a photoluminescence material comprising a narrowband red fluoride phosphor and a broadband red phosphor.

In embodiments, the narrowband red fluoride phosphor and broadband red phosphor may be constituted as a single-layer photoluminescence structure. The phosphors can be provided in the same layer, for instance. The phosphors can be provided in a single layer, typically as a mixture, and the layer may be in direct contact with the LED chip. In this specification, "direct contact" means without an air gap or photoluminescence material containing layer. It may be that the device comprises a light transmissive layer disposed between the photoluminescence material containing layer and the LED chip. The light transmissive layer provides passivation to the LED chip and provides a barrier to the LED chip from the possible effects of the narrowband red fluoride phosphor. Such an arrangement can improve device reliability.

To further improve the absorption efficiency of the narrowband red fluoride phosphor, the narrowband red fluoride phosphor can be disposed in closer proximity to the LED chip than the broadband red phosphor. By locating the narrowband red fluoride phosphor closer to the LED chip this effectively increases the absorption efficiency of the narrowband red fluoride phosphor as it is not having to compete with the broadband red phosphor for blue photons.

In embodiments, the red-light emitting device may comprise a double-layer photoluminescence structure comprising a first layer containing the narrowband red fluoride phosphor disposed adjacent to the LED chip and a second layer containing the broadband red phosphor material that is disposed on, and covers, the first layer. The second layer can partially or completely cover the first layer.

Compared with a single-layer photoluminescence structure, a double-layer photoluminescence structure having a first layer containing, in terms of photoluminescence material, only, or substantially only (at least 90 wt % for example), narrowband red fluoride phosphor that is covered by the second layer can provide a number of benefits, including but not limited to: (1) a substantial reduction in narrowband red fluoride phosphor usage (at least 40% reduction), (2) the second layer provides environmental protection to the first layer thereby reducing the chance of water/moisture reaching and degrading the narrowband red fluoride phosphor, and (3) substantially reduce, or even eliminate "blue pass through" leading to better color purity of red light generated by the device.

The first layer can be in direct contact with at least one light emitting face (surface) of the LED chip.

The second layer can be in direct contact with the first layer.

To further reduce narrowband red fluoride phosphor usage, the first layer can further comprise particles of a light scattering material such as for example particles of zinc oxide; silicon dioxide; titanium dioxide; magnesium oxide; barium sulfate; aluminum oxide and combinations thereof.

The narrowband red fluoride phosphor can include one, or more, of $K_2SiF_6:Mn^{4+}$, $K_2GeF_6:Mn^{4+}$, and $K_2TiF_6:Mn^{4+}$, or may be selected from the group consisting of $K_2SiF_6:Mn^{4+}$, $K_2GeF_6:Mn^{4+}$, and $K_2TiF_6:Mn^{4+}$.

To reduce the FWHM of the red-light emission product of the device, the peak emission wavelength of the broadband red phosphor can be selected to be substantially the same as the peak emission wavelength of the narrowband red fluoride phosphor. In embodiments, the peak emission wavelength of the broadband red phosphor can be within 5 nm of the peak emission wavelength of the narrowband red fluoride phosphor. The broadband red phosphor may have a peak emission wavelength from 620 nm to 640 nm and can comprise a europium activated nitride phosphor of general composition $AAlSiN_3:Eu^{2+}$ where A is at least one of Ca, Sr or Ba.

In embodiments, the red-light emitting device generates red light with a color purity of at least 90% and a FWHM of less than 30 nm, a FWHM of less than 20 nm, or a FWHM of less than 10 nm.

According to another aspect of the invention, there is contemplated a red-light emitting device that comprises: an LED flip chip having a peak emission from 400 nm to 500 nm; and a photoluminescence material in direct contact with at least one light emitting face of the LED flip chip, wherein the photoluminescence material comprises a narrowband red fluoride phosphor and a broadband red phosphor. In this specification, "direct contact" means without an air gap or photoluminescence material containing layer. In embodiments, the device may comprise a light transmissive layer disposed between the photoluminescence containing layer and the LED chip. The light transmissive layer provides passivation to the LED chip and provides a barrier to the LED chip from the possible effects of the narrowband red fluoride phosphor.

In embodiments, the narrowband red fluoride phosphor and broadband red phosphor may be constituted as a single-layer photoluminescence structure. The phosphors can be located (contained) in the same layer. The phosphors can be located (contained) in a single layer, typically as a mixture, and the layer may be in direct contact with the at least one light emitting face of the LED flip.

In embodiments, the narrowband red fluoride phosphor and broadband red phosphor may be constituted as a double-layer photoluminescence structure. In one arrangement, the red-light emitting device comprises a first layer containing the narrowband red fluoride phosphor that is adjacent to the LED chip, and a second layer containing the broadband red phosphor material that is on the first layer. The first layer can be in direct contact with at least one light emitting face (surface) of the LED flip chip, and the second layer can be in direct contact with the first layer.

Phosphor-Converted Red LEDs (PC Red LEDs) in accordance with embodiments of invention find utility as a red-light source in light emitting devices (lighting devices) such as, for example, RGB (Red Green Blue) Multi-LED lighting devices comprising a Red LED, Green LED, and Blue LED. RGB light emitting devices find utility in color-tunable light sources.

Other aspects of the invention relate generally to color-tunable multi-LED (Light Emitting Diode) lighting devices that can, preferably, generate light with a color temperature from 2200K to 6500K and optionally light of colors from red to blue. More particularly, though not exclusively, embodiments concern multi-LED lighting devices that utilize PC Red LEDs comprising a narrowband red phosphor such as $K_2SiF_6:Mn^{4+}$, $K_2GeF_6:Mn^{4+}$, or $K_2TiF_6:Mn^{4+}$ or PC Red LEDs as described herein. According to one aspect a multi-LED lighting device comprises four LEDs: a Red LED, a Green LED, a Blue LED and a White LED. The lighting device may comprise a packaged lighting device comprising a package for housing the four LEDs. The Red, Green, Blue and White LEDs may comprise CSP (Chip Scale Packaged) LEDs comprising LED flip chips. In embodiments where the LEDs comprise CSP LEDs, the lighting device may comprise a substrate, such as a circuit board, on which the LEDs are provided. Such a packaging arrangement is termed a COB (Chip On Board) arrangement.

According to an aspect of the invention, there is contemplated a lighting device comprising: a first LED having a wavelength of maximum emission intensity (peak emission wavelength) from 620 nm to 640 nm (i.e. orange to red); a second LED having a wavelength of maximum emission intensity (peak emission wavelength) from 500 nm to 565 nm (i.e. green); a third LED having a wavelength of maximum emission intensity (peak emission wavelength) from 430 nm to 480 nm (i.e. violet to blue); and a fourth LED for generating light comprising a CCT in a range from 1800K to 5000K; wherein the first LED comprises a phosphor-converted LED that comprises a first LED chip having a wavelength of maximum emission intensity (peak emission wavelength) from 400 nm to 480 nm, and a narrowband red phosphor with a FWHM less than 55 nm; and wherein light generated by the device comprises a combination of light generated by the first, second, third, and fourth LEDs and wherein a CCT of light generated by the device is tunable over a range by independently controlling power to the first, second, third, and fourth LEDs.

The CCT of light generated by the device is tunable over a range of CCTs, and it may be that a CCT of light generated by the device is tunable in a range from 1800K to 8000K. It will be understood that the CCT may be anywhere within the range from 1800K to 8000K; for instance, the range may be 2200K to 6500K, or a different range falling within the range of 1800K to 8000K.

It may be that light generated by the device has a CRI Ra from 80 to 98.

The narrowband red phosphor may comprise at least one of: $K_2SiF_6:Mn^{4+}$, $K_2GeF_6:Mn^{4+}$, or $K_2TiF_6:Mn^{4+}$.

The first LED may further comprise a broadband red phosphor. The narrowband red phosphor and broadband red phosphor may be located (contained) in a single layer. Alternatively, the narrowband red phosphor can be located (contained) in a first layer and the broadband red phosphor can be located (contained) in a second layer. It may be that the first layer is in direct contact with a light emitting face of the first LED chip and the second layer is in direct contact with the first layer.

The first LED may generate light with a color purity of least 90%.

The second LED may comprise a phosphor-converted LED comprising a second LED chip having a wavelength of maximum intensity from 400 nm to 480 nm (i.e., violet to blue), and a green phosphor.

The third LED may comprise a Direct-Emitting Blue LED.

The fourth LED may comprise a fourth LED chip having a wavelength of maximum intensity from 400 nm to 480 nm, and green to red phosphors.

It may be that light generated by the device has a chromaticity that is within 0.006 Δuv, preferably 0.003 Δuv, of the black body locus over the range of CCTs, for example from 1800K to 6500K. It may be that light generated by the device has a CRI Ra from 80 to 98. In this specification, "chromaticity" of light, "color of light", and "color point" of light may be used interchangeably and refer to the chromaticity/color of light as represented by chromaticity coordinates on a CIE 1931 chromaticity diagram. Δuv (Delta uv) is a metric that quantifies how close light of a given color temperature is to the black body locus. As is known, Δuv is the Euclidean difference of chromaticity coordinate uv between a test light source to the closest point on the black body locus and is defined in ANSI_NEMA_ANSLG C78.377-2008: American National Standard for electric lamps—Specifications for the Chromaticity of Solid State Lighting Products. Δuv is on the 1976 CIE u, v chromaticity diagram, a measure of the distance of the color point of light of a given CCT (Correlated Color Temperature) from the black body locus (Planckian locus of black body radiation) along the iso-CCT line (Lines of Constant Color Temperature). A positive Δuv value indicates that the color point is above the black body locus (i.e., on a 1931 CIE x, y chromaticity diagram CIE y is greater than the CIE y value of the black body locus) with a yellowish/greenish color shift from the black body locus. A negative value the color point is below the black body locus (i.e., on a 1931 CIE x, y chromaticity diagram CIE y is less than the CIE y value of the black body locus) with a pinkish color shift from the black body locus.

In embodiments, at least one of the first LED, second LED, third LED or fourth LED may comprise an LED flip chip or an LED chip comprising a plurality of serially connected LEDs (LED junctions). An LED chip having multiple LED junctions has a greater forward drive voltage and can be beneficial where the lighting device is operating at line voltage of 110 to 240V.

It may be that the lighting device comprises a package comprising a lead frame; and a housing comprising a first cup (recess) having the first LED, a second cup (recess) having the second LED, a third cup (recess) having the third LED, and a fourth cup (recess) having the fourth LED; and wherein the lead frame comprises a common cathode electrode to each cup and a respective anode electrode to each cup.

It may be that the lighting device comprises a package comprising a lead frame; and a housing comprising a first cup having the first LED, a second cup having the second LED, a third cup having the third LED, and a fourth cup having the fourth LED; and wherein the lead frame comprises a respective cathode electrode to each cup and a respective anode electrode to each cup. It may be that each cup comprises an anode terminal connected to the anode electrode and a cathode terminal connected to the cathode electrode and wherein the anode and cathode terminals for each recess are located on opposing edges of the housing across from one another.

It may be that the at least one of the first LED, second LED, third LED and fourth LED comprises a chip scale packaged LED.

According to another aspect, a lighting device comprises: a first LED; a second LED; a third LED; and a fourth LED of different chromaticity, wherein light generated by the device comprises a combination of light generated by the first LED, second LED, third LED, and fourth LED and wherein a CCT of light generated by the device is tunable in a range from 1800K to at least 6500K by independently controlling power to the first, second, third, and fourth LEDs, wherein a chromaticity of light generated by the device is within 0.006 Δuv, preferably 0.003 Δuv, of the black body locus, and wherein at least one of the LEDs comprises narrowband red phosphor with a FWHM of less than 55 nm.

The narrowband red phosphor may comprise at least one of $K_2SiF_6:Mn^{4+}$, $K_2GeF_6:Mn^{4+}$, and $K_2TiF_6:Mn^{4+}$.

In embodiments, the first LED has a wavelength of maximum intensity from 620 nm to 640 nm (i.e., orange to red); the second LED has a wavelength of maximum intensity from 500 nm to 565 nm (i.e., green); the third LED has a wavelength of maximum intensity from 430 nm to 480 nm (i.e., violet to blue): and the fourth LED is for generating light with a CCT of at least 1800K.

According to a further aspect, the invention provides a lighting arrangement comprising: a substrate (circuit board) and a plurality of lighting devices as defined herein mounted on the substrate. It may be that the lighting arrangement is a linear lighting device.

It may be that each of said lighting devices comprises: a first LED having a wavelength of maximum intensity from 620 nm to 640 nm; a second LED having a wavelength of maximum intensity from 500 nm to 565 nm; a third LED having a wavelength of maximum intensity from 430 nm to 480 nm; and a fourth LED for generating light comprising a CCT in a range from 1800K to 5000K; wherein the first LED comprises a phosphor-converted LED comprising a first LED chip having a wavelength of maximum intensity from 400 nm to 480 nm, and a narrowband red phosphor with a FWHM less than 55 nm; and wherein light generated by the device comprises a combination of light generated by the first, second, third, and fourth LEDs and a color or CCT of light generated by the device is tunable over a range by independently controlling power to the first, second, third, and fourth LEDs.

It may be that each of said lighting devices comprises: a first LED, second LED, third LED, and fourth LED for generating light of a different chromaticity, wherein light generated by the device comprises a combination of light generated by the first LED, second LED, third LED, and fourth LED and wherein a CCT of light generated by the device is tunable in a range of CCTs by independently controlling power to the first, second, third, and fourth LEDs, wherein a chromaticity of light generated by the device is within 0.006 Δuv of the black body locus, and wherein at least one of the LEDs comprises narrowband red phosphor with a FWHM of less than 55 nm.

It may be that the circuit board comprises a flexible circuit board.

According to an aspect, a multi-LED lighting device comprises at least three LEDs: a Red LED, a Green LED, and a White LED. The lighting device may comprise a packaged lighting device comprising a package for housing the at least three LEDs. The Red, Green, and White LEDs may comprise CSP (Chip Scale Packaged) LEDs comprising LED flip chips. In embodiments where the LEDs comprise CSP LEDs, the lighting device may comprise a substrate, such a circuit board, on which the LEDs are provided. Such a packaging arrangement is termed a COB (Chip On Board) arrangement.

According to an aspect of the invention, there is contemplated a lighting device comprising: a first LED having a peak emission wavelength from 620 nm to 640 nm; a second LED having a peak emission wavelength from 500 nm to 565 nm; and a third LED having a CCT of at least 1800K; wherein the first LED comprises a phosphor-converted LED that comprises an LED chip having a dominant wavelength from 400 nm to 480 nm, and a narrowband red phosphor with a FWHM less than 55 nm.

The narrowband red phosphor may comprise at least one of: $K_2SiF_6:Mn^{4+}$, $K_2GeF_6:Mn^{4+}$, and $K_2TiF_6:Mn^{4+}$.

The first LED may further comprise a broadband red phosphor. The narrowband red phosphor and broadband red phosphor may be located (contained) in a single layer. Alternatively, the narrowband red phosphor can be located (contained) in a first layer and the broadband red phosphor can be located (contained) in a second layer.

The first LED may generate light with a color purity of least 90%.

The second LED may comprise a phosphor-converted LED comprising a second LED chip having a dominant wavelength from 400 nm to 480 nm (i.e., violet to blue), and a green phosphor.

The third LED may comprise a third LED chip having a dominant wavelength from 400 nm to 480 nm, and green to red phosphors and may generate light with a CCT from 1800K to 5000K.

The lighting device may comprise a packaged device or a COB device.

It may be that the lighting device comprises a package comprising a lead frame; and a housing comprising a first cup (recess) having the first LED, a second cup (recess) having the second LED, a third cup (recess) having the third LED, and a fourth cup (recess) having the fourth LED; and wherein the lead frame comprises a common cathode electrode to each cup and a respective anode electrode to each cup.

It may be that the lighting device comprises a package comprising a lead frame; and a housing comprising a first cup having the first LED, a second cup having the second LED, a third cup having the third LED, and a fourth cup having the fourth LED; and wherein the lead frame comprises a respective cathode electrode to each cup and a respective anode electrode to each cup. It may be that each cup comprises an anode terminal connected to the anode electrode and a cathode terminal connected to the cathode electrode and wherein the anode and cathode terminals for each recess are located on opposing edges of the housing across from one another.

It may be that the at least one of the first LED, second LED, and third LED comprises a chip scale packaged LED.

According to a further aspect, the invention provides a lighting device comprising: an substrate (circuit board) and a plurality of lighting devices as defined herein mounted on the substrate. It may be that the lighting device is a linear lighting device. The substrate may comprise a flexible circuit board.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein:

FIGS. 1A and 1B are schematic representations of a known tunable Surface Mount multi-LED packaged lighting device in which FIG. 1A shows a top view and FIG. 1B shows a sectional side view through A-A;

—FIG. 9A shows the wavelength portion of the spectra for wavelengths from 550 nm to 700 nm (i.e. green to red region), and FIG. 9B shows the wavelength portion of the spectra for wavelengths from 400 nm to 600 nm (i.e. violet to yellow) and illustrates "blue pass through";

FIGS. 13A to 13C are schematic representations of a color-tunable multi-LED packaged lighting device comprising a PC Red LED, a Green LED, a blue LED and a White LED in accordance with an embodiment of the invention in which FIG. 13A shows a top view, FIG. 13B shows a sectional side view through A-A, and FIG. 13C shows a sectional side view through B-B;

FIGS. 14A to 14C are schematic representations of a color-tunable multi-LED packaged lighting device comprising a CSP PC Red LED, a CSP PC Green LED, a blue LED flip chip and a CSP White LED in accordance with an embodiment of the invention in which in which FIG. 14A shows a top view, FIG. 14B shows a sectional side view through A-A, and FIG. 14C shows a sectional side view through B-B;

FIGS. 14D to 14F are schematic representations of a color-tunable multi-LED COB (Chip On Board) lighting device 1450 comprising a CSP PC Red LED, a CSP PC Green LED, a blue LED flip chip and a CSP White LED in accordance with an embodiment of the invention in which FIG. 14D shows a top view FIG. 14E shows a sectional side view through C-C and FIG. 14F shows a sectional side view through D-D;

FIGS. 17A to 17C are measured characteristics for a color-tunable multi-LED packaged lighting device (Pack.1) comprising a PC Red LED (Red), a PC Green LED (Green), a blue LED (Blue) and a White LED (White) in which FIG. 17A shows spectra, normalized intensity (a.u.) versus wavelength (nm), for the PC Red LED (thick solid line), the PC Green LED (dashed dotted line), the Blue LED (dotted line) and the White LED (dashed line), FIG. 17B is a CIE 1931 chromaticity diagram illustrating the chromaticity (color) of light generated by the PC Red LED (square), the PC Green LED (diamond), the Blue LED (triangle), the White LED (cross), ANSI CCT center points (solid circle), color gamut of device (solid line), and black body locus (dashed line), and FIG. 17C is a CIE 1931 chromaticity diagram illustrating calculation of color purity of light generated by the PC Red LED, PC Green LED, the Blue LED, and the White LED;

FIGS. 18A to 18C are measured emission characteristics for the color-tunable multi-LED packaged lighting device (Pack.1) operable to generate light with a nominal CCT from 2700K to 6500K and a CRI Ra of 90 in which FIG. 18A shows spectra, normalized emission intensity (a.u.) versus wavelength (nm), for a CCT of 2700K (dotted line), a CCT of 3000K (dashed line), and a CCT of 4000K, FIG. 18B shows spectra, normalized emission intensity (a.u.) versus wavelength (nm), for a CCT of 5000K (dotted line), a CCT of 5700K (dashed line), and a CCT of 6500K, and FIG. 18C is a CIE 1931 chromaticity diagram illustrating the chromaticity (color) of light generated by the color-tunable multi-LED packaged light emitting device (Pack.1) for nominal CCTs of 2700K, 3000K, 4000K, 5000K, 5700K, and 6500K, light emission locus (solid line) for CCTs from 2700K to 6500K, black body locus (dashed line), and Mac Adam ellipses (SDCM—Standard Deviation Color Matching);

FIG. 19 is measured optical characteristics for a color-tunable multi-LED packaged lighting device (Pack.2) in which FIG. 19 is a CIE 1931 chromaticity diagram illustrating the chromaticity (color point) of light generated by the PC Red LED (square), the PC Green LED (diamond), the Blue LED (triangle), the White LED (cross), ANSI CCT center points (solid circle), color gamut of device (solid line), and black body locus (dashed line);

FIGS. 20A to 20D are schematic representation of a multi-LED, multi-cavity, package in accordance with an embodiment of the invention comprising a common cathode terminal arrangement in which FIG. 20A shows a top view, FIG. 20B shows a sectional side view through A-A, FIG. 20C shows a sectional side view through B-B, and FIG. 20D is a top view of the lead frame of the multi-LED package;

FIGS. 21A to 21D are schematic representations of a multi-LED, four-LED, package in accordance with an embodiment of the invention comprising a respective pair of anode and cathode electrical terminals for each LED in which FIG. 21A shows a top view, FIG. 21B shows a sectional side view through A-A, FIG. 21C shows a sectional side view through B-B, and FIG. 21D is a plan view of the lead frame of the multi-LED package; and FIGS. 22A and 22B are schematic representations of a multi-LED (Four-LED) package in accordance with another embodiment of the invention in which FIG. 22A shows a top view, and FIG. 22B is top view of the lead frame of the multi-LED package.

DETAILED DESCRIPTION OF THE INVENTION

Packaged PC Red LEDs

Figure 1A:
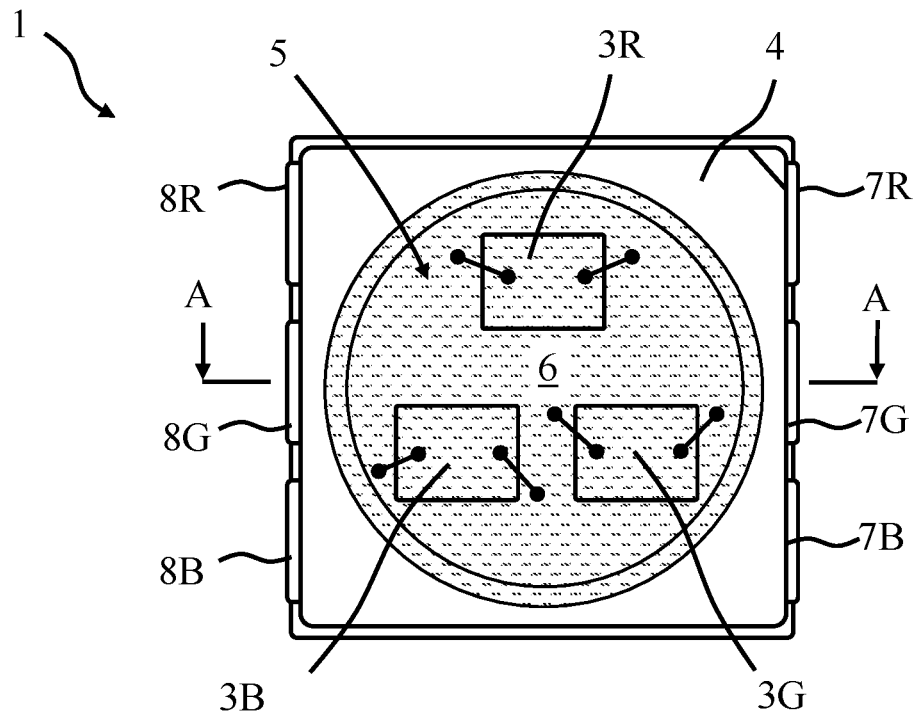

In embodiments, particles of the broadband red phosphor and narrowband red fluoride phosphor can be provided as a mixture in a single layer and/or same layer. Since such devices comprise only one photoluminescence layer, they will be referred to as "single-layer" structured photoluminescence devices.

In other embodiments, the broadband red phosphor and narrowband red fluoride phosphor can be included in a respective layer with the layer containing the narrowband red fluoride phosphor being disposed in closer proximity to the LED chip than the layer containing the broadband red phosphor. Since such devices comprise two photoluminescence layers, they will be referred to as "double-layer" photoluminescence structured devices.

Packaged Single-Layer PC Red LEDs

A packaged single-layer red-light emitting device (PC Red LED) 210 in accordance with an embodiment of the invention will now be described with reference to FIG. 2 which shows a schematic sectional side view of the device 210. The light emitting device 210, as illustrated, may comprise a SMD (Surface Mounted Device) such as for example a 2835 LED package.

The light emitting device 210 comprises a package 212 comprising a lead frame 214 onto which a housing 218 is molded. The lead frame comprises anode 214 and cathode 216 regions. The housing 218 comprises a base portion 218A and side wall portions 218B that extend upwardly from opposing edges of the base portion 218A. The interior surfaces of the side wall portions 218B slope inwardly to their vertical axis in a direction towards the base and, together with the interior surface (floor) of the base portion 218A, define a cavity (cup, recess) 220 in the shape of an inverted frustum of a pyramid or inverted frustrum of a cone.

Portions of the anode lead frame region 214 and cathode lead frame region 216 extend laterally to the outside edges of the housing 218 and form respective electrical anode and cathode terminals 222, 224 along opposing edges of the package 212 allowing electrical power to the anode (A) and cathode (C) of each LED chip.

The cavity (cup) 220 contains one or more InGaN-based LED dies (violet to blue LED chips) 226 mounted on the floor (interior surface of the base) of the cavity 220. As indicated, the LED chips 226 can be electrically connected to the lead frame 214 by bond wires 228. The device 210 may comprise three InGaN-based LED chips and have a rated driving condition of 100 mA, 9 V.

The cavity (cup) 220 is filled with a red-light emitting photoluminescence material 230 which constitutes a single-layer photoluminescence structure. The photoluminescence material layer 230 may comprise a light transmissive (transparent) optical encapsulant, such as silicone material, with the red-light emitting photoluminescence material 230 dispersed therein.

In accordance with an embodiment of the invention, the red photoluminescence material 230 comprises a combination of a narrowband red fluoride phosphor and a red phosphor that has a higher absorption efficiency than that of the narrowband red fluoride phosphor such as, for example, a broadband red phosphor. Details of suitable narrowband red fluoride and broadband red phosphors are given below. The photoluminescence layer 230 may contain materials other than photoluminescence (phosphor) material such as light scattering particles or light diffusive material, for example.

The single-layer device 210 can be manufactured by dispensing a curable light transmissive liquid material, silicone for example, containing a mixture of the narrowband red fluoride and broadband red phosphors to fill the cavity (cup) 220.

Figure 2:
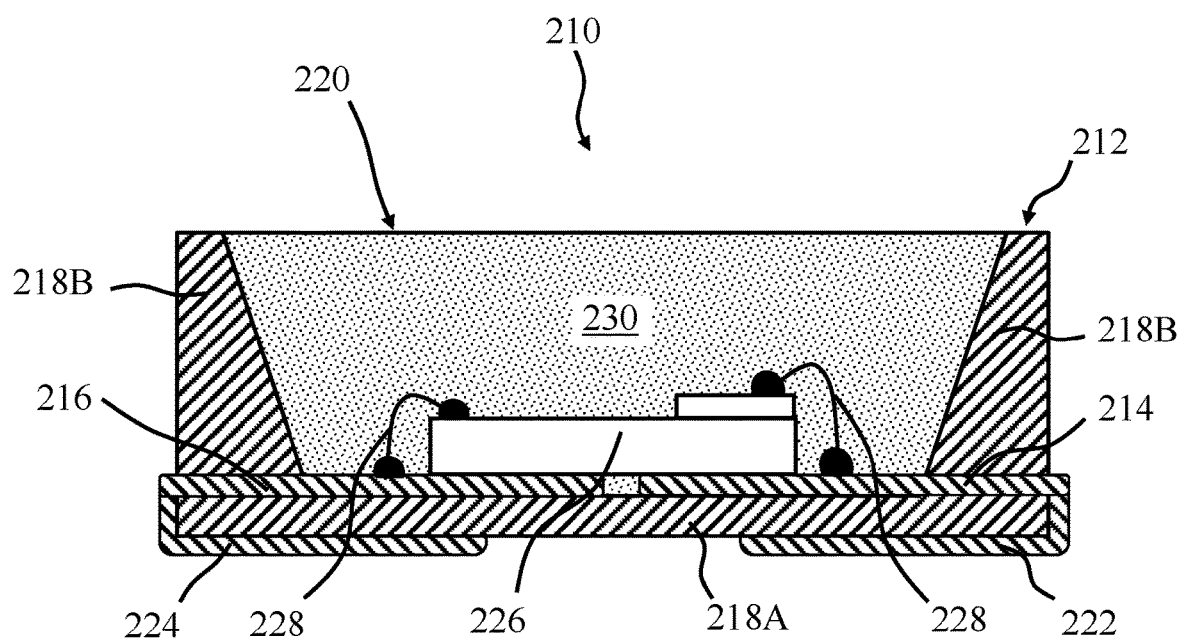
FIG. 2 is a schematic sectional side view of a packaged single-layer red-light emitting device in accordance with an embodiment of the invention.
Figure 3:
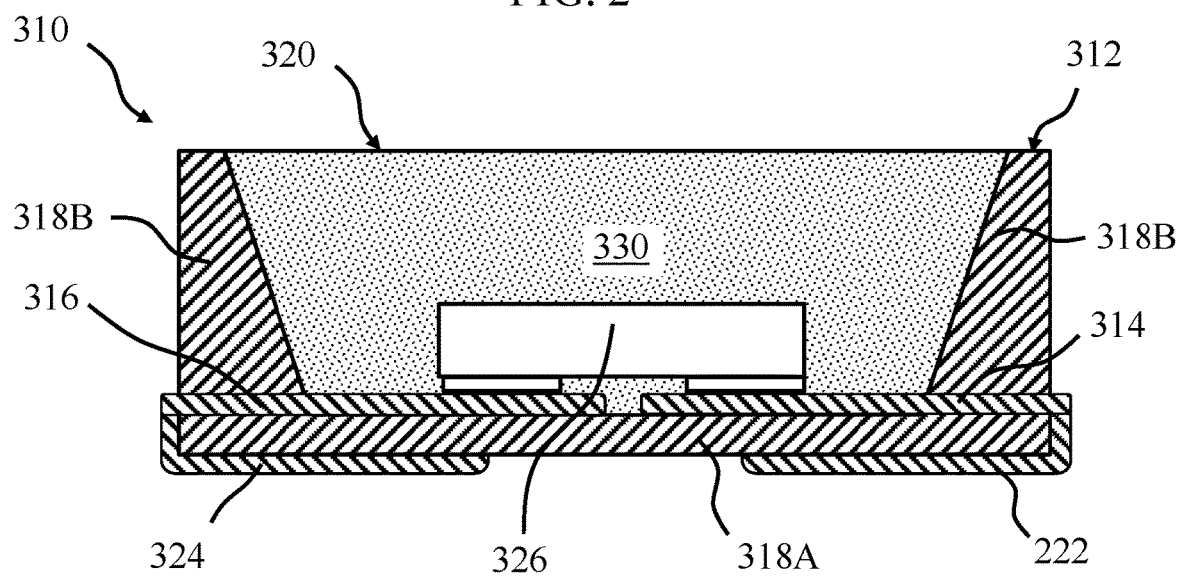
FIG. 3 is a schematic sectional side view of a packaged single-layer red-light emitting device in accordance with an embodiment of the invention.

Referring to FIG. 3, there is shown a packaged single-layer red-light emitting device 310 formed according to another embodiment of the invention. This embodiment differs from FIG. 2 only in that the LED chip(s) 326 comprise an LED flip chip.

Packaged Double-Layer PC Red LEDs

Figure 4:
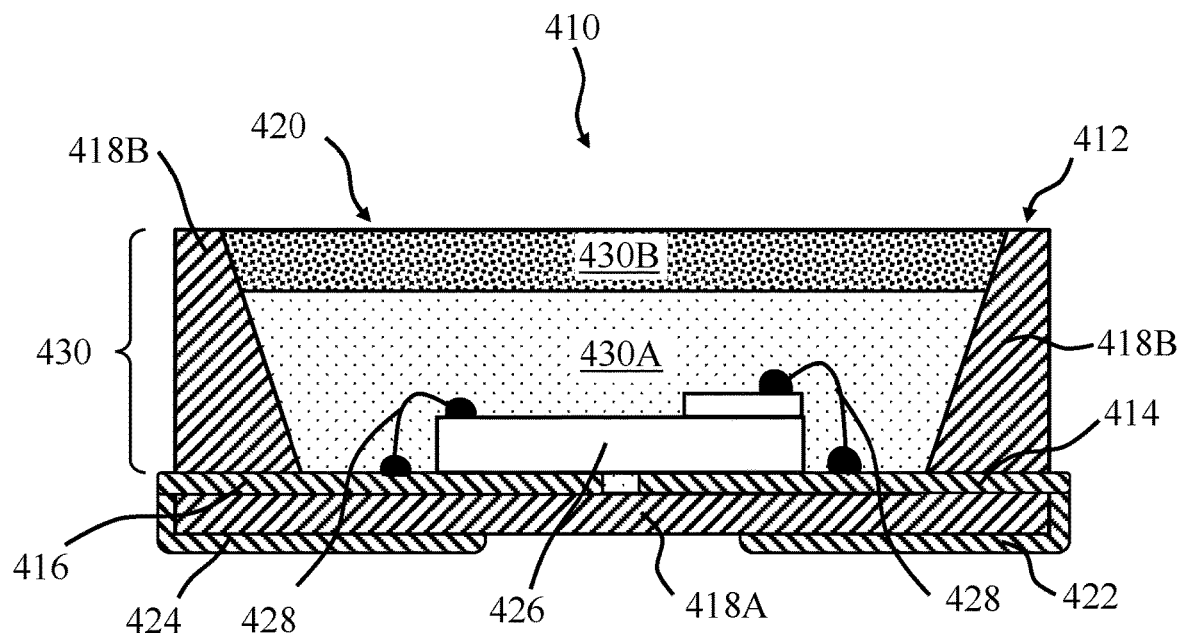
FIG. 4 is a schematic sectional side view of a packaged double-layer red-light emitting device in accordance with an embodiment of the invention.

A packaged double-layer red-light emitting device (PC Red LED) 410 in accordance with an embodiment of the invention will now be described with reference to FIG. 4 which shows a schematic sectional side view of the device 410.

This embodiment differs from the single-layer device 210 of FIG. 2 in that the photoluminescence material layer 430 is constituted by a double-layer photoluminescence structure comprising a first photoluminescence layer 430A and a second photoluminescence layer 430B. The first photoluminescence layer 430A is in closer proximity to the LED chip(s) 426 than the second photoluminescence material layer 430B; that is the first photoluminescence layer 430A is proximal (i.e., a proximal layer) to the LED chip(s) 426, while the second photoluminescence material layer 430B is distal (i.e., a distal layer) to the LED chip(s) 426.

In terms of photoluminescence (phosphor) material, the first photoluminescence layer 430A contains, in terms of photoluminescence material, only, or substantially only (at least 90 wt %), narrowband red fluoride phosphor. More particularly, in embodiments, the first photoluminescence layer 430A contains, in terms of photoluminescence material, only $K_2SiF_6:Mn^{4+}$ (KSF), and no other photoluminescence materials. It will be appreciated, however, that other materials such as a light diffusive (scattering) material can be added into the first photoluminescence layer 430A, but the amount of the other material(s) is typically no more than 30% weight of the narrowband red fluoride phosphor. Further, in this embodiment, the first photoluminescence layer 430A can be constituted by $K_2SiF_6:Mn^{4+}$ dispersed in dimethyl silicone. The first photoluminescence layer 430A is directly adjacent to the LED chip(s) 426 and may, as indicated in FIG. 4, be in direct contact the LED chip(s) 426. In this example, for instance, there are no other photoluminescence materials or photoluminescence material containing layers between the first photoluminescence layer 430A and the LED chip(s) 426.

The second photoluminescence layer 430B contains broadband red phosphor and is dispensed on top of the first photoluminescence layer 430A to fill the cavity (cup) 420.

Comparing the single-layer device 210, as shown for example in FIG. 2, in a single-layer light emitting device, the narrowband red fluoride and broadband red phosphors, which comprise a mixture, have equal exposure to excitation light, for example blue excitation light, as each is located in the same location (layer) relative to the LED chip(s). Since narrowband red fluoride phosphor has a much lower blue light absorption efficiency (capability) than broadband red phosphor, a greater amount of narrowband red fluoride phosphor is necessary to convert enough blue light to the required red emission attributable to the narrowband red fluoride phosphor. By contrast, in the double-layer light emitting device 410, the narrowband red fluoride phosphor, in its separate individual layer 430A, is exposed to blue excitation light individually; thus, more of the blue excitation light from the blue LED chip(s) 426 can be absorbed by the narrowband red fluoride phosphor and remaining (unabsorbed, for example) blue excitation light can penetrate through to the second photoluminescence layer 430B containing the broadband red phosphor. Advantageously, with a double-layer photoluminescence structure, the first photoluminescence layer 430A can more effectively convert the blue excitation light to a narrowband red light and the amount/usage of a narrowband red fluoride phosphor can be significantly reduced (up to about 40%) compared with the single-layer photoluminescence arrangement (FIG. 2). A further benefit of the double-layer photoluminescence structure is that since the second photoluminescence layer 430B completely covers the first photoluminescence layer 430A this effectively isolates the narrowband red fluoride phosphor located (contained) in the first photoluminescence layer 430A from direct contact with water/moisture in the surrounding environment. Such a double-layer structure provides an effective solution to address the poor moisture reliability of narrowband red fluoride phosphors.

Figure 5:
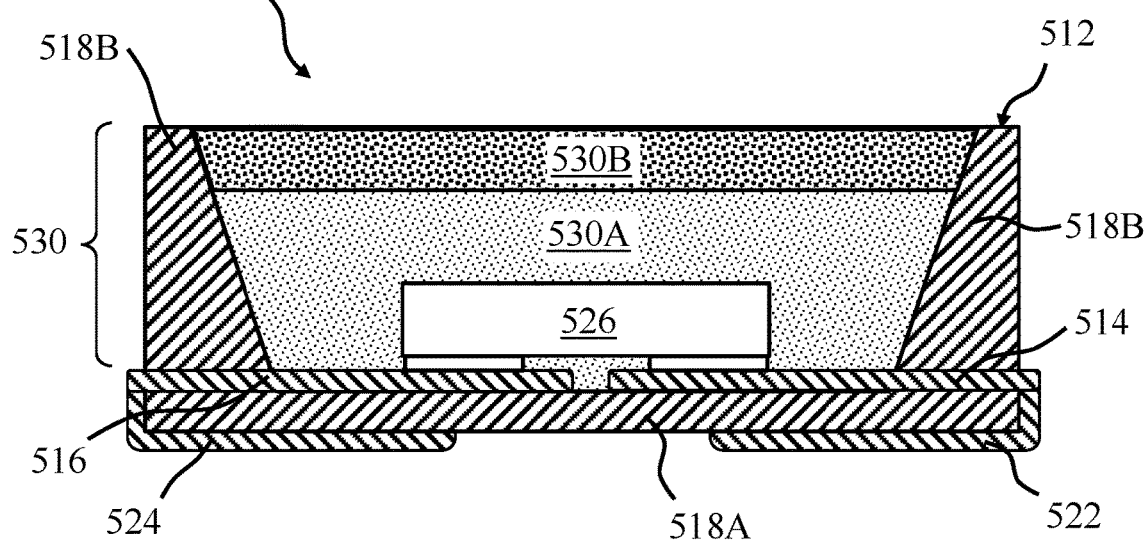
FIG. 5 is a schematic sectional side view of a packaged double-layer red-light emitting device in accordance with an embodiment of the invention.

Referring to FIG. 5, there is shown a packaged double-layer packaged light emitting device 510 formed according to another embodiment of the invention. This embodiment differs from FIG. 4 only in that the LED chip(s) 526 comprise an LED flip chip.

CSP (Chip Scale Packaged) PC Red LEDs

While the foregoing embodiments have been described in relation to packaged PC red LED devices, embodiments of the invention find utility for chip scale packaged light emitting devices. In this specification, a CSP arrangement is a packaging arrangement on a chip scale and does not include a lead frame. In a CSP arrangement, the LED chip may comprise an integral component of the package. For example, one or more layers of material can be applied directly to a face, or faces, of the flip chip to form a packaged device. A particular advantage of a CSP arrangement is the small size of the packaged device, which may be comparable to the chip size.

Figure 6:
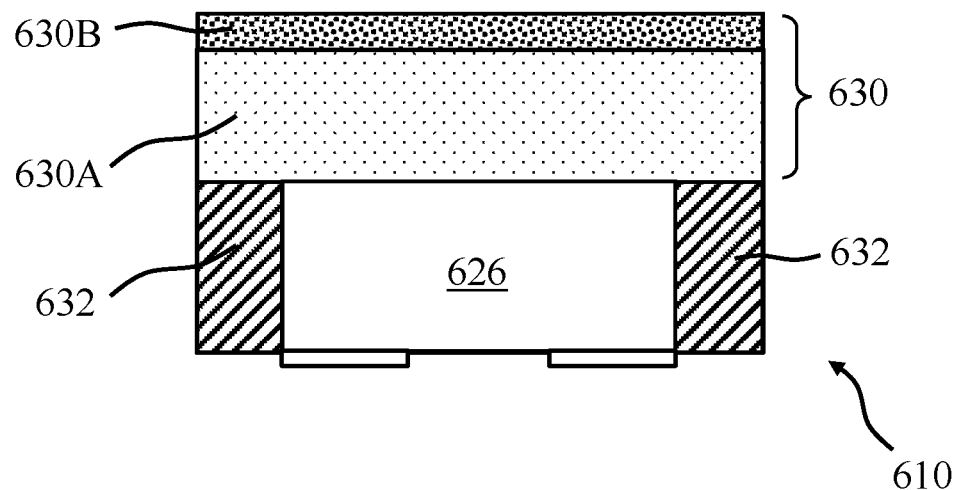
FIG. 6 is a schematic sectional side view of a CSP (Chip Scale Packaged) double-layer red-light emitting device in accordance with an embodiment of the invention.

FIG. 6 show a side view of a CSP double-layer red-light emitting devices 610 in accordance with embodiments of the invention. There is provided a photoluminescence material layer 630 which is constituted by a double-layer photoluminescence structure comprising, in this embodiment, a first photoluminescence layer 630A containing narrowband red fluoride phosphor is applied or deposited (fabricated) as a uniform thickness layer directly onto and covers at least the principle (top as illustrated) light emitting face of an LED flip chip 626; and a second photoluminescence material layer 630B containing broadband red phosphor is applied or deposited (fabricated) as a uniform thickness layer onto and covers the first photoluminescence layer 630A. As indicated, the device 610 can further comprise a light reflective layer 632, for example white silicone or epoxy, covering the four side faces of the LED chip to prevent emission (and wastage) of excitation light therefrom. In other embodiments, the light reflective layer may cover the edges of the first and second photoluminescence layers to prevent emission of excitation light therefrom.

Figure 7:
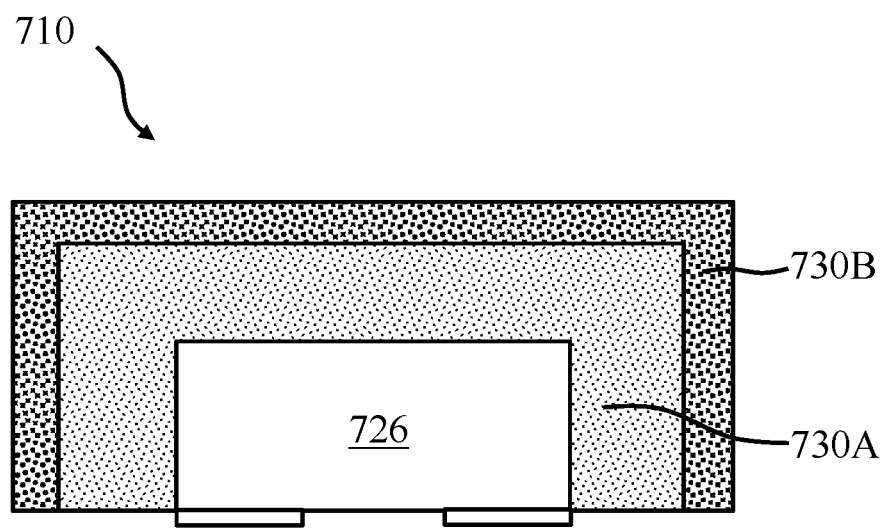
FIG. 7 is a schematic sectional side view of a CSP (Chip Scale Packaged) double-layer red-light emitting device in accordance with an embodiment of the invention.

FIG. 7 shows a side view of a CSP double-layer red-light emitting devices 710 in accordance with embodiments of the invention. In this embodiment, a first photoluminescence layer 730A containing narrowband red fluoride phosphor is applied or deposited (fabricated) as a uniform thickness layer directly onto and covers at least the principle (top as illustrated) light emitting face and four light emitting side faces of an LED flip chip 726. A second photoluminescence material layer 730B containing broadband red phosphor is applied or deposited (fabricated) as a uniform thickness layer onto and covers the top and side faces of the first photoluminescence layer 730A. In this embodiment, the photoluminescence material layer 730B envelops the first photoluminescence layer 730A. The first and second photoluminescence layers 730A, 730B can be in the form of a conformal coating.

Narrowband Red Fluoride Phosphors

In this patent specification, a narrowband red phosphor refers to a photoluminescence material which, in response to stimulation by excitation light, generates red light having a Full Width at Half Maximum (FWHM) emission intensity from about 5 nm to about 20 nm. As described herein, the narrowband red phosphor can comprise a manganese-activated fluoride narrowband red phosphor such as manganese-activated potassium hexafluorosilicate phosphor (KSF)—$K_2SiF_6:Mn^{4+}$ (KSF) which has a peak emission wavelength $\lambda_p$ of about 631-632 nm. Other manganese-activated fluoride narrowband red phosphors can include manganese-activated potassium hexafluorogermate phosphor (KGF)—$K_2GeF_6:Mn^{4+}$ and/or manganese-activated potassium hexafluorotitanate phosphor (KTF)—$K_2TiF_6:Mn^{4+}$.

Broadband Red Phosphors

In this patent specification, a broadband red phosphor refers to a photoluminescence material which, in response to stimulation by excitation light, generates red light having a full width at half maximum (FWHM) emission intensity from about 50 nm to about 120 nm. As described above, the broadband red phosphor may comprise a rare-earth activated broadband red phosphor that is excitable by blue light and in response emit light with a peak emission wavelength $\lambda_p$ in a range from about 620 nm to about 640 nm, i.e., in the red region of the visible spectrum. Rare-earth-activated red photoluminescence material can include, for example, a europium-activated silicon nitride-based phosphor, a europium-activated Group IIA/IIB selenide sulfide-based phosphors or europium-activated silicate-based phosphors. Examples of broadband red phosphors are given in TABLE 1.

In some embodiments, the europium-activated silicon nitride-based phosphor comprises a Calcium Aluminum Silicon Nitride phosphor (CASN) of general formula $CaAlSiN_3:Eu^{2+}$ (1:1:1:3 Nitride). The CASN phosphor can be doped with other elements such as strontium (Sr), general formula $(Sr,Ca)AlSiN_3:Eu^{2+}$.

Alternatively, the rare-earth-activated red phosphor can comprise a nitride-based phosphor of general composition $(Sr,Ba)_2Si_5N_8:Eu_{2+}$ (2:5:8 Nitride).

Rare-earth-activated red phosphors can also include Group IIA/IIB selenide sulfide-based phosphors. A first example of a Group IIA/IIB selenide sulfide-based phosphor material has a composition $MSe_{1-x}S_x:Eu$, wherein M is at least one of Mg, Ca, Sr, Ba and Zn and $0<x<1.0$. A particular example of this phosphor material is CSS phosphor ($CaSe_{1-x}S_x:Eu$). The emission peak wavelength of the CSS phosphor can be tuned from 600 nm to 650 nm by altering the S/Se ratio in the composition.

In some embodiments, the rare-earth-activated red phosphor can comprise a silicate-based phosphor of general composition $(Sr_{1-x}M_x)_yEu_zSiO_5$ where $0<x\leq0.5$, $2.6\leq y\leq3.3$, $0.001\leq z\leq0.5$ and M is one or more divalent metal selected from the group consisting of Ba, Mg, Ca, and Zn.

TABLE 1

Example broadband red phosphors

| Phosphor | General Composition | | Wavelength $\lambda_p$ (nm) |
|---|---|---|---|
| CASN (1:1:1:3) | $(Ca_{1-x}Sr_x)AlSiN_3:Eu$ | $0.5 < x \leq 1$ | 600-650 |
| 2:5:8 Nitride | $Ba_{2-x}Sr_xSi_5N_8:Eu$ | $0 \leq x \leq 2$ | 580-650 |
| Group IIA/IIB Selenide Sulfide | $MSe_{1-x}S_x:Eu$ | M = Mg, Ca, Sr, Ba, Zn $0 < x < 1.0$ | 600-650 |
| CSS | $CaSe_{1-x}S_x:Eu$ | $0 < x < 1.0$ | 600-650 |
| Silicate | $(Sr_{1-x}M_x)_yEu_zSiO_5$ | M = Ba, Mg, Ca, Zn $0 < x \leq 0.5$, $2.6 \leq y \leq 3.3$, $0.001 \leq z \leq 0.5$ | 565-650 |

Color Purity and Dominant Wavelength

Figure 8:
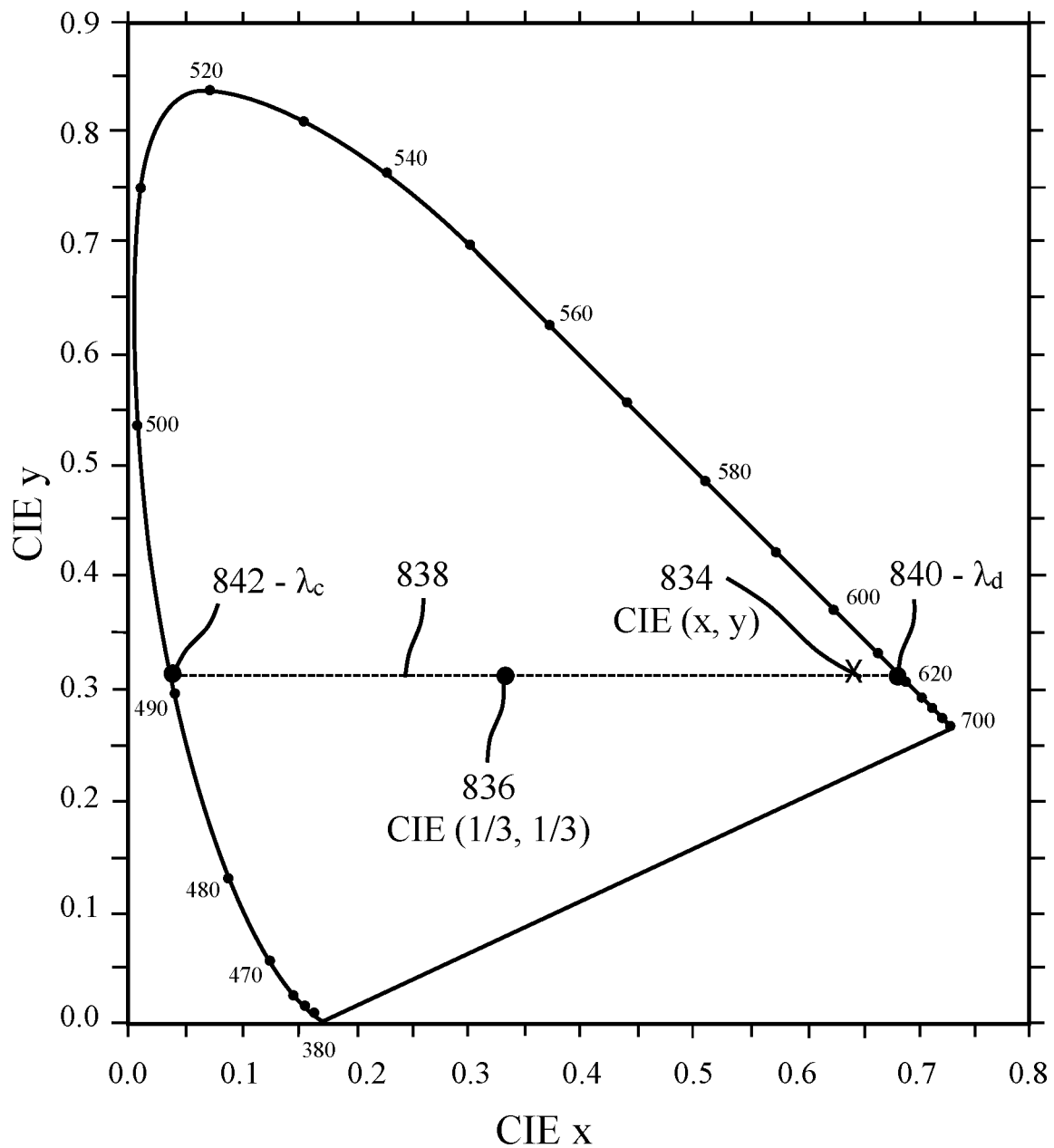
FIG. 8 is a CIE 1931 chromaticity diagram illustrating calculation of color purity and dominant wavelength of light of a given chromaticity (color)

Color purity, or color saturation, provides a measure of how close the color hue of light of a given color (chromaticity) is to a spectral (monochromatic) color corresponding to light of dominant wavelength $\lambda_d$. Color purity can have a value from 0 to 100%. FIG. 8 is a CIE 1931 chromaticity diagram illustrating how color purity and dominant wavelength of light of a given chromaticity (color) are calculated.

Referring to FIG. 8, the color point (chromaticity) for the given color of light is indicated on the chromaticity diagram by cross 834 and a "white standard illuminant" is indicated by dot 836. The "white standard illuminant" used in this specification is the equal-energy (flat spectrum) and has color space coordinates CIE (1/3, 1/3). A straight line 838 (dashed line) connecting the chromaticity color points 834 and 836 is extended so that it intersects the outer curved boundary (perimeter) of the CIE color space at two points. The point of intersection 840 nearer to the given color CIE (x, y) 834 corresponds to the dominant wavelength $\lambda_d$ of the color as the wavelength of the pure spectral (monochromatic) color at that intersection point. The point of intersection 842 on the opposite side of the color space corresponds to the complementary wavelength $\lambda_c$, which when added to the given color in the correct proportion will yield the color of the white standard illuminant.

The outer curved boundary of the chromaticity diagram is the monochromatic (spectral) locus with the numbers indicating the wavelengths in nanometers (nm). The color purity of monochromatic light (i.e., those lying on the spectral locus) is 100 while the color purity of light of the "white standard illuminant" 836 is zero. The color purity of light of chromaticity coordinates CIE (x, y) 834 plotted on the chromaticity diagram is the ratio of the distance from the "white standard illuminant" 836 to the color point 834 to the distance from the "white standard illuminant" 836 to the point of intersection 840 corresponding to the dominant wavelength $\lambda_d$.

Experimental Test Data

In this specification, the following nomenclature is used to denote PC Red light emitting devices: Com.# denotes a comparative PC red light emitting device comprising a single red phosphor (i.e., a broadband red or a narrowband red fluoride phosphor) and Dev.# denotes a PC red light emitting device in accordance with the invention that comprises a combination of narrowband red fluoride phosphor and broadband red phosphor.

Comparative PC Red light emitting devices (Com.#) and PC Red light emitting devices in accordance with the invention (Dev.#) comprise SMD 2835 packaged devices containing four serially connected blue LED chips. Each device is a nominal 1.2 W device (rated driving condition is 100 mA and a forward drive voltage $V_f$ of 12 V).

The red phosphors used in the test devices are KSF ($K_2SiF_6:Mn^{4+}$) narrowband red fluoride phosphor and CASN ($Ca_{1-x}Sr_xAlSiN_3:Eu$) broadband red phosphor.

For comparative devices, Com.# the red phosphor (KSF or CASN) is incorporated in a phenyl silicone and the mixture dispensed into the 2835 package to fill the LED cavity.

For the single-layer device (Dev.1): a mixture of KSF and CASN phosphors is incorporated in a phenyl silicone and dispensed into the 2835 package to fill the LED cavity.

For the double-layer device (Dev.2): KSF phosphor is incorporated in a phenyl silicone and dispensed into the 2835 package to partially fill the LED cavity. The KSF phosphor layer is cured in an oven. CASN phosphor is mixed with a phenyl silicone and then dispensed on top of KSF layer to fully fill the LED cavity and then cured in an oven.

Optical Performance

The test method involves measuring total light emission of the PC Red light emitting devices in an integrating sphere.

TABLE 2 tabulates phosphor composition of comparative devices Com.1 and Com.2 and devices Dev.1 and Dev.2 in accordance with the invention. CASN 630, CASN 650 and CASN 655 indicate a CASN phosphor with a respective peak emission wavelength $\lambda_p$ of 630 nm, 650 nm and 655 nm. The wt % values in TABLE 2 are the weight % of total phosphor weight. The weight values in TABLE 2 are the weight of KSF phosphor normalized to KSF phosphor weight in comparative PC Red LED Com.2.

As can be seen from TABLE 2, in terms of phosphor composition: Com. 1 comprises a single-layer phosphor structure comprising 100 wt % CASN 630; Com.2 comprises a single-layer phosphor structure comprising 100 wt % KSF; Dev.1 comprises a single-layer phosphor structure containing a combination of 67 wt % KSF and 33 wt % CASN 650; and Dev.2 comprises a double-layer phosphor structure having a first phosphor layer comprising 61 wt % KSF and a second phosphor layer comprising 39 wt % CASN 655.

TABLE 2

Phosphor composition of single-layer comparative devices (Com. 1, Com. 2), a single-layer device (Dev. 1), and a double-layer device

| | (Dev. 2) 1$^{st}$ phosphor layer | | | | 2$^{nd}$ phosphor layer |
|---|---|---|---|---|---|
| | KSF | | CASN 630 | CASN 650 | CASN 655 |
| Device | wt % | weight | wt % | wt % | wt % |
| Com. 1 | — | — | 100 | — | — |
| Com. 2 | 100 | 100 | — | — | — |
| Dev. 1 | 67 | 66 | — | 33 | — |
| Dev. 2 | 61 | 60 | — | — | 39 |

Figure 9A:
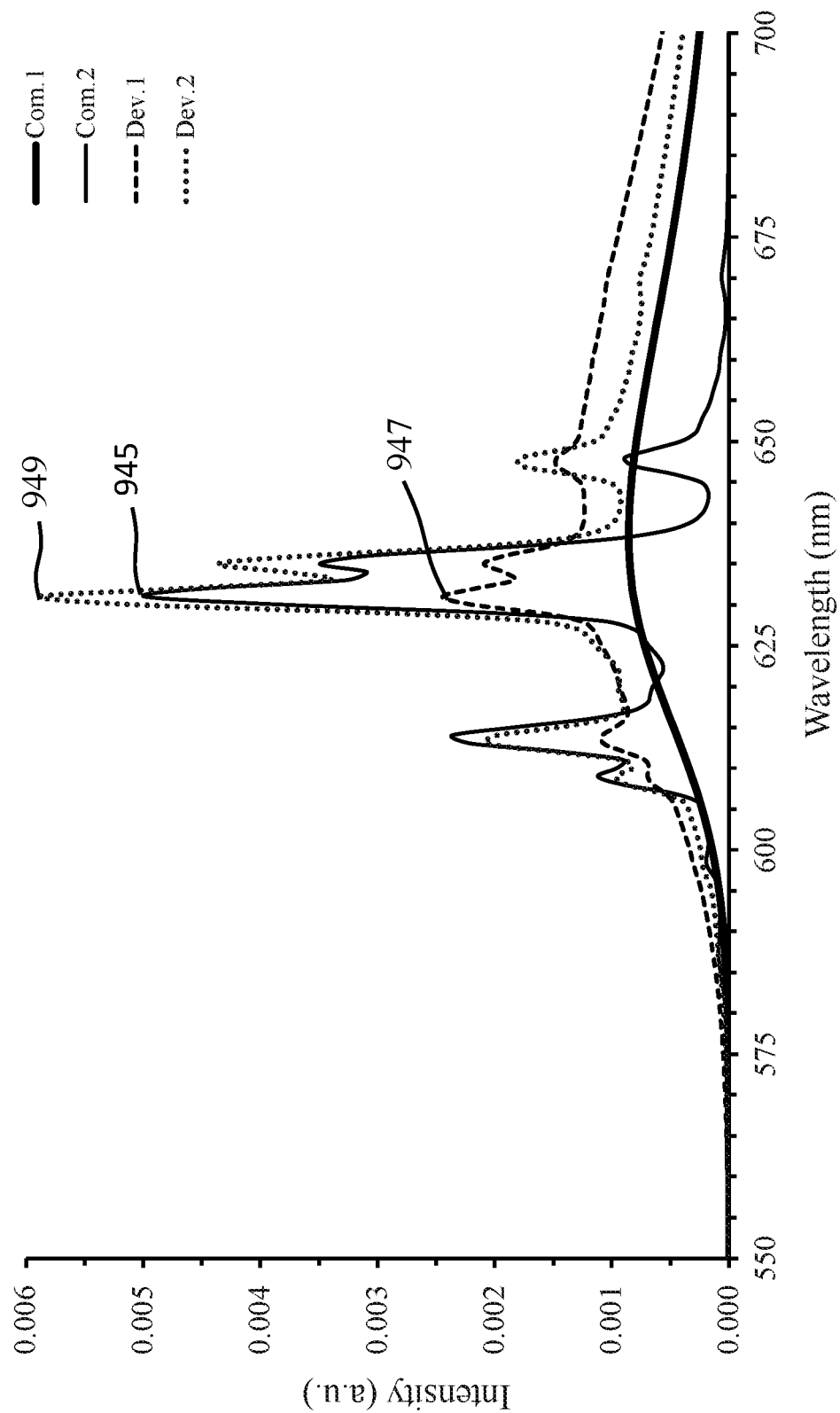
FIGS. 9A and 9B are measured spectra, intensity (a.u.) versus wavelength (nm), for (i) a comparative packaged red light emitting device Com.1 containing broadband red phosphor (thick solid line), (ii) a comparative packaged red light emitting device Com.2 containing narrowband red fluoride phosphor (thin solid line), (iii) a packaged single-layer red light emitting device Dev. 1 in accordance with an embodiment of the invention (dashed line), and (iv) a packaged double-layer red light emitting device Dev. 2 in accordance with an embodiment of the invention (dotted line)
Figure 9B:
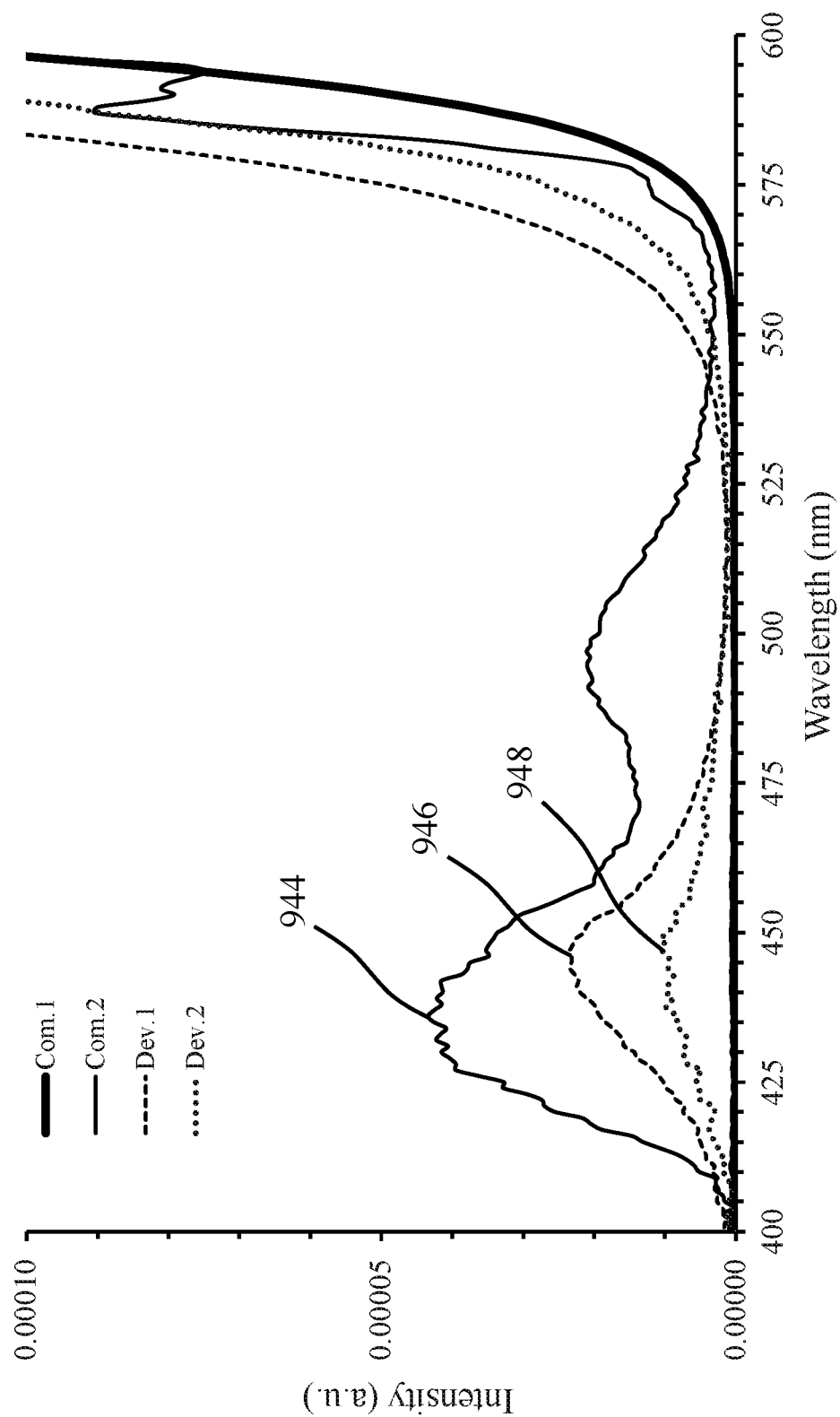
Figure 9C:
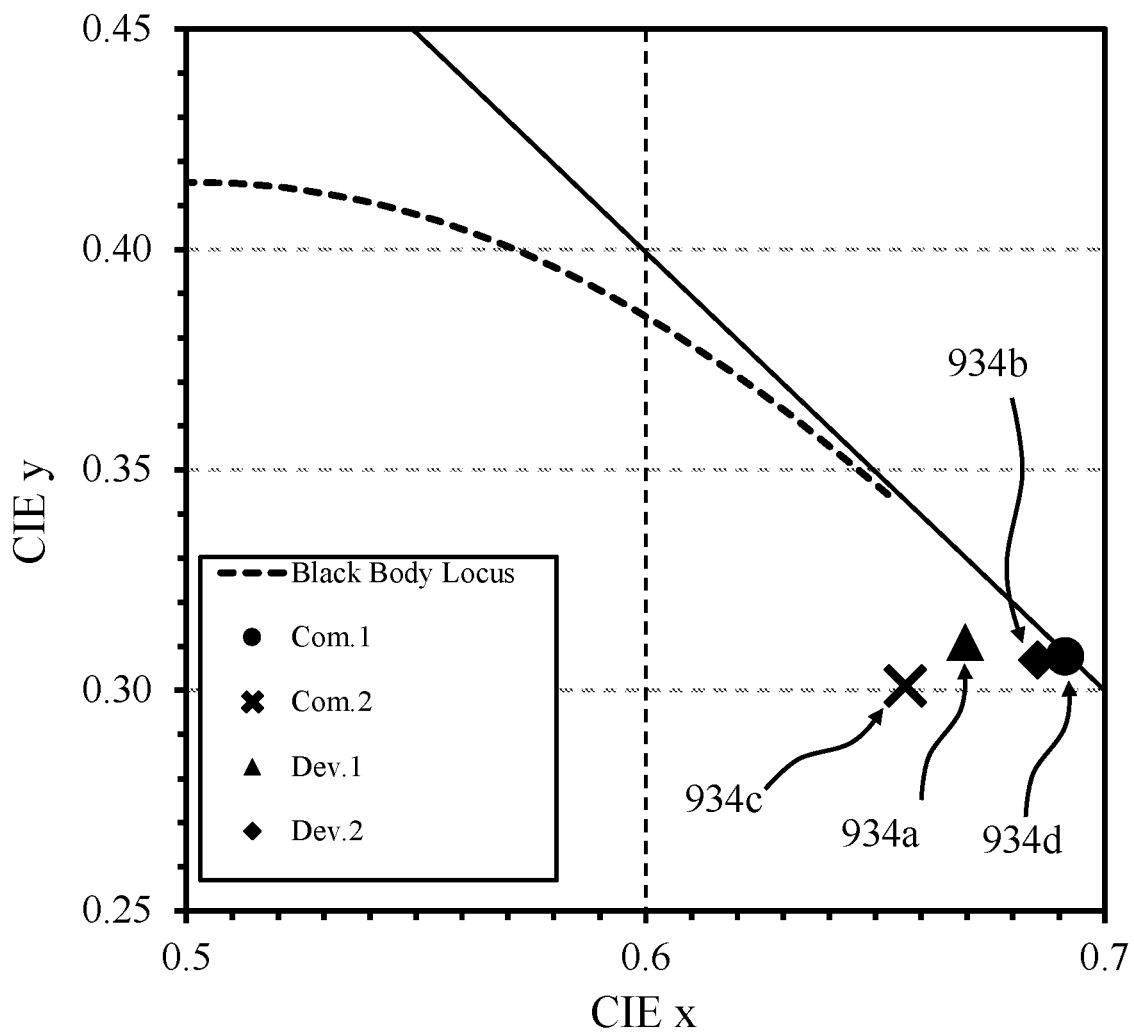
FIG. 9C is a CIE 1931 chromaticity diagram illustrating the chromaticity (color) of light generated by (i) comparative packaged red light emitting device Com.1 (solid circle), (ii) comparative packaged red light emitting device Com.2 (cross), (iii) packaged single-layer red light emitting device Dev. 1 (solid triangle), (iv) packaged double-layer red light emitting device Dev. 2 (solid diamond), black body locus (dashed line), and chromaticity gamut boundary (solid line)

TABLE 3 tabulates the measured optical performance of the PC Red-light emitting devices (PC Red LED) Com.1, Com.2, Dev.1, and Dev.2. FIGS. 9A and 9B are measured spectra, intensity (a.u.) versus wavelength (nm), for comparative packaged red-light emitting device Com.1 containing broadband red phosphor (thick solid line), (ii) comparative packaged red-light emitting device Com.2 containing narrowband red fluoride phosphor (thin solid line), (iii) packaged single-layer red-light emitting device Dev. 1 in accordance with an embodiment of the invention (dashed line), and (iv) packaged double-layer red-light emitting device Dev. 2 in accordance with an embodiment of the invention (dotted line). FIG. 9A shows the wavelength portion of the spectra for wavelengths from 550 nm to 700 nm (i.e., green to red region). FIG. 9B shows the wavelength portion of the spectra for wavelengths from 400 nm to 600 nm (i.e., violet to yellow) and illustrates "blue pass through". FIG. 9C is a CIE 1931 chromaticity diagram illustrating the chromaticity (color) of light generated by (i) comparative packaged red light emitting device Com.1 (solid circle), (ii) comparative packaged red light emitting device Com.2 (cross), (iii) packaged single-layer red light emitting device Dev. 1 (solid triangle), (iv) packaged double-layer red light emitting device Dev. 2 (solid diamond), black body locus (dashed line), and chromaticity gamut boundary (solid line).

TABLE 3

Optical performance of comparative PC Red LEDs (Com. 1, Com. 2),
single-layer PC Red LEDs (Dev. 1) and two-layer PC Red LED (Dev. 2)

| Device | Flux (lm) | Efficacy (lm/W) | Brightness (%) | $\lambda_d$ (nm) | $\lambda_p$ (nm) | FWHM (nm) | Purity (%) | CIE x | CIE Y |
|---|---|---|---|---|---|---|---|---|---|
| Com. 1 | 7.29 | 10.0 | 100 | 620.3 | 638.8 | 67.1 | 99.7 | 0.6912 | 0.3078 |
| Com. 2 | 13.89 | 11.5 | 190 | 626.6 | 632.6 | 7.25 | 87.3 | 0.6565 | 0.3011 |
| Dev. 1 | 14.89 | 12.3 | 204 | 619.4 | 632.6 | 27.3 | 94.2 | 0.6696 | 0.3109 |
| Dev. 2 | 17.72 | 14.5 | 243 | 621.1 | 632.4 | 7.49 | 97.7 | 0.6853 | 0.3068 |

As can be seen from TABLE 3, comparative device Com.1, containing, in terms of photoluminescence material, only broadband red phosphor (CASN 630), generates red light with a flux of 7.29 lm (100%) and a luminous efficacy of 10.0 lm/W with a peak emission wavelength $\lambda_p$ of 639 nm, FWHM of 67 nm, dominant wavelength $\lambda_d$ of 620 nm and a color purity of 99.7%. In comparison, comparative device Com.2, containing, in terms of photoluminescence material, only narrowband red fluoride phosphor (KSF), generates red light with an increased flux of 13.89 lm (190%) and luminous efficacy of 11.5 lm/W with a peak emission wavelength $\lambda_p$ of 633 nm, FWHM of 7 nm, dominant wavelength $\lambda_d$ of 627 nm and color purity of only 87.3%. It will be noted that use of a narrowband red fluoride phosphor (Com.2) compared with use of a broadband red phosphor (Com.1), as might be expected, results in a substantial (90%) increase in lumen output/efficacy, a reduction in FWHM (67 nm to 7 nm), and a decrease in color purity (87.3% compared with 99.7%).

Referring to FIG. 9B, it is to be noted that for Com.1 there is no evidence of violet/blue light (400-500 nm) in the final emission spectrum (thick solid line) indicating that all of the blue light generated by the LED is converted red light, i.e., there is no evidence of "blue pass through" in the emission product of the device of Com.1. In contrast, for Com.2 the emission spectrum (thin solid line) has a clear peak 944 ($\lambda_p$ about 435 nm) in the violet/blue region of the spectrum that is attributable to unconverted blue light generated by the LED chip, so-called "blue pass through". The large reduction in color purity of red light produced by Com.2 compared with Com.1 (87.3% compared with 99.7%) is attributable to the unconverted blue light 944 which causes the chromaticity CIE x of light to decrease moving the chromaticity (chromaticity point 834—FIG. 8) of the light further from the curved boundary of the chromaticity diagram, thereby reducing the color purity. Even increasing the weight loading of narrowband red fluoride phosphor (KSF) to binder (silicone) from 70% to 80% would only increase the color purity of light generated by Com.2 to value of 95%. Thus, a significant increase in the amount of KSF usage alone would increase the cost of manufacturing significantly without offering a significant increase in the performance/purity of light of the device. A combination of a narrowband red fluoride phosphor (e.g., manganese-activated fluoride narrowband red phosphor) and a red phosphor having a higher absorption efficiency such as, for example, a broadband red phosphor is thus advantageous because it produces a synergistic effect.

As can be seen from FIG. 9A, the intensity of the principal peak at approximately 630 nm attributable to narrowband red fluoride phosphor (KSF) of Com.2, Dev.1, and Dev.2 differs in each device. The intensity of this peak is determined by the absorption/conversion of blue light by the narrowband red fluoride phosphor (KSF) and CASN when present and the amount of unconverted blue light—blue pass through. It can be seen from FIG. 9A that Com.2 (single layer comprising only KSF) has a peak 945 at approximately 630 nm with an intensity of approximately 0.005. The intensity of peak 945 is attributable to Com.2 comprising, in terms of photoluminescence material, only narrowband red fluoride phosphor (KSF) and the intensity depends inversely on the amount of blue pass through—unconverted blue light. As can be seen from FIG. 9B, Com.2 has a peak 944 peak with an intensity of approximately 0.00004. It can be seen from FIG. 9A that Dev.1 (single layer comprising mixture of KSF and CASN) has a principal peak 947 with an intensity of approximately 0.0025. The height of this peak is attributable to Dev.1 comprising a mixture of narrowband red fluoride phosphor (KSF) and CASN in a single layer. Since the KSF and CASN are contained in a single layer, CASN and KSF have equal exposure to blue light. Since CASN has a greater absorption efficiency than KSF, the proportion of light attributable KSF is much smaller than that attributable to CASN and as a result, the intensity (0.0025) of peak 947 is lower than the intensity (0.005) of peak 945. As can be seen in FIG. 9B, Dev.1 has a peak 946 with a peak intensity of approximately 0.00002 for blue light since the presence of CASN in the single layer mixture (KSF/CASN) absorbs/converts some blue light into red light thereby reducing blue pass through (unconverted blue light) compared with Com.2. Next, it can be seen from FIG. 9A that Dev.2 (double layer comprising KSF in a proximal layer to LED chip and CASN in distal layer to LED chip) has a peak 949 with an intensity of approximately 0.006 at approximately 630 nm. The intensity of this peak is attributable to Dev.2 comprising, in terms of photoluminescence material, only narrowband red fluoride phosphor (KSF) in one layer and CASN in a separate layer. Since the narrowband red fluoride phosphor is not competing for blue light with another phosphor (i.e., CASN) in the same layer, the absorption/conversion of blue light by the narrowband red fluoride phosphor is enhanced causing the 630 nm peak intensity to be approximately 0.006 higher than Com.2 that comprises KSF alone. FIG. 9B shows that Dev.2 has a peak 948 with an intensity of approximately 0.00001 for blue light since CASN is present in the separate layer to absorb absorb/convert blue light into red light that has not already been converted by the KSF (effectively mopping up any blue light not converted by KSF). Since the conversion/absorption efficiency of blue light by KSF is lower than that of CASN, for example, but CASN is present in a separate layer to absorb any unconverted blue light without competing for the blue light with the KSF in the other layer, Dev.2 demonstrates relatively low blue pass through (unconverted blue light)—this spectral energy being distributed in the KSF peak at 630 nm. Hence, the KSF peak intensity at 630 nm is greater for Dev.2 compared with that of Com.2 (0.006 compared with 0.005) due to the presence of CASN in a separate layer which causes blue light to be scattered back into the KSF (recycling) increasing the number of potential collisions of blue light with the KSF thereby increasing the peak intensity of Dev.2 in the KSF peak region (at approximately 630 nm).

In summary, it will be appreciated that the addition of CASN reduces the amount of blue pass through and improves color purity when using a narrowband red fluoride phosphor. Moreover, by providing the CASN in a separate layer, this further increases the emission intensity of the peak attributable to KSF. This arrangement also reduces the amount/quantity of KSF required by the device to attain a desired emission intensity.

As can be seen from TABLE 3, single-layer device Dev.1 containing a combination of narrowband red fluoride and broadband red phosphor (CASN 650) generates red light with a flux of 14.89 lm (204%) and a luminous efficacy of 12.3 lm/W with a peak emission wavelength $\lambda_p$ of 633 nm, FWHM of 27 nm, dominant wavelength $\lambda_d$ of 619 nm and color purity 94.2%. Referring to FIG. 9B, while Dev.1 has a peak 946 ($\lambda_p$ about 445 nm) in the violet/blue region of the spectrum that is attributable to unconverted blue light, "blue pass through", the intensity of the peak 946 is much smaller (about half) compared with the peak 944 of Com.2. The increase in color purity of red light produced by Dev.1 compared with Com.2 (94.2% compared with 87.3%) is attributable to the reduction of unconverted blue light 946 in the final emission product. As illustrated in FIG. 9C, the reduction of unconverted blue light causes the chromaticity CIE x of light generated by Dev.1 (934*a*—solid triangle) to increase in value compared with the chromaticity of Com.2 (934*c*— cross) moving the chromaticity point 934*a* of the light towards the curved chromaticity gamut boundary (solid line) of the chromaticity diagram thereby increasing the color purity. The increase in color purity of red light produced by Dev.1 compared with Com.2 is attributable to the inclusion of the broadband red phosphor which reduces the intensity of unconverted blue light 946 in the final emission product because more of the blue light is being converted (compared with Com.2 having KSF alone). As can be seen from TABLE 2, the inclusion of the broadband red phosphor also reduces the usage amount (weight) of narrowband red fluoride phosphor (34% weight reduction compared with Com.2).

As can be seen from TABLE 3, double-layer device Dev.2 containing a combination of narrowband red fluoride and broadband red phosphor (CASN 650) generates red light with a flux of 17.72 lm (243%) and a luminous efficacy of 14.5 lm/W with a peak emission wavelength $\lambda_p$ of 632 nm, FWHM of 7.49 nm, dominant wavelength $\lambda_d$ of 621 nm and color purity 97.7%. Referring to FIG. 9B, it is to be noted that while Dev.2 has a peak 948 ($\lambda_p$ about 445 nm) in the violet/blue region of the spectrum that is attributable to unconverted blue light—"blue pass through"—the peak 948 is diffuse and of a much smaller intensity (about a quarter) compared with that of peak 944 of Com.2. The increase in color purity of red light produced by double-layer Dev.2 compared with single-layer Dev.1 (97.7% compared with 94.2%) is attributable to the reduction of unconverted blue light 948 in the final emission product. As illustrated in FIG. 9C, the reduction of unconverted blue light causes the chromaticity CIE x of light generated by Dev.2 (934*b*—diamond) to increase in value compared with the chromaticity of Dev.1 (934*a*—triangle) moving the chromaticity point 934*b* of the light towards the curved chromaticity gamut boundary (solid line) of the chromaticity diagram thereby increasing the color purity. The decrease in "blue pass through" is attributable to the double-layer photoluminescence structure in which the narrowband red fluoride phosphor is provided in a separate layer adjacent to the LED chip. Such an arrangement effectively increases the absorption efficiency of the narrowband red fluoride phosphor since the narrow band red fluoride phosphor is not competing with the broadband red phosphor for blue photons as is the case in a single-layer photoluminescence structure. Moreover, as can be seen from TABLE 3, as well as increasing color purity and intensity/luminous efficacy (243% compared with 204%), a double-layer photoluminescence structure can reduce usage amount (weight) of narrowband red fluoride phosphor (40% weight reduction compared with Com.2). FIG. 9C also shows the chromaticity value of Com.1 (934*d*—solid circle).

In summary, it will be appreciated that red light emitting devices in accordance with embodiments of the invention comprising a combination narrowband red fluoride phosphor and broadband red phosphor can provide number of benefits, including but not limited to: (1) a substantial reduction in narrowband red fluoride phosphor usage (at least about 40%), (2) a substantial reduction, or even elimination of "blue pass through" leading to increased color purity of red light generated by the device, (3) a substantial increase in light intensity/luminous efficacy of the device, and (4) a color purity that is comparable with a PC Red LED that utilizes, in terms of photoluminescence material, only broadband red phosphor or a color purity that is superior to that of a PC Red LED that utilizes only narrowband red phosphor.

Color-Tunable Multi-LED Lighting Devices

Phosphor-Converted Red LEDs (PC Red LEDs) containing narrowband red phosphor in accordance with embodiments of invention find utility as a red-light source in light emitting devices such as for example RGB (Red Green Blue) Multi-LED lighting devices that comprise a Red LED, Green LED and Blue LED. As described herein, PC Red LEDs can comprise packaged or CSP (Chip Scale Packaged) devices having a single-layer or double-layer photoluminescence structures. The green LED can comprise a packaged or CSP (Chip Scale Packaged) Phosphor-Converted Green LED (PC Green LED) having a single-layer photoluminescence structure comprising a green photoluminescence material (phosphor) covering a violet to blue LED chip. The green phosphor may comprise, for example, a green silicate phosphor $((Sr_{1-x}Ba_x)_2SiO_4:Eu)$, β-SiAlON phosphor, or a green emitting YAG phosphor $((Y, Ba)_{3-x}(Al_{1-y}Ga_y)_5O_{12}:Ce_x)$ Alternatively, the green LED may comprise a Direct-Emitting green LED chip (e.g., InGaN-based LED chip). The blue LED typically comprises an InGaN-based LED chip or flip chip. The Red, Green, and Blue LEDs can be housed in a package, such as for example, a surface mount package. When the Red LED comprises a PC Red LED and the Green LED comprises a PC Green LED or a Direct-Emitting Green LED, the Red, Green, and Blue LEDs may be mounted on a substrate such as a printed circuit board, a so-called Chip On Board (COB) packaging arrangement.

Figure 10A:
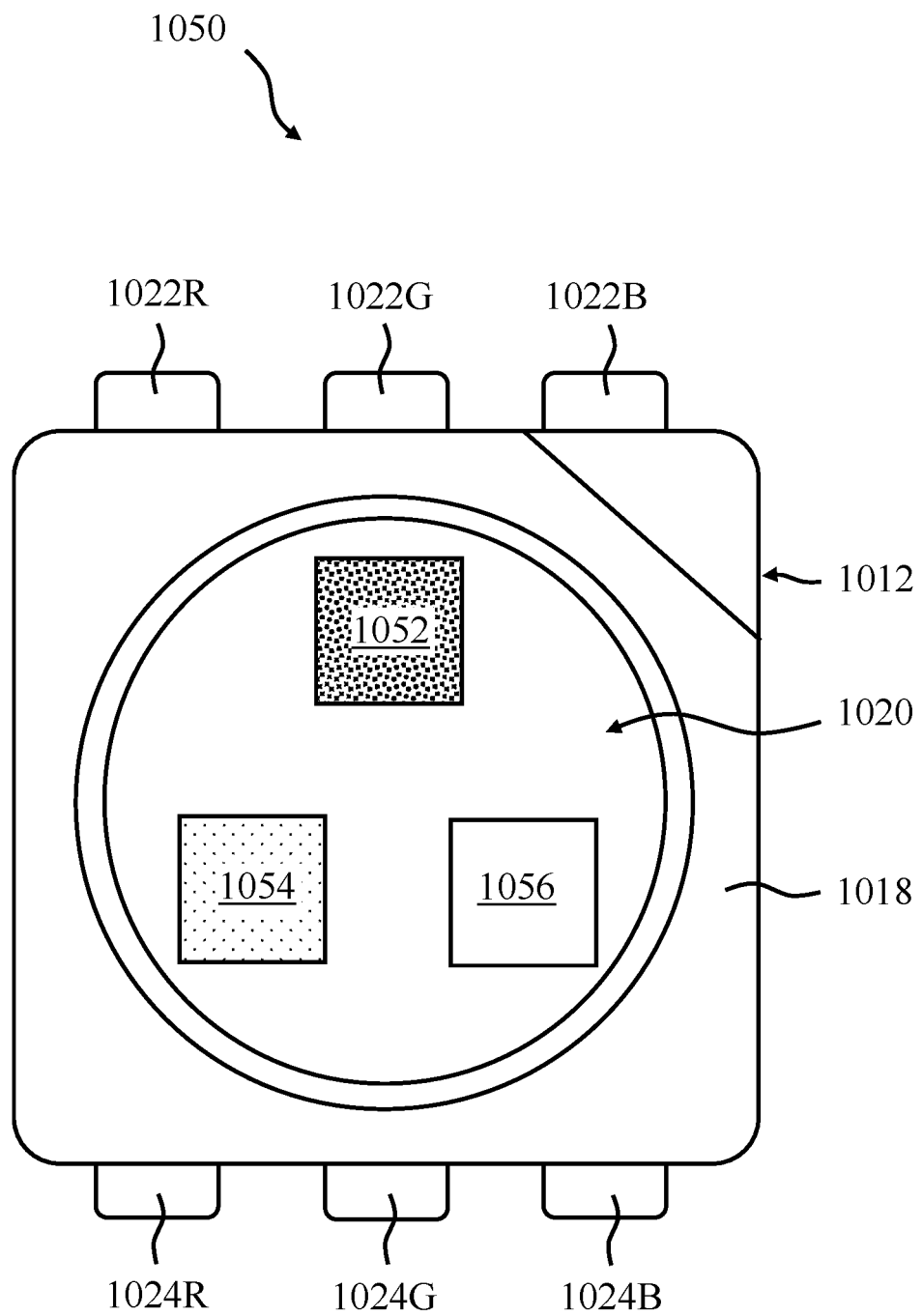
FIG. 10A is a schematic plan view of a color-tunable multi-LED packaged lighting device utilizing a CSP (Chip Scale Packaged) double-layer red-light emitting device in accordance with an embodiment of the invention.

FIG. 10A shows a schematic plan view of a color-tunable multi-LED packaged lighting device 1050 utilizing a red-light emitting device (PC Red LED) 1052. The device 1050 comprises a package (for example a SMD) 1012 comprising a lead frame and a housing 1018 that defines a single cavity (cup/recess) 1020 (e.g. circular as illustrated) containing a PC Red LED 1052, a green LED 1054, and a blue LED 1056. The PC Red LED 1052 may comprise a PC Red LED according to embodiments of the invention such as a single-layer or double-layer CSP (Chip Scale packaged) red light emitting device such as, for example, the CSP device of FIG.

6 or FIG. 7. The green LED 1054 may comprise a CSP PC Green LED comprising a broadband green phosphor covering an LED flip chip. The green phosphor having a peak emission wavelength from 500 nm to 565 nm. Alternatively, the green LED may comprise a Direct-Emitting Green LED chip (e.g. InGaN-based LED chip). The blue LED 1056 typically comprises an InGaN-based LED chip having a dominant wavelength from 430 nm to 480 nm. The cavity (cup) 1020 may be filled with a light transmissive medium (e.g. silicone) to provide environmental protection to the red 1052, green 1054 and blue 1056 LEDs. As illustrated, the package 1012 typically comprises respective anode and cathode electrical terminals 1022, 1024 allowing electrical power to be individually applied to the anode and cathode of each of the red (R), green (G) and blue (B) LEDs 1052, 1054, 1056.

Figure 10B:
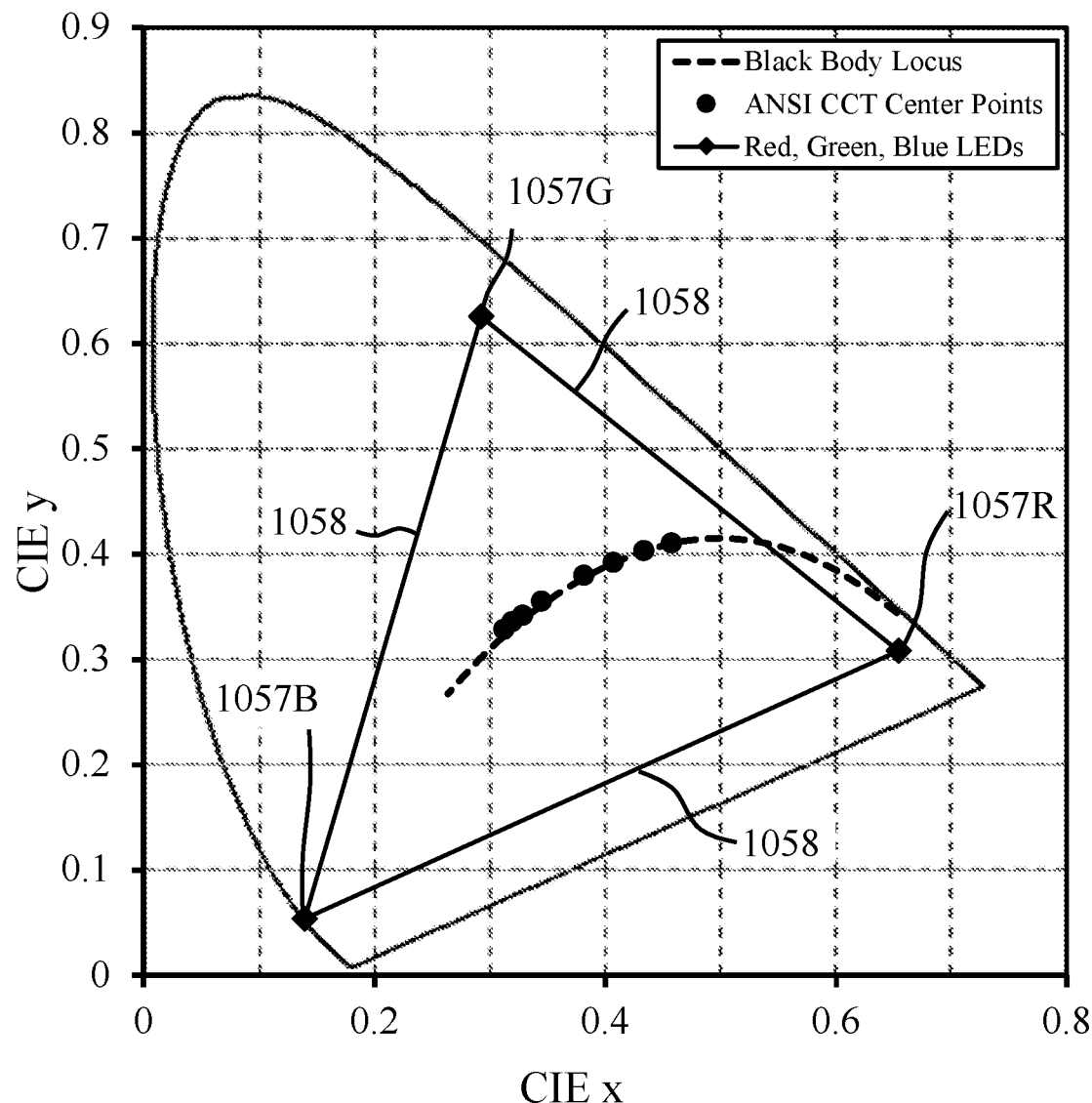
FIG. 10B is a CIE 1931 chromaticity diagram illustrating the gamut of light that the color-tunable multi-LED packaged lighting device of FIG. 10A can generate.

The lighting device 1050 can generate colors of light from blue to red as well as different color temperatures of light. FIG. 10B is a CIE 1931 chromaticity diagram illustrating the gamut (color/color temperatures) of light that the light emitting device 1050 can generate. The CIE chromaticity diagram shows the chromaticity (color point) 1057R of red light generated by the PC Red LED, the chromaticity (color point) 1057G of green light generated by the PC Green LED, and the chromaticity (color point) 1057B of blue light generated by the Blue LED. Straight lines 1058 connecting the points 1057R, 1057G, and 1057B define a triangle that represents the gamut of chromaticities (colors)/color temperatures of light that light emitting device 1050 can generate—i.e., the device can generate any color/color temperature of light within the triangle or lying on the boundary. As will be noted from the chromaticity diagram, the device 1050 can generate color temperatures of light lying on the black body locus (dashed line) and color temperatures corresponding to the ANSI CCT center points that lie within or on the boundary of the triangle.

Figure 11:
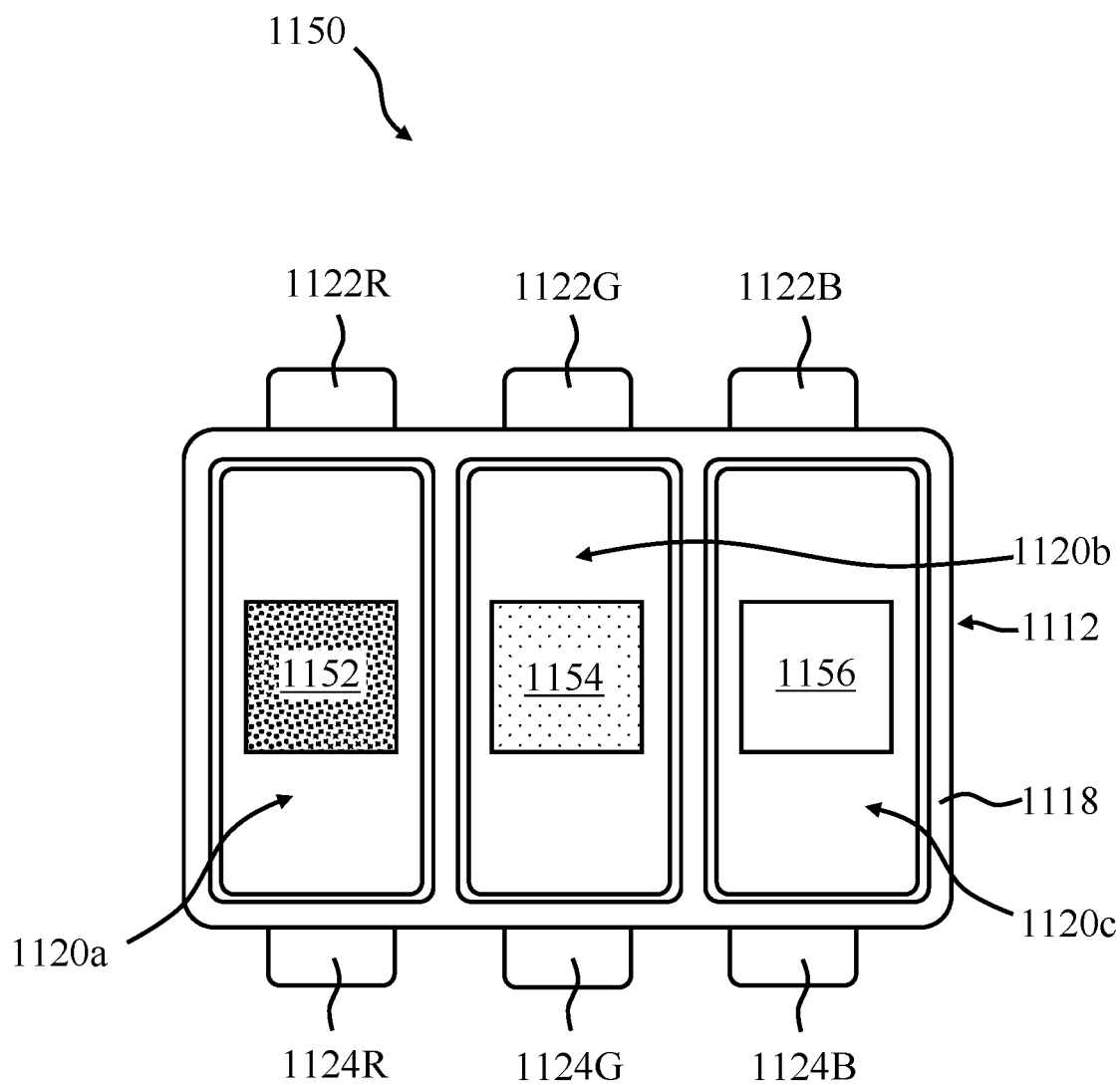
FIG. 11 is a schematic plan view of a color-tunable multi-LED packaged lighting device utilizing a CSP (Chip Scale Packaged) double-layer red-light emitting device in accordance with an embodiment of the invention.

FIG. 11 shows a schematic plan view of a color-tunable multi-LED packaged lighting device 1150 utilizing a red-light emitting device (PC Red LEDs) 1152. The device 1150 comprises a package 1112 having three cavities (cups) 1120a, 1120b, 1120c that respectively contain a PC Red LED 1152, a green LED 1154, and a blue LED 1156. As illustrated, the PC Red LED 1152 may comprise a PC Red LED according to embodiments of the invention such as a single-layer or double-layer CSP (Chip Scale packaged) red-light emitting device such as, for example, the CSP device of FIG. 6 or FIG. 7. The green LED 1154 may comprise a CSP PC Green LED or a Direct-Emitting green LED (e.g., InGaN-based LED chip). The blue LED 1056 typically comprises an InGaN-based LED chip and generates light with a dominant wavelength from 430 nm to 480 nm. Each cavity 1120a, 1120b, 1120c may be filled with a light transmissive medium (e.g., silicone) to provide environmental protection to the red 1152, green 1154 and blue 1156 LEDs. As illustrated, the package 1112 typically comprises respective anode electrical terminals 1122R, 1122G, 1122B and cathode electrical terminals 1124R, 1124G, 1124B, allowing electrical power to be independently applied to the anode and cathode of each of the red (R), green (G) and blue (B) LEDs 1152, 1154, 1156. Like lighting device 1050 of FIG. 10, lighting device 1150 can generate colors of light from blue to red as well as different color temperatures of light that—i.e., generate color/color temperature of light within the triangle or lying on the boundary of the triangle on the chromaticity diagram (FIG. 10B).

Figure 12:
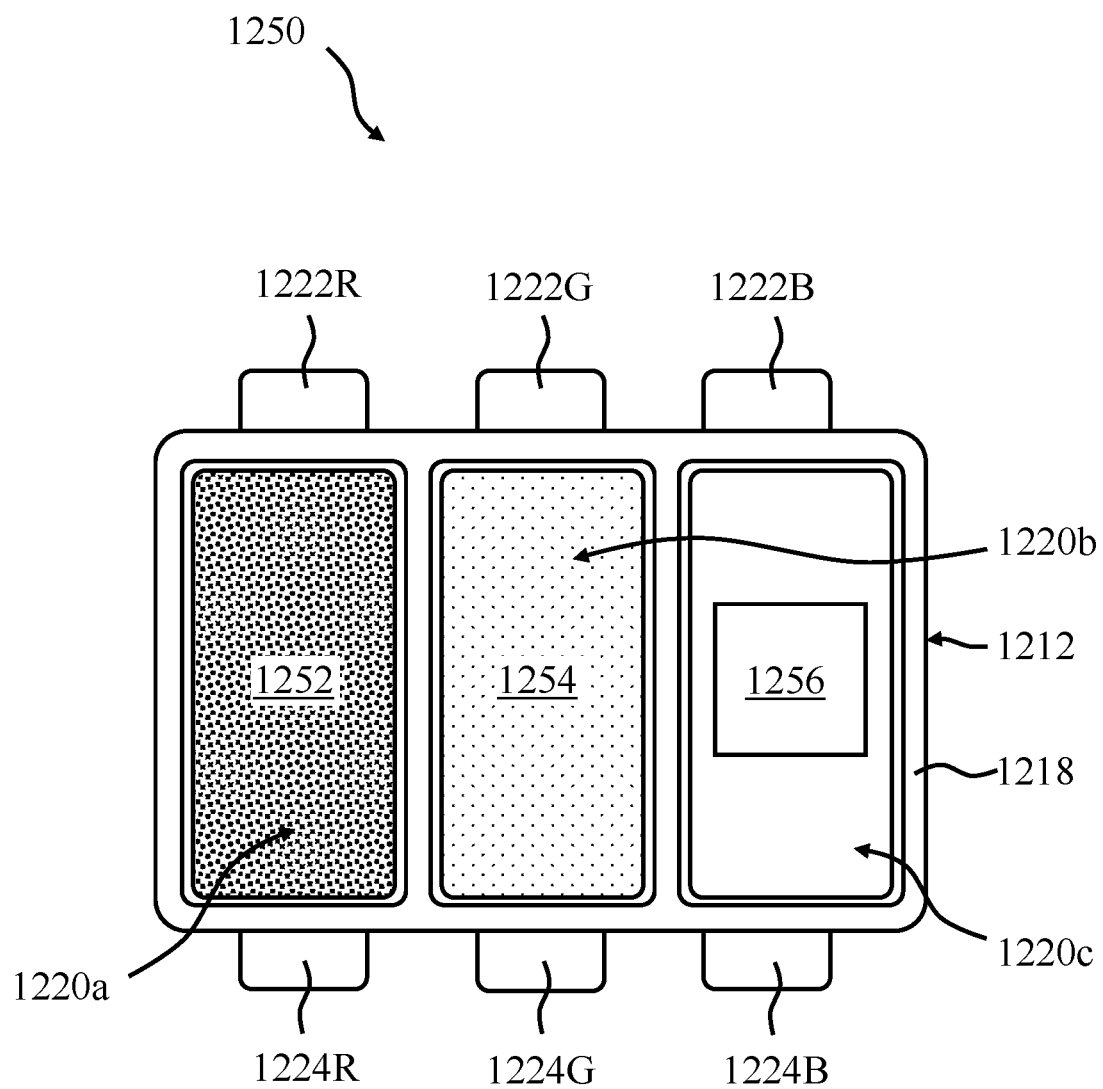
FIG. 12 is a schematic plan view of a color-tunable multi-LED packaged lighting device utilizing a packaged red-light emitting device in accordance with an embodiment of the invention.

FIG. 12 shows a schematic plan view of a color-tunable multi-LED packaged lighting device 1250 utilizing a red-light emitting device (PC Red LEDs) 1252. The device 1250 comprises a package 1212 having three cavities (cups) 1220a, 1220b, 1220c that respectively contain a PC Red LED 1252, a green LED 1254, and a blue LED chip 1256. As illustrated, the Red LED 1252 may comprise a PC Red LED according to embodiments of the invention such as a single-layer or double-layer red light emitting device such as for example the packaged devices of FIGS. 2 to 5 in which the cavity 1220a is filled with narrowband red fluoride and broadband red phosphor. As illustrated, the green LED 1254 may comprise a PC Green LED such as for example a packaged device in which the cavity 1220b is filled with green phosphor. The blue LED chip 1256 typically comprises an InGaN-based LED chip and generates light with a dominant wavelength from 430 nm to 480 nm. The cavity 1220c may be filled with a light transmissive medium (e.g. silicone) to provide environmental protection to the blue LED chip 1256. As illustrated, the package 1212 typically comprises respective anode electrical terminals 1222R, 1222G, 1222B and cathode electrical terminals 1224R, 1224G, 1224B allowing electrical power to be independently applied to the anode and cathode of each of the red (R), green (G) and blue (B) LEDs 1252, 1254, 1256. Like lighting device 1050 of FIG. 10, lighting device 1250 can generate colors of light from blue to red as well as different color temperatures of light that—i.e. generate color/color temperature of light within the triangle or lying on the boundary of the triangle on the chromaticity diagram (FIG. 10B).

Figure 13A:
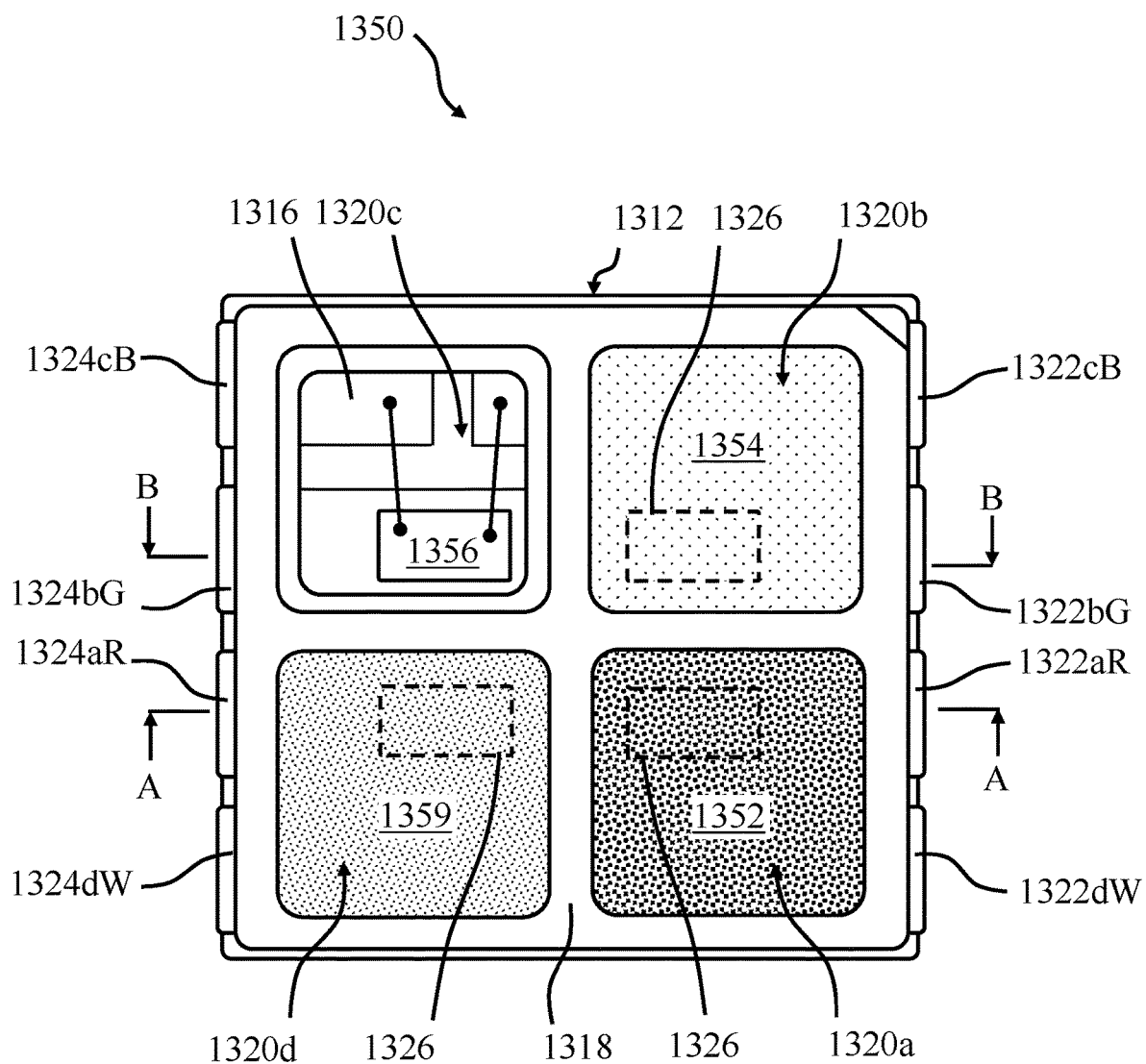
Figure 13B:
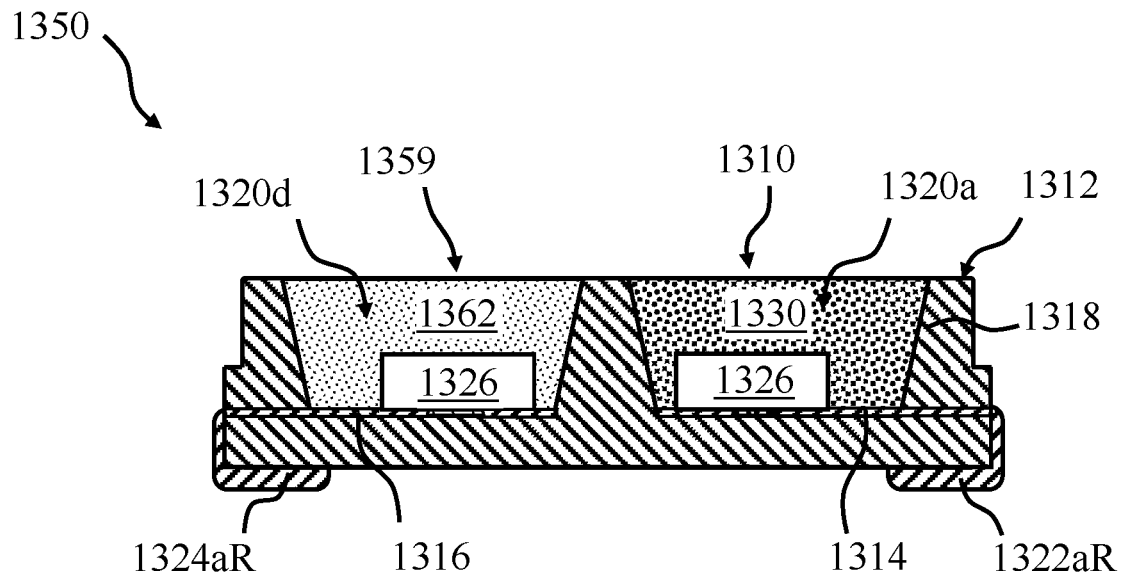
Figure 13C:
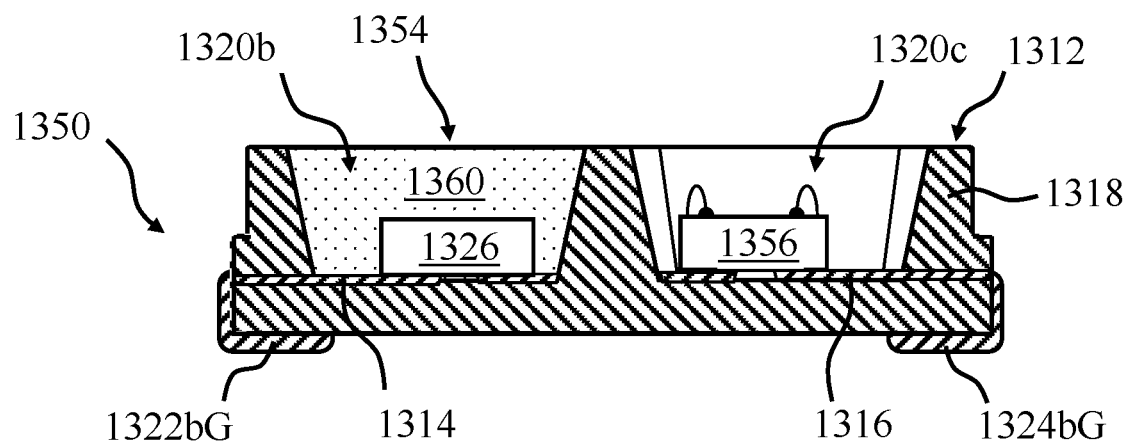

FIGS. 13A to 13C are schematic representations of a color-tunable multi-LED packaged lighting device 1350 comprising a PC Red LED, a Green LED, a blue LED and a PC White LED in accordance with an embodiment of the invention in which FIG. 13A shows a top view, FIG. 13B shows a sectional side view through A-A, and FIG. 13C shows a sectional side view through B-B. The device 1350 comprises a package 1312 comprising a lead frame (anode 1322 and cathode 1324 regions) and a housing 1318 molded onto the lead frame. The housing 1318 comprises a first cavity (cup) 1320a, a second cavity (cup) 1320b, a third cavity (cup) 1320c, and a fourth cavity (cup) 1320d that respectively contain a PC Red LED 1352, a green LED 1354, a blue LED 1356, and a white LED 1359. As illustrated, the package 1314 may comprise a first pair of anode and cathode electrical terminals 1322aR, 1324aR connected to the first cavity 1320a, a second pair of anode and cathode electrical terminals 1322bG, 1324bG connected to the second cavity 1320b, a third pair of anode and cathode electrical terminals 1322cB, 1324cB connected to the third cavity 1320c, and a fourth pair of anode and cathode electrical terminals 1322dW, 1324dW connected to the fourth cavity 1320d allowing electrical power to be independently applied to the anode and cathode of each of the red (R), green (G), blue (B) LEDs, and white (W) LEDs 1352, 1354, 1356, 1359.

As illustrated, the Red LED 1352 may comprise a PC Red LED according to embodiments of the invention such as a single-layer or double-layer red light emitting device such as, for example, the packaged devices of FIGS. 2 to 5 in which the first cavity 1320a contains a violet to blue LED chip 1326 and is filled with narrowband red fluoride and broadband red phosphor photoluminescence layer 1330. As illustrated, the green LED 1354 may comprise a PC Green LED such as for example a packaged device in which the second cavity 1320b contains a violet to blue LED chip 1326 and is filled with green phosphor photoluminescence layer 1360 that covers the blue to violet LED chip 1326. The blue LED 1356 comprises a blue LED chip that generates light with dominant wavelength from 430 nm to 480 nm. The third cavity 1320c may be filled with a light transmissive medium (e.g., silicone) to provide environmental protection to the blue LED chip 1356. As illustrated, the white LED 1359 may comprise a packaged device in which the fourth cavity 1320d contains a violet to blue LED chip 1326 and is filled with green to red phosphor photoluminescence layer 1362 that covers the blue to violet LED chip 1326. The white LED 1359 can be configured to generate Warm White (WW) light with a CCT (Correlated Color Temperature) from 2000K to 4000K.

Figure 13D:
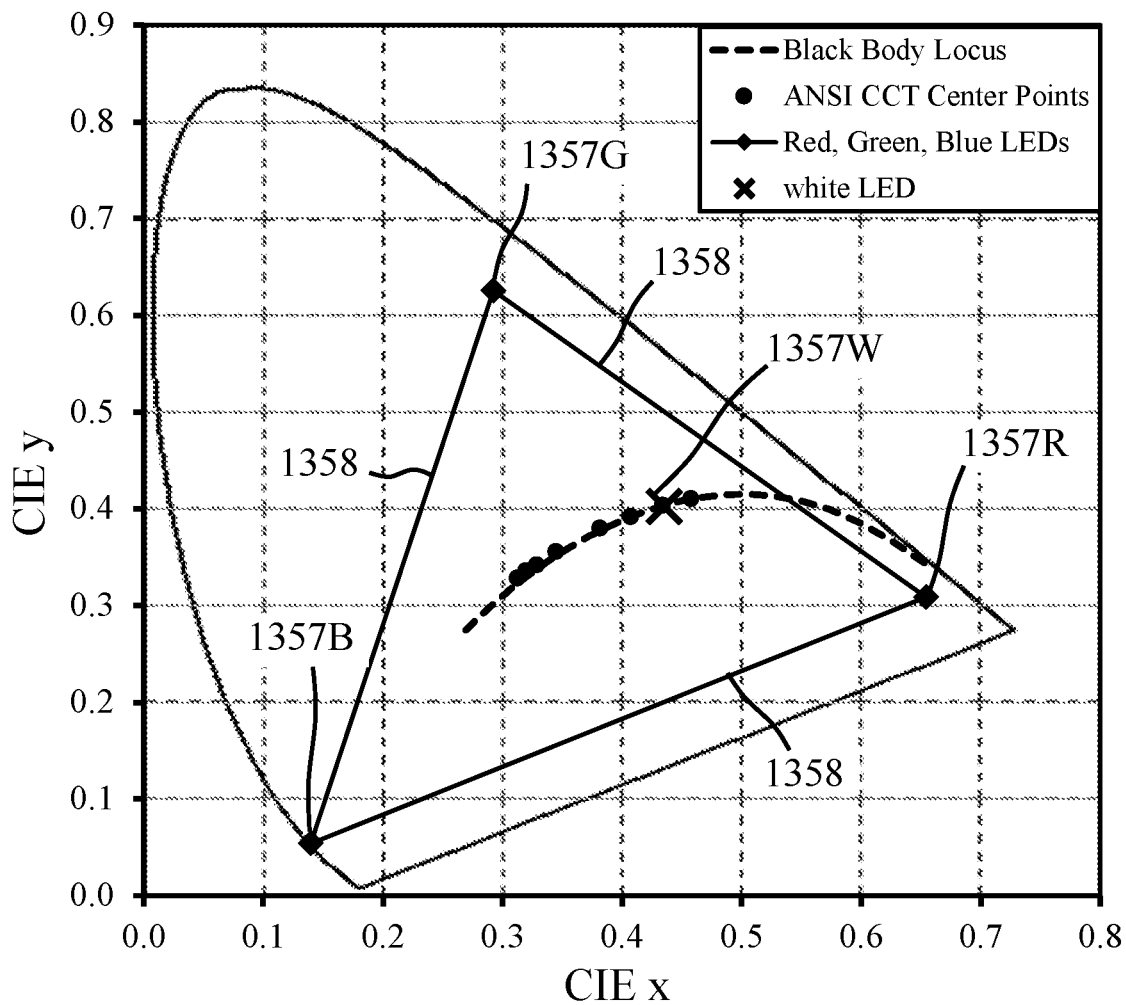
FIG. 13D is a CIE 1931 chromaticity diagram illustrating the gamut of light that the color-tunable multi-LED packaged lighting device of FIG. 13A to 13C can generate.

The lighting device 1350 can generate colors (chromaticities) of light from blue to red as well as different color temperatures of light. FIG. 13D is a CIE 1931 chromaticity diagram illustrating the gamut (color/color temperatures) of light that the light emitting device 1350 can generate. The CIE chromaticity diagram shows the chromaticity (color point) 1357R (solid diamond) of red light generated by the PC Red LED, the chromaticity (color point) 1357G (solid diamond) of green light generated by the PC Green LED, the chromaticity (color point) 1357B (solid diamond) of blue light generated by the Blue LED, and the chromaticity (color point) 1357 W (cross) of light generated by the white LED. Straight lines 1358 connecting the points 1357R, 1357G, and 1357B define a triangle that represents the gamut of chromaticities (colors)/color temperatures of light that light emitting device 1350 can generate—i.e., the device can generate any chromaticity (color)/color temperature of light within the triangle or lying on the boundary. It is to be noted that since the color point 1357W for the white LED lies within the triangle, the white LED does not increase the color gamut of the device. The inclusion of a white LED can, however, simplify the generation of light of other color temperatures by the adding of green/blue light to light generated by the white LED and simplify the generation of light with a higher General Color Rendering Index CRI Ra by the adding red light to light generated by the white LED.

Figure 14A:
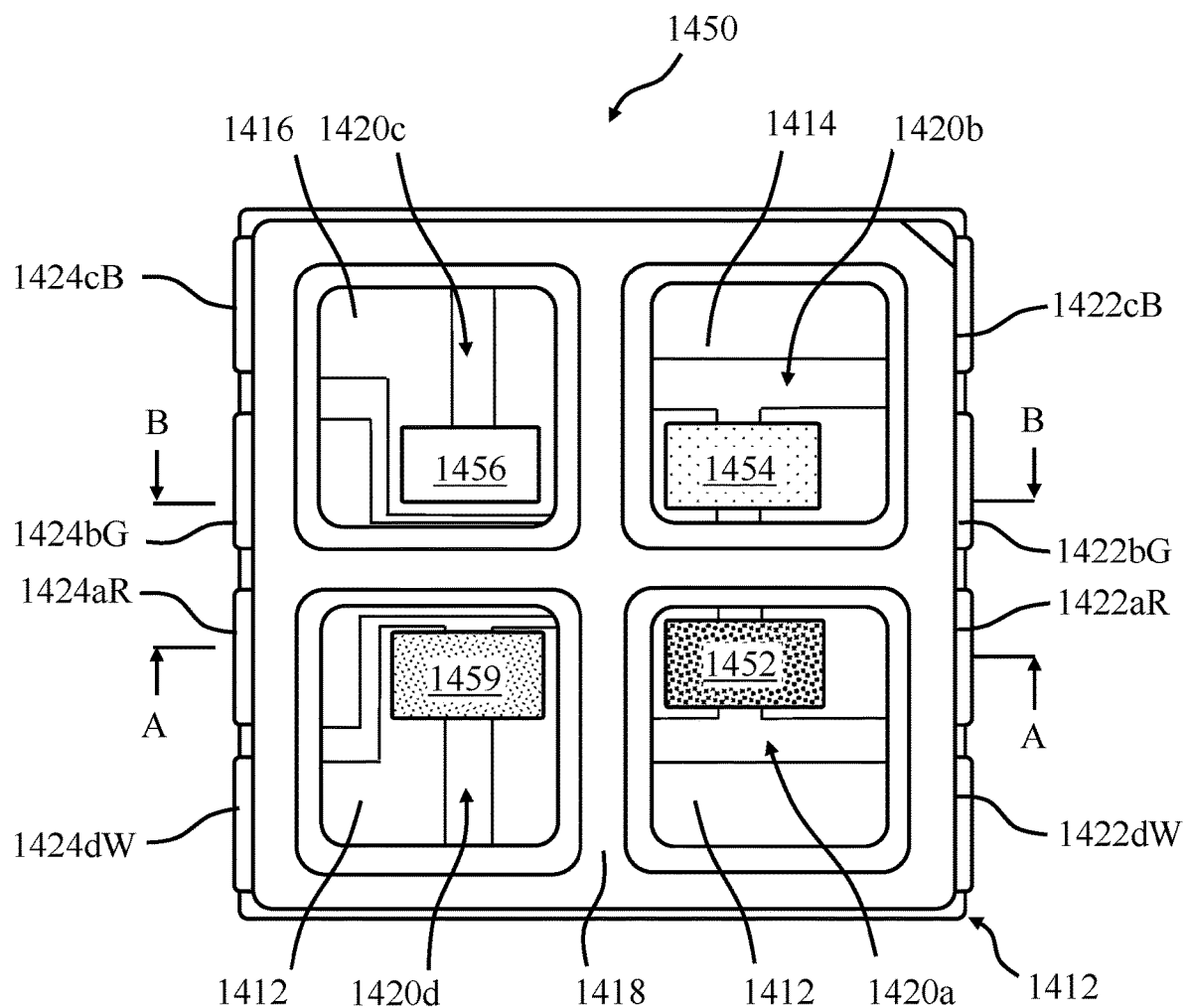
Figure 14B:
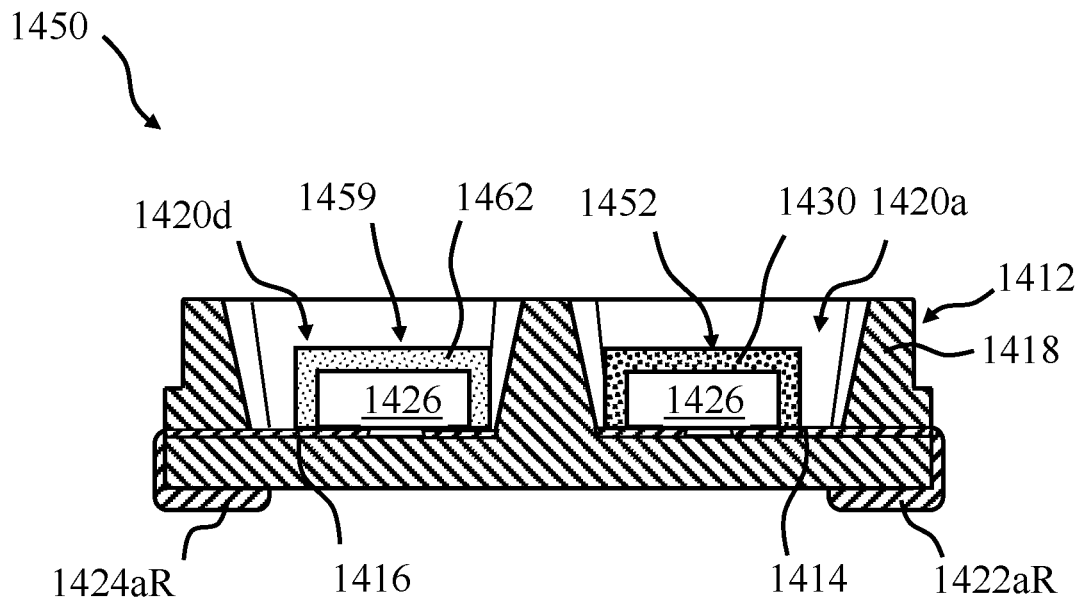
Figure 14C:
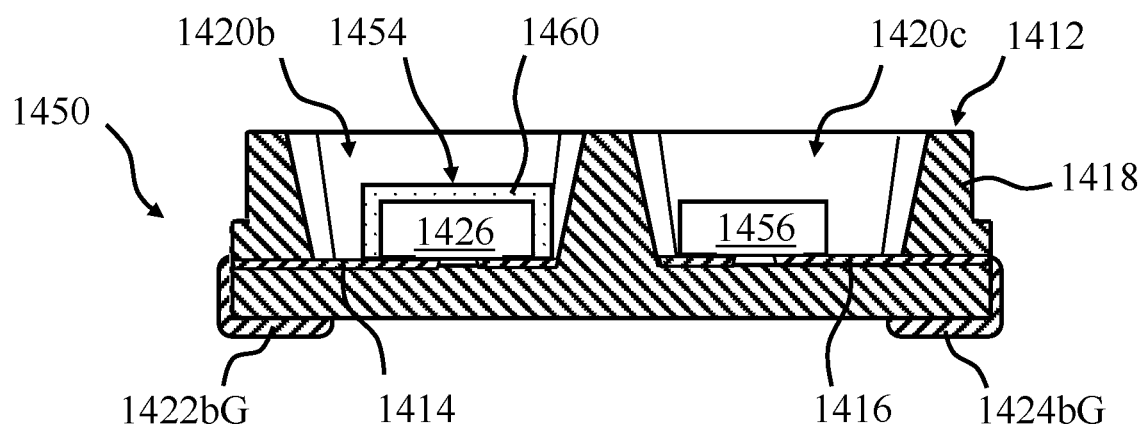

FIGS. 14A to 14C are schematic representations of a color-tunable multi-LED packaged lighting device 1450 comprising a CSP PC Red LED, a CSP PC Green LED, a blue LED flip chip and a CSP White LED in accordance with an embodiment of the invention in which FIG. 14A shows a top view, FIG. 14B shows a sectional side view through A-A, and FIG. 14C shows a sectional side view through B-B. The device 1450 is the same as that of the device 1350 of FIGS. 13A to 13C and comprises Chip Scale Packaged (CSP) LEDs. As illustrated, the Red LED 1452 may comprise a CSP PC Red LED according to embodiments of the invention such as a single-layer or double-layer red light emitting device such as, for example, the CSP devices of FIGS. 6 and 7 in which the CSP PC Red LED comprises a blue to violet LED flip chip 1426 which has layer of narrowband red fluoride and broadband red phosphor photoluminescence layer 1430 on at least a light emitting face of the LED flip chip 1426. The first cavity 1420a may be filled with a light transmissive medium (e.g. silicone) to provide environmental protection to the CSP PC Red LED 1452. As illustrated, the CSP PC green LED 1454 may comprise a violet to blue LED flip chip 1426 which has a green phosphor photoluminescence layer 1460 on at least a light emitting face of the LED flip chip 1426. The second cavity 1420b may be filled with a light transmissive medium (e.g. silicone) to provide environmental protection to the CSP PC Green LED 1454. The blue LED 1456 comprises a blue LED chip that generates light with dominant wavelength from 430 nm to 480 nm. The third cavity 1420c may be filled with a light transmissive medium (e.g. silicone) to provide environmental protection to the blue LED chip 1456. As illustrated, the CSP white LED 1459 may comprise a violet to blue LED flip chip 1426 which has layer of green to red phosphor photoluminescence layer 1462 on at least a light emitting face of the LED flip chip 1426. The fourth cavity 1420d may be filled with a light transmissive medium (e.g., silicone) to provide environmental protection to the CSP white LED 1459. The white LED 1459 can be configured to generate Warm White (WW) light with a CCT (Correlated Color Temperature) from 2000K to 5000K. The package 1412 typically comprises respective anode electrical terminals 1422aR, 1422bG, 1422cB, and 1422dW, and cathode electrical terminals 1424aR, 1424bG, 1424cB, and 1424dW connected to each cavity 1420a, 1420b, 1420c, and 1420d allowing electrical power to be independently applied to the anode and cathode of each of the red (R), green (G), blue (B), and white LEDs 1452, 1454, 1456, 1459. Like lighting device 1350 of FIG. 13A to 13C, lighting device 1450 can generate colors of light from blue to red as well as different color temperatures of light that—i.e., generate color/color temperature of light within the triangle or lying on the boundary of the triangle on the chromaticity diagram (FIG. 10B).

Figure 14D:
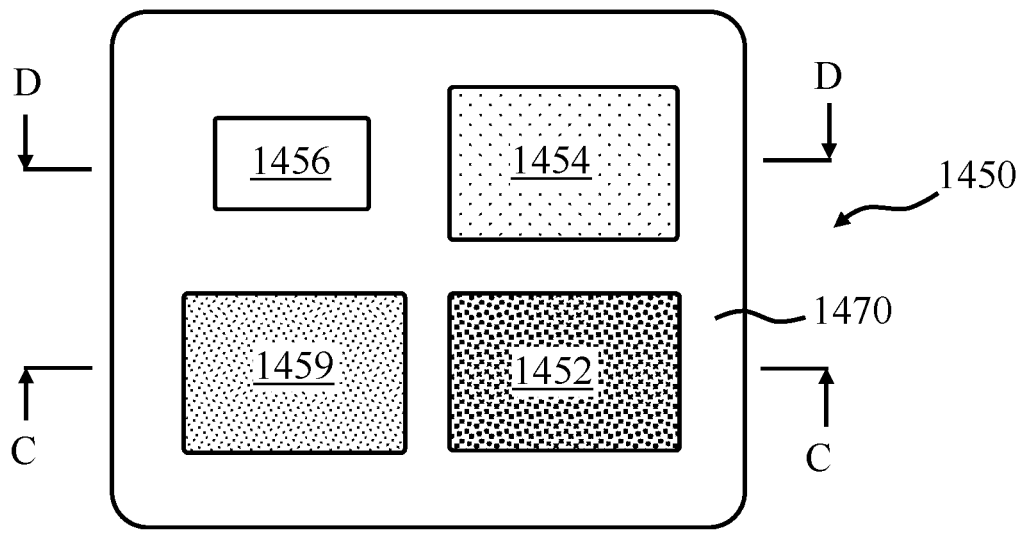
Figure 14E:
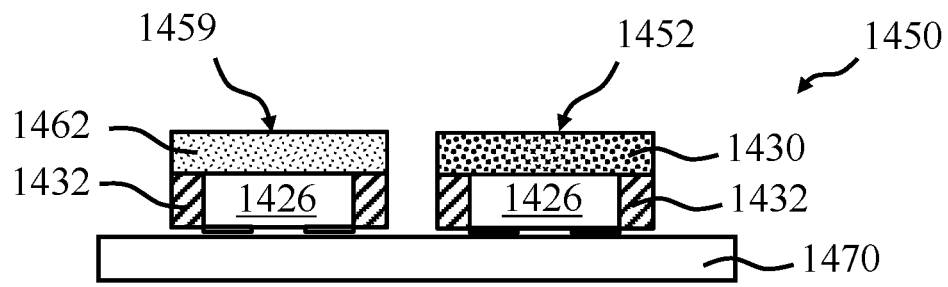
Figure 14F:
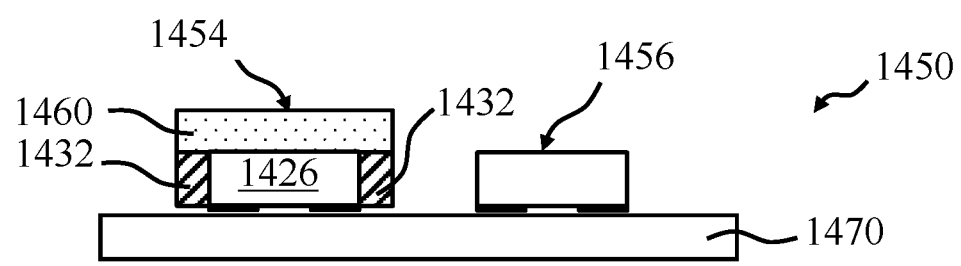

As described herein, when the LEDs (Red, Green, Blue, White) comprise CSP LED (i.e., CSP PC Red, CSP PC Green, CSP White LED) or Direct Emitting (DE) LEDs (i.e. DE green LED, DE Blue LED) the LEDs may be mounted on a substrate such as a printed circuit board, a so-called Chip On Board (COB) packaging arrangement. FIGS. 14D to 14F are schematic representations of a color-tunable multi-LED COB lighting device comprising a CSP PC Red LED, a CSP PC Green LED, a blue LED flip chip and a CSP White LED in accordance with an embodiment of the invention in which FIG. 14D shows a top view FIG. 14E shows a sectional side view through C-C and FIG. 14F shows a sectional side view through D-D. The lighting device 1450 comprises a substrate 1470, for example a printed circuit board, with a CSP PC Red LED 1452, a CSP PC Green LED 1454, a blue LED flip chip 1456 and a CSP White LED 1459 mounted on the same face. As illustrated, the Red LED 1452, Green LED 1454, blue LED 1456 and white LED 1459 may be configured on the substrate as a square array. The Red LED 1452 may comprise a CSP PC Red LED according to embodiments of the invention such as a single-layer or double-layer red light emitting device such as, for example, the CSP devices of FIGS. 6 and 7 in which the CSP PC Red LED comprises a blue to violet LED flip chip 1426 which has layer of narrowband red fluoride and broadband red phosphor photoluminescence layer 1430 on at least a light emitting face of the LED flip chip 1426. The CSP PC green LED 1454 may comprise a violet to blue LED flip chip 1426 which has a green phosphor photoluminescence layer 1460 on at least a light emitting face of the LED flip chip 1426. The blue LED 1456 comprises a blue LED flip chip that generates light with dominant wavelength from 430 nm to 480 nm. The CSP white LED 1459 may comprise a violet to blue LED flip chip 1426 which has layer of green to red phosphor photoluminescence layer 1462 on at least a light emitting face of the LED flip chip 1426. The white LED 1459 can be configured to generate Warm White (WW) light with a CCT (Correlated Color Temperature) from 2000K to 5000K. As illustrated, the Red LED 1452, Green LED 1454, and White LED 1459 a light reflective layer 1432, for example white silicone or epoxy, covering the four side faces of the LED chip 1426 to prevent emission of excitation light therefrom. Like lighting device 1250 of FIG.

12, lighting device 1450 can generate colors of light from blue to red as well as different color temperatures of light that—i.e., generate color/color temperature of light within the triangle or lying on the boundary of the triangle on the chromaticity diagram (FIG. 10B).

Figure 15A:
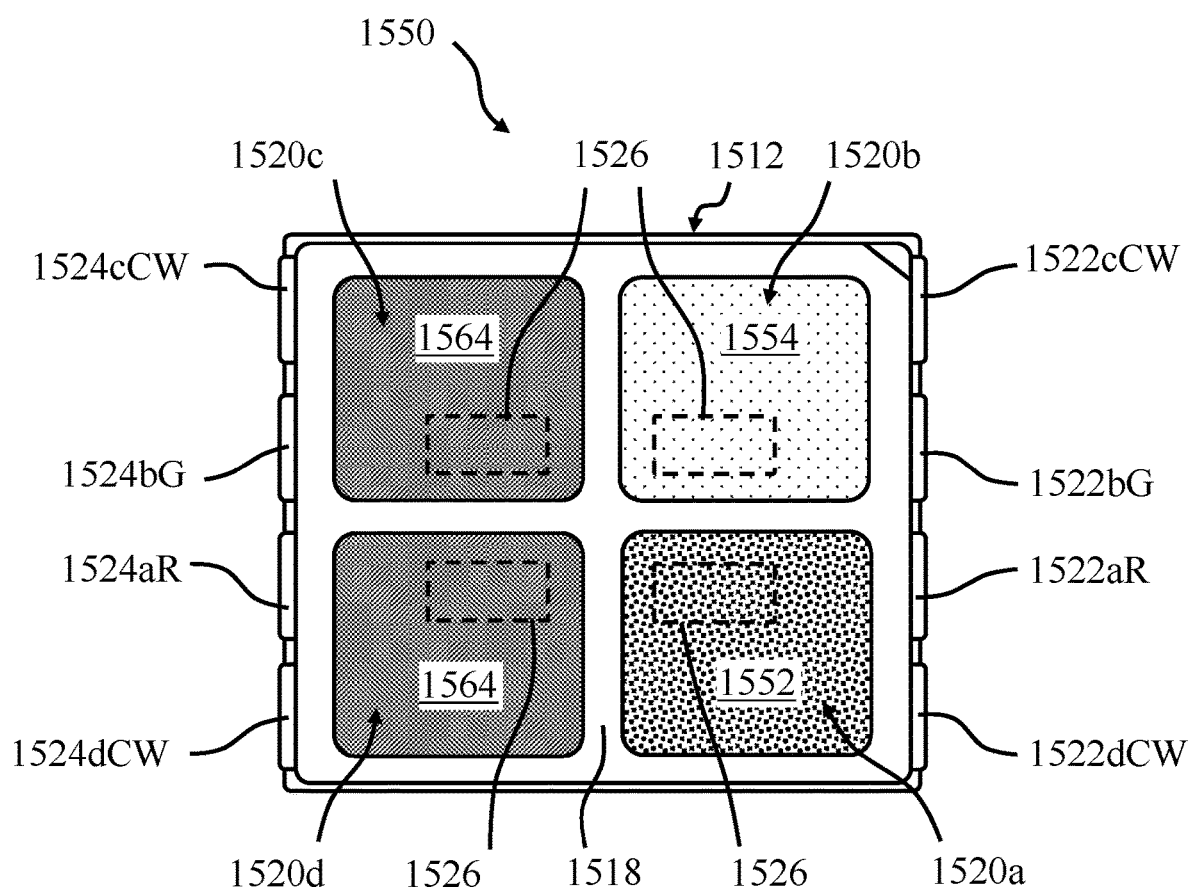
FIG. 15A is a schematic top view of a color-tunable multi-LED packaged lighting device comprising a PC Red LED, a PC Green LED, and two PC Cool White (CW) LEDs in accordance with an embodiment of the invention.

FIG. 15A is a schematic top view of a color-tunable multi-LED packaged lighting device 1550 comprising a PC Red LED, a PC Green LED, and two Cool White (CW) LEDs in accordance with an embodiment of the invention. The lighting device 1550 comprises a package 1512 comprising a lead frame and a housing 1518 molded onto the lead frame. The housing 1518 comprises a first cavity (cup) 1520a, a second cavity (cup) 1520b, a third cavity (cup) 1520c, and a fourth cavity (cup) 1520d that respectively contain a PC Red LED 1552, a PC Green LED 1554, a first CW LED 1564, and a second CW LED 1564. As illustrated, the Red LED 1552 may comprise a PC Red LED according to embodiments of the invention such as a single-layer or double-layer red light emitting device such as for example the packaged devices of FIGS. 2 to 5 in which the first cavity 1520a contains a violet to blue LED chip 1526 and is filled with narrowband red fluoride and broadband red phosphor photoluminescence layer that covers the violet to blue LED chip 1526. As illustrated, the green LED 1554 may comprise a PC Green LED such as for example a packaged device in which the second cavity 1520b contains a violet to blue LED chip 1526 and is filled with green phosphor photoluminescence layer that covers the violet to blue LED chip 1526. As illustrated, the first and second CW LEDs 1564 may comprise a packaged device in which the third and fourth cavities 1520c, 1520d each contain a violet to blue LED chip 1526 and is filled with green to yellow phosphor photoluminescence layer that cover the violet to blue LED chip 1526. The first and second CW LEDs 1564 can be configured to generate cool white light with a CCT (Correlated Color Temperature) from 5000K to 8000K. The first and second CW LEDs 1564 may generate CW light of the same CCT or CW light of different CCTs. The package 1512 typically comprises respective anode electrical terminals 1522aR, 1522bG, 1522cCW, and 1522dCW and cathode electrical terminals 1524aR, 1524bG, 1524cCW, and 1524dCW connected to each cavity 1520 allowing electrical power to be independently applied to the anode and cathode of each of the red (R), green (G), and first and second CW LEDs 1552, 1554, 1564.

Figure 15B:
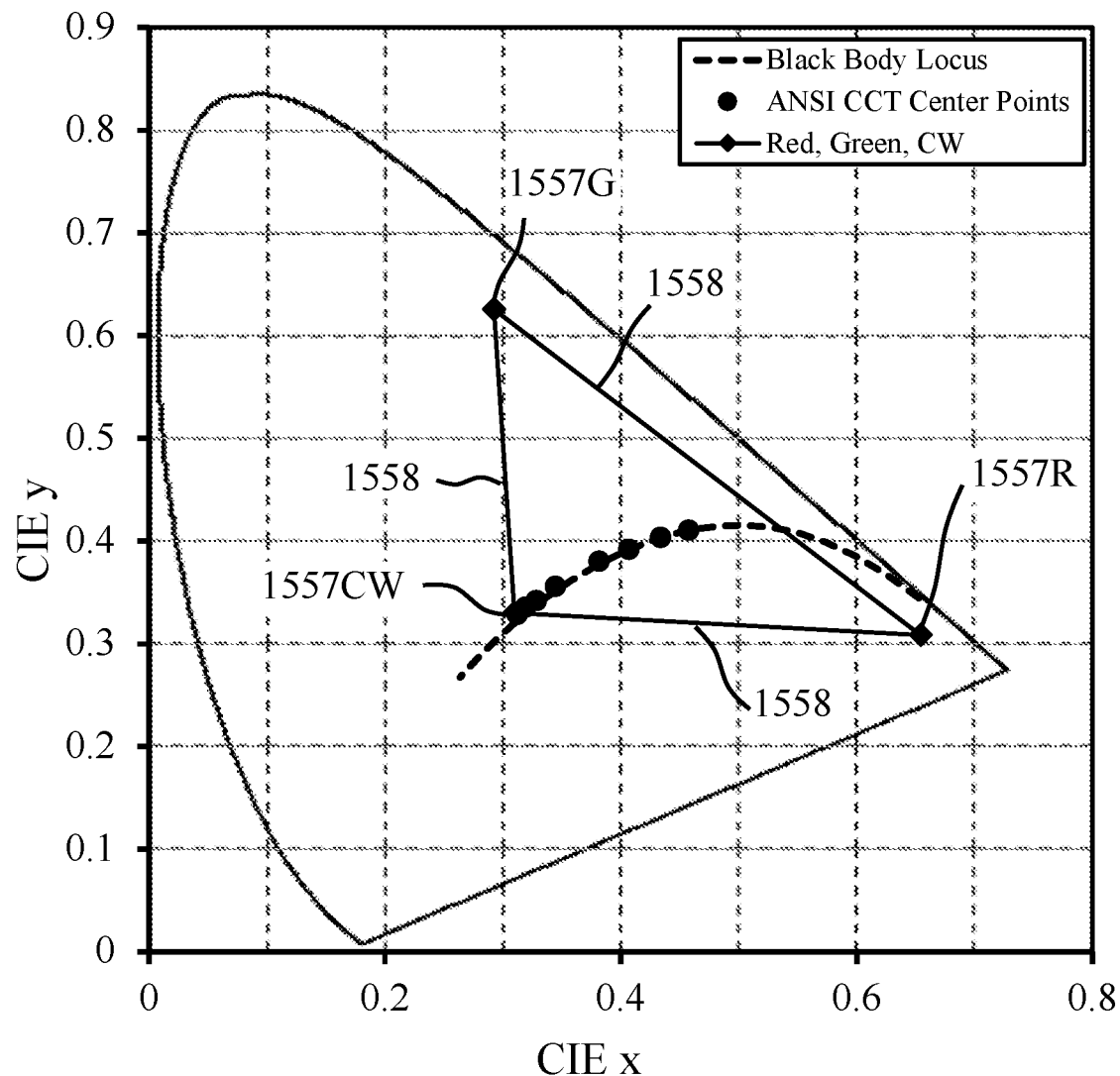
FIG. 15B is a CIE 1931 chromaticity diagram illustrating the gamut of light that the color-tunable multi-LED packaged lighting device of FIG. 15A can generate.

The lighting device 1550 can generate colors of light from green to red as well as different color temperatures of light. FIG. 15B is a CIE 1931 chromaticity diagram illustrating the gamut (color/color temperatures) of light that the light emitting device 1550 can generate. The CIE chromaticity diagram of shows the chromaticity (color point) 1557R (solid diamond) of red light generated by the PC Red LED, the chromaticity (color point) 1557G (solid diamond) of green light generated by the PC Green LED, and the chromaticity (color point) 1557CW (solid diamond) of light generated by the CW LEDs. Straight lines 1558 connecting the points 1557R, 1557G, and 1557CW define a triangle that represents the gamut of chromaticities (colors)/color temperatures (chromaticity) of light that light emitting device 1550 can generate—i.e., the device can generate any chromaticity (color)/color temperature of light within the triangle or lying on the boundary. The inclusion of the CW LEDs can simplify the generation of light of other color temperatures by the adding of green/red light to light generated by the CW LEDs.

Figure 16:
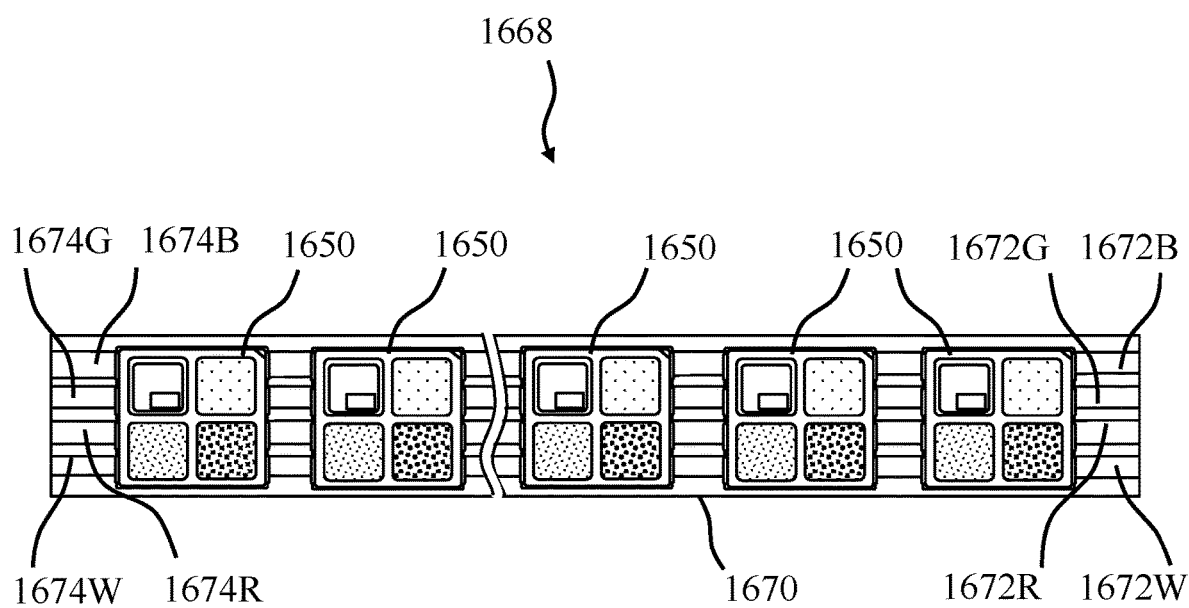
FIG. 16 is a schematic representation of a color-tunable linear lighting device in accordance with an embodiment of the invention.

FIG. 16 is a schematic top view of a color-tunable linear light emitting device 1668 in accordance with an embodiment of the invention. The color-tunable linear lighting device 1668 comprises a linear (elongate) substrate 1670, such as for example a strip of Metal Core Printed Circuit Board (MCPCB) or a strip of flexible circuit board, and a plurality of color-tunable multi-LED lighting devices 1650 mounted on and electrically connected to the substrate. As illustrated, the color-tunable multi-LED lighting devices 1650 can be arranged as a linear array in a direction of elongation of the substrate. For the purposes of illustration only, the color-tunable multi-LED lighting devices 1650 are shown as comprising the packaged lighting device of FIGS. 13A to 13C and comprise a PC Red LED (R), a Green LED (G), a blue LED (B) and a White LED (W). It will be appreciated that the lighting devices 1650 may comprise other color-tunable multi-LED lighting emitting devices as described herein. Each LED of a given color may be electrically connected in series with anode electrical connectors 1672R, 1672G, 1672B, and 1672W and cathode electrical connectors 1674R, 1674G, 1674B, and 1674W for each string of LEDs at opposite ends of the substrate.

Experimental Test Data

In this specification, Pack.# is used to denote a color-tunable multi-LED plighting device (lighting device) in accordance with the invention.

A color-tunable multi-LED packaged lighting device, denoted Pack.1, comprises the device of FIGS. 13A to 13C and comprises a 3838 four cavity (cup) package containing a PC Red LED, a PC Green LED, a blue LED, and a PC white LED. The PC Red LED in the first cavity comprises a single-layer structure comprising a mixture of KSF ($K_2SiF_6:Mn^{4+}$) narrowband red fluoride phosphor and CASN ($Ca_{1-x}Sr_xAlSiN_3:Eu$) broadband red phosphor. The red phosphors (KSF and CASN) are incorporated in a phenyl silicone and the mixture dispensed into the first cavity of the package to completely cover the violet to blue InGaN LED chip. The Green LED in the second cavity comprises a PC Green LED that comprises a violet to blue InGaN LED chip and a green silicate phosphor. The green phosphor (($Ba,Sr)_2SiO_4$) is incorporated in a phenyl silicone and the mixture dispensed into the second cavity of the package to cover the violet to blue InGaN LED chip. The blue LED in the third cavity comprises a InGaN blue LED chip. The white LED in the fourth cavity comprises a single-layer PC white LED comprising a mixture of green to red photoluminescence materials (e.g. ($Ba,Sr)_2SiO_4$ and CASN). The green to red phosphors are incorporated in a phenyl silicone and the mixture dispensed into the fourth cavity of the package to cover the violet to blue InGaN LED chip.

The color-tunable multi-LED lighting devices of the present invention comprising four individual LEDs (Red, Green, Blue, and White) use four independent currents to drive the individual LEDs. When generating white light of different CCTs, light generated by the white LED can be combined with light from the Red LED and/or Green LED and/or Blue LED at different ratio to generate light of any CIE white color point lying on the black body locus which is desirable for meeting ANSI lighting Standards. In contrast, current smart lighting products use one cool white (CW) LED and one warm white (WW) LED and do not additionally blend light from RGB LEDs. Such smart lighting products are capable of tuning the CIE white color point along a straight line connecting the CIE CW color point to the CIE WW color point; for example, CCTs from 2700K (WW) to 6500K (CW). For CIE points between the CIE CW and CIE WW color points, especially those at the midpoint between the color points for CCTs around 4000K, the CIE color point deviates substantially from the blackbody locus. As a result, current smart lighting products cannot generate light with a CIE white color point lying on the blackbody locus over their color temperature operating range and struggle to meet ANSI lighting Standards.

TABLE 4 tabulates measured optical characteristics of the PC Red LED (R), PC Green LED (G), Blue LED (B), and White LED (W) of color-tunable multi-LED packaged lighting device Pack.1. As will be noted from TABLE 4, the PC Red LED generates red light with a dominant wavelength ($\lambda_d$) of 622 nm and a color purity of 90%, the PC Green LED generates green light with a dominant wavelength of 547 nm and a color purity of 80%, and the blue LED generates blue light with a dominant wavelength of 467 nm and a color purity of 99%. The white LED generates warm white (WW) light with a CCT of 3000K and a general Color Rendering Index (CRI Ra) of 70. For comparison, light generated by the white LED has a dominant wavelength of 585 nm and a color purity of 52%.

TABLE 4

Pack.1: Measured optical characteristics of PC Red LED (R), PC Green LED (G), Blue LED (B), and White LED (W)
Measurement: 0.4 W and $I_F$ = 120 mA

| LED | $\lambda_d$ (nm) | CIE x | CIE y | Flux (lm) | Color purity |
|---|---|---|---|---|---|
| R | 622 | 0.6541 | 0.3084 | 14.8 | 90% |
| G | 547 | 0.2924 | 0.6255 | 64.5 | 80% |
| B | 467 | 0.1396 | 0.0539 | 9.6 | 99% |
| W | 585 | 0.4350 | 0.3068 | 56.1 | 52% |

Figure 17A:
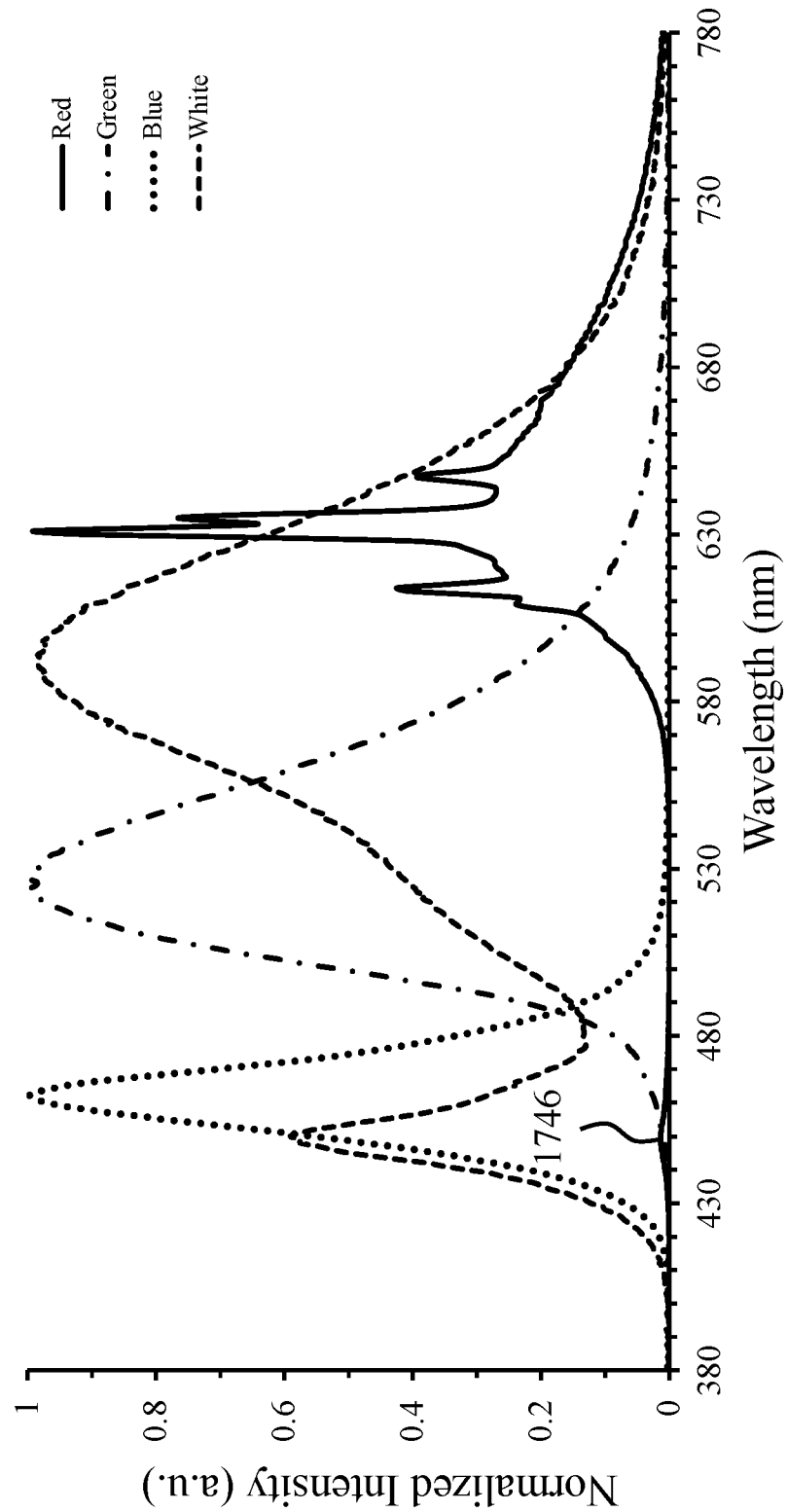
Figure 17B:
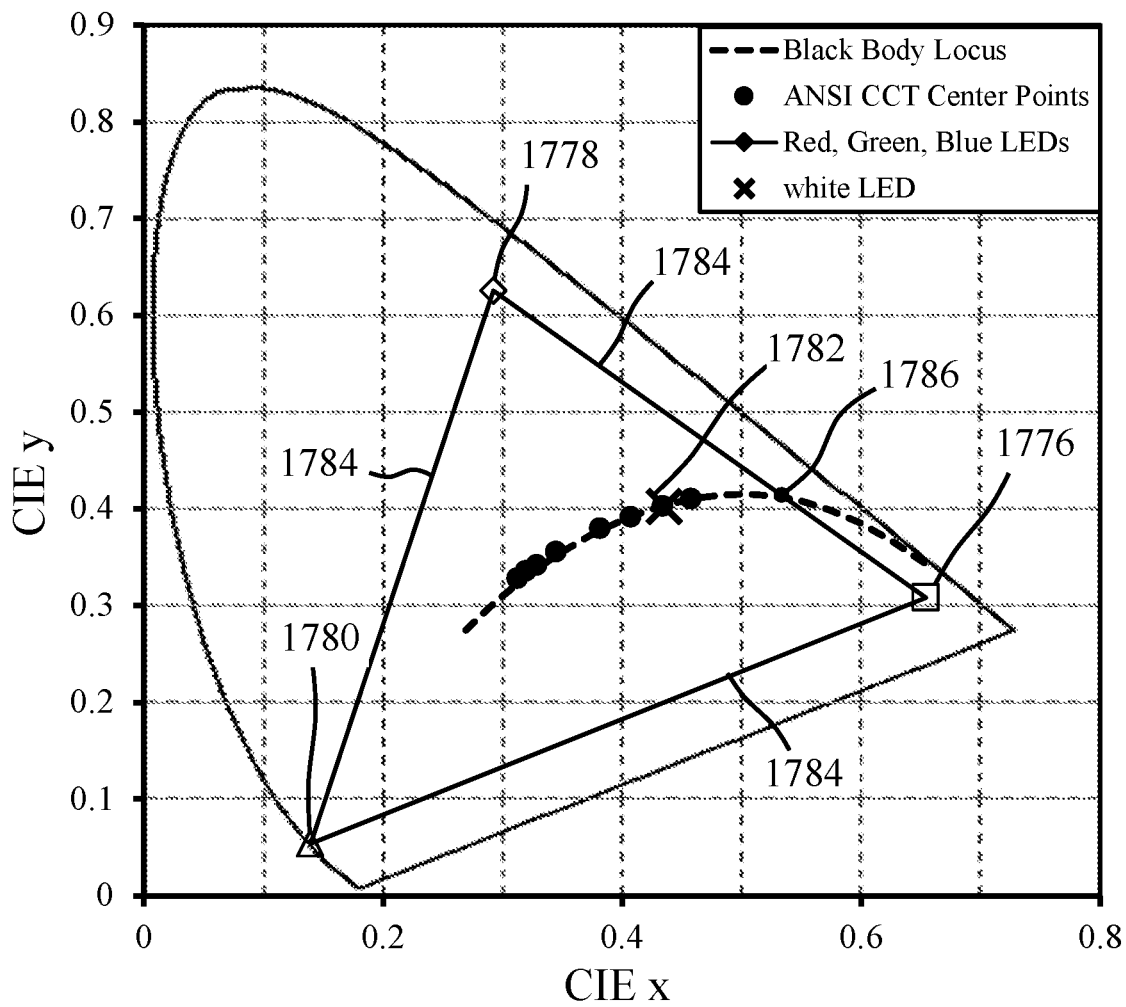
Figure 17C:
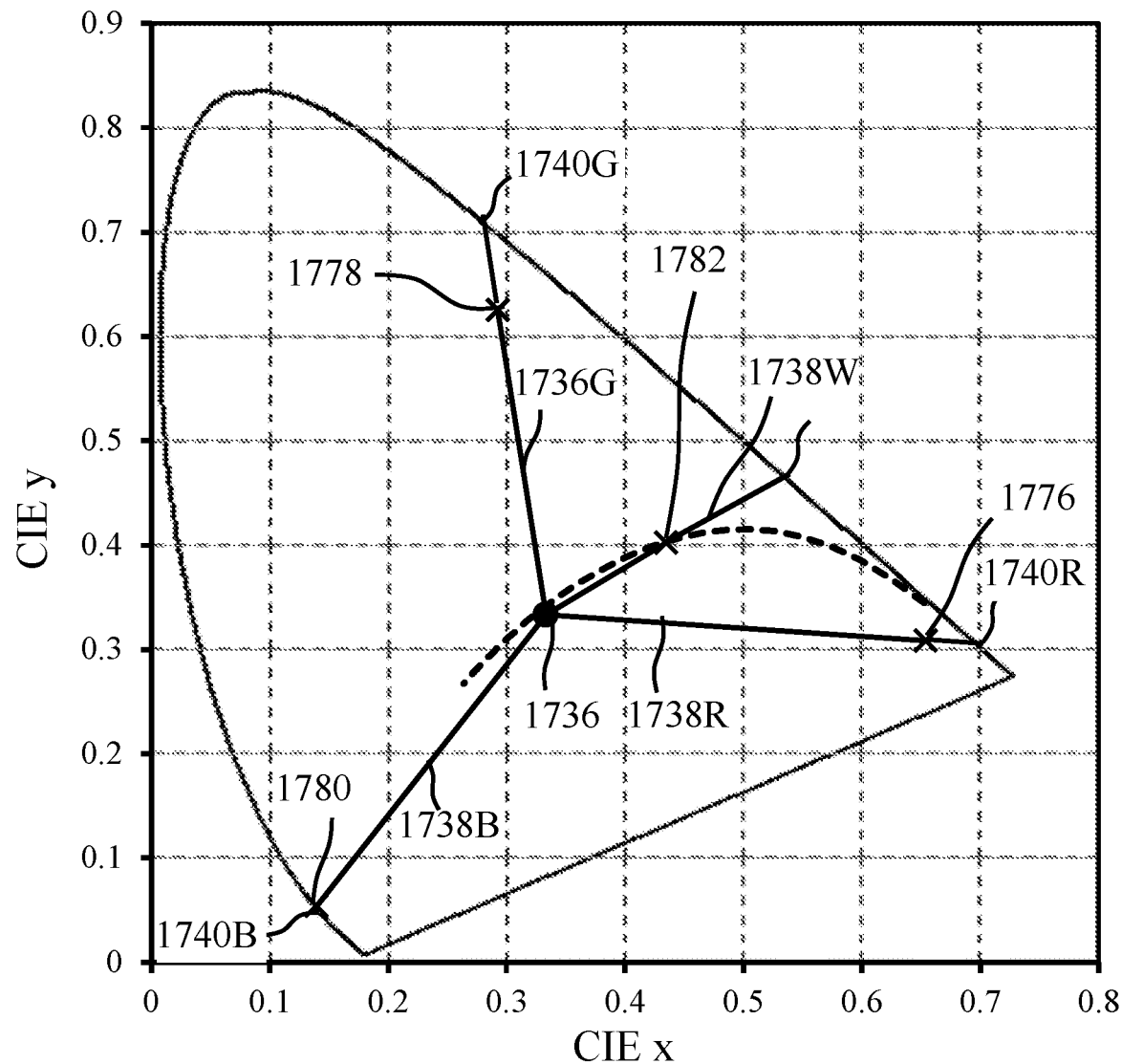

FIG. 17A to 17C are measured optical characteristics for the color-tunable multi-LED packaged lighting device (Pack.1) in which FIG. 17A shows spectra, normalized intensity (a.u.) versus wavelength (nm), for the PC Red LED (thick solid line), the PC Green LED (dashed dotted line), the Blue LED (dotted line) and the White LED (dashed line), FIG. 17B is a CIE 1931 chromaticity diagram illustrating the chromaticity (color point) of light generated by the PC Red LED (square), the PC Green LED (diamond), the Blue LED (triangle), the White LED (cross), ANSI CCT center points (solid circle), color gamut of device (solid line), and black body locus (dashed line), and FIG. 17C is a CIE 1931 chromaticity diagram illustrating calculation of color purity of light generated by the PC Red LED, PC Green LED, the Blue LED, and the White LED.

Referring to FIG. 17A, The PC Red LED shows a low intensity blue peak 1746 at about 449 nm corresponding to a small amount of "blue pass through". The CIE chromaticity diagram of FIG. 17B shows the chromaticity (color point) 1776 (square) of red light generated by the PC Red LED, the chromaticity (color point) 1778 (diamond) of green light generated by the PC Green LED, the chromaticity (color point) 1780 (triangle) of blue light generated by the Blue LED, and the chromaticity (color point) 1782 (cross) of light generated by the White LED. Straight lines 1784 connecting the points 1776, 1778, and 1780 define a triangle that represents the gamut of colors/color temperatures (chromaticity) of light that lighting device Pack.1 can generate—i.e., the device can generate any color/color temperature of light lying on or within the triangle. It is to be noted that lowest CCT of light that the device can generate that lies on the black body locus (dashed line) is about 2240K which corresponds to the point of intersection 1786 (CIE 0.6540, 0.3085) of line 1784 connecting color points 1776 and 1778 with the black body locus.

The CIE chromaticity diagram of FIG. 17C illustrates calculation of color purity of light generated by the PC Red LED, PC Green LED, Blue LED, and White LED. As described herein, color purity, or color saturation, provides a measure of how close the color hue of light of a given color (chromaticity) is to a spectral (monochromatic) color corresponding to light of dominant wavelength $\lambda_d$. As shown in FIG. 17C, the chromaticity (color point) 1776, 1778, 1780 and 1782 for PC Red LED, PC Green, Blue LED and White LED are indicated on the chromaticity diagram by a cross and a "white standard illuminant", CIE (1/3, 1/3), is indicated by dot 1736. A respective straight line 1738R, 1738G, 1738B, 1738W connecting each color point 1776, 1778, 1780 and 1782 to the "white standard illuminant" 1736 is extended so that it intersects the outer curved boundary (perimeter) of the CIE color space. The point of intersection 1740 nearer to the given color point corresponds to the dominant wavelength $\lambda_d$ of the color as the wavelength of the pure spectral (monochromatic) color at that intersection point. The color purity of light of a given chromaticity plotted on the chromaticity diagram is the ratio of the distance from the "white standard illuminant" 1736 to the color point 1776, 1778, 1780 and 1782 to the distance from the "white standard illuminant" 1736 to the point of intersection 1740 (1740R, 1740G, 1740B and 1740W respectively) corresponding to the dominant wavelength $\lambda_d$. The color purity and dominant wavelength values ($\lambda_d$) are tabulated in TABLE 4.

TABLE 5 tabulates forward drive current (IF) for PC Red LED (R), PC Green LED (G), Blue LED (B), and White LED (W) of color-tunable multi-LED packaged lighting device Pack.1 for generating light of nominal general color rendering index CRI Ra 90 for nominal color temperatures (CCT) 2700K, 3000K, 4000K, 5000K, 5700K, and 6500K. TABLE 6 tabulates the measured optical and electrical characteristics for the device Pack.1 when operated to generate light of nominal CRI Ra of 90 for nominal color temperatures (CCT) from 2700K to 6500K. As can be seen from TABLE 5, the CCT of light generated by device Pack.1 is increased by a combination of: (i) increasing the blue light content generated by the blue LED, (ii) increasing the green light content generated by the PC Green LED, (iii) decreasing the red-light content generated by the PC Red LED, and (iv) decreasing white light generated by the White LED. TABLE 6 demonstrates that by selection of the drive currents to the PC Red LED, PC Green LED, Blue LED, and White LED, the color-tunable multi-LED packaged lighting device (Pack.1) can generate white light with a CCT from 2700 K to 6500K with a general color rendering index CRI Ra of 90 and CRI R9 of at least 50 with a luminous efficacy from about 114 to about 124 lm/W. TABLE 5 also includes the measured CCT of light generated by Pack.1.

TABLE 5

Pack.1: Forward drive current $I_F$ for PC Red LED (Red), PC Green LED (Green), Blue LED (Blue), and White LED (White) for generating light of nominal CRI Ra 90 for nominal CCTs from 2700K to 6500K

| CCT (K) | Forward drive current $I_F$ (mA) | | | |
|---|---|---|---|---|
| | Red | Green | Blue | White |
| 2700 | 133 | 43 | 0 | 156 |
| 3000 | 114 | 49 | 8 | 162 |
| 4000 | 71 | 68 | 32 | 156 |

TABLE 5-continued

Pack.1: Forward drive current $I_F$ for PC Red LED (Red), PC Green LED (Green), Blue LED (Blue), and White LED (White) for generating light of nominal CRI Ra 90 for nominal CCTs from 2700K to 6500K

| CCT | Forward drive current $I_F$ (mA) | | | |
|---|---|---|---|---|
| (K) | Red | Green | Blue | White |
| 5000 | 48 | 79 | 54 | 142 |
| 5700 | 41 | 86 | 68 | 139 |
| 6500 | 35 | 91 | 80 | 126 |

TABLE 6

Pack.1: Measured characteristics for generating light of nominal CRI Ra 90 for nominal color temperatures (CCT) from 2700K to 6500K

| CCT | Flux | Power | LE | CIE | | CCT | CRI | | |
|---|---|---|---|---|---|---|---|---|---|
| (K) | (lm) | (W) | (lm/W) | x | Y | (K) | Ra | R9 | Δuv |
| 2700 | 112.2 | 0.99 | 113.7 | 0.4569 | 0.4121 | 2754 | 93.9 | 70.1 | 0.0008 |
| 3000 | 116.0 | 0.99 | 117.6 | 0.4351 | 0.4027 | 3020 | 93.0 | 64.7 | −0.0003 |
| 4000 | 120.7 | 0.97 | 124.1 | 0.3809 | 0.3796 | 4009 | 91.2 | 56.1 | 0.0012 |
| 5000 | 118.8 | 0.96 | 123.9 | 0.3458 | 0.3566 | 4991 | 90.0 | 51.0 | 0.0022 |
| 5700 | 121.6 | 0.99 | 122.6 | 0.3290 | 0.3429 | 5652 | 90.2 | 50.1 | 0.0025 |
| 6500 | 118.2 | 0.99 | 119.6 | 0.3127 | 0.3287 | 6507 | 90.4 | 54.4 | 0.0031 |

Figure 18A:
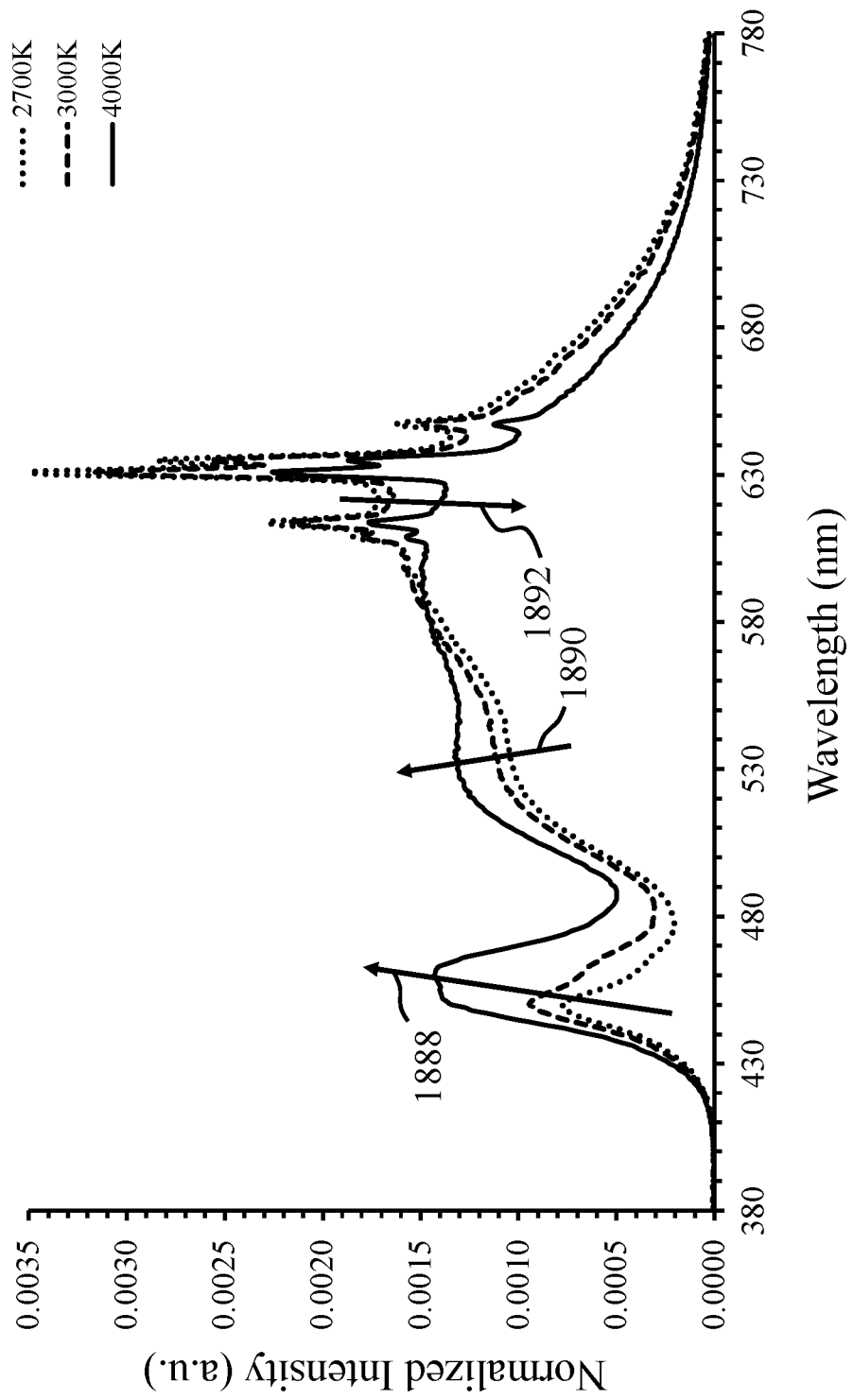
Figure 18B:
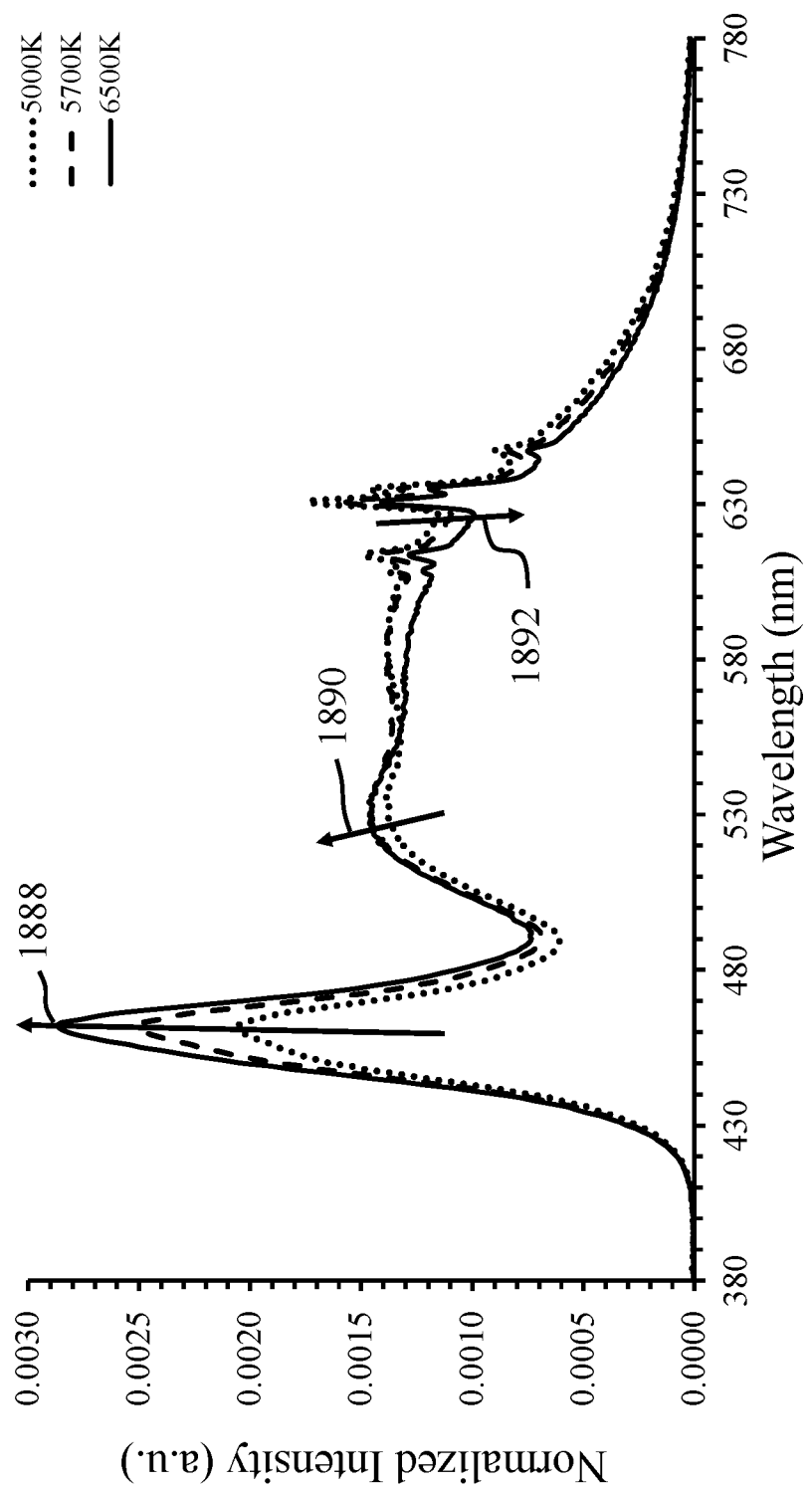
Figure 18C:
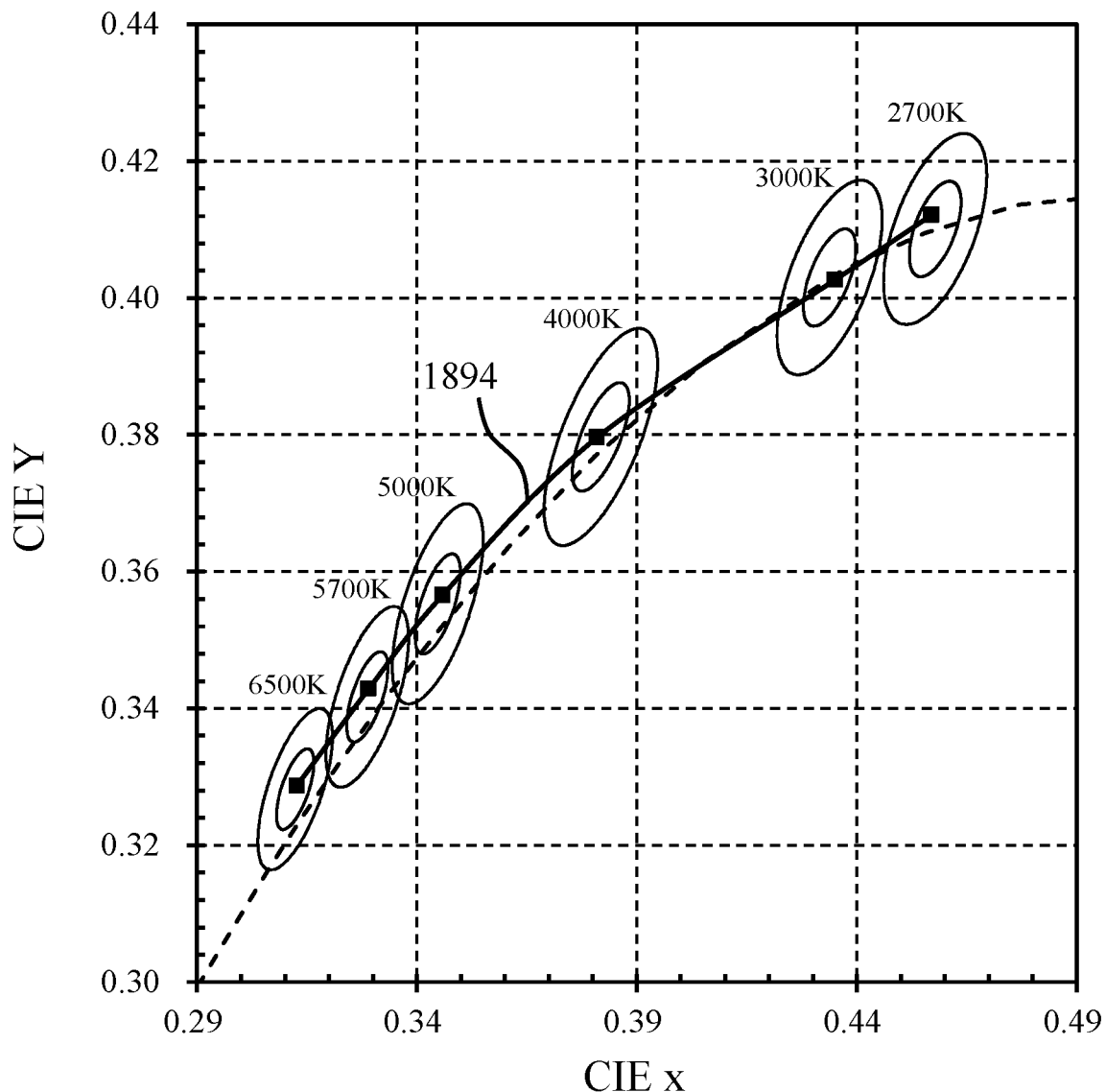

FIG. 18A to 18C are measured emission characteristics for the color-tunable multi-LED packaged lighting device (Pack.1) operable to generate light with a CCT from 2700K to 6500K and a CRI Ra of 90 in which FIG. 18A shows spectra, normalized emission intensity (a.u.) versus wavelength (nm), for a CCT of 2700K (dotted line), a CCT of 3000K (dashed line), and a CCT of 4000K (solid line), FIG. 18B shows spectra, normalized emission intensity (a.u.) versus wavelength (nm), for a CCT of 5000K (dotted line), a CCT of 5700K (dashed line), and a CCT of 6500K (solid line), and FIG. 18C is a CIE 1931 chromaticity diagram illustrating the chromaticity (color point) of light generated by the color-tunable multi-LED packaged lighting device (Pack.1) for nominal CCTs of 2700K, 3000K, 4000K, 5000K, 5700K, and 6500K, light emission locus (solid line) for nominal CCTs from 2700K to 6500K, black body locus (dashed line), and Mac Adam ellipses.

As described herein, the CCT of light generated by device Pack.1 is increased by a combination of: (i) increasing the blue light content generated by the blue LED, (ii) increasing the green light content generated by the PC Green LED, (iii) decreasing the red-light content generated by the PC Red LED, and (iv) decreasing white light generated by the White LED. As can be seen from spectra of FIGS. 18A and 18B, the CCT of light generated by device Pack.1 is increased by a combination of: (i) increasing the blue light content generated by the blue LED as indicated by arrow 1888, (ii) increasing the green light content generated by the PC Green LED as indicated by arrow 1890, and (iii) decreasing the red light content generated by the PC Red LED as indicated by arrow 1892. This being the provision of a synergistic effect.

Referring to FIG. 18C, it is to be noted that light emission locus (solid line 1894)—the chromaticity of light that device Pack.1 is capable of generating—is a curved line that closely follows the black body locus (dashed line). As described herein, Δuv (Delta uv) is a metric that quantifies how close light of a given color temperature is to the black body locus. TABLE 6 tabulates Δuv values for the device Pack.1 operated to generate light with a nominal CRI Ra of 90 for nominal CCTs of 2700K, 3000K, 4000K, 5000K, 5700K, and 6500K. As can be seen from the table, Δuv varies from −0.0003 to 0.0031.

TABLE 7 tabulates forward drive current (IF) for PC Red LED (R), PC Green LED (G), Blue LED (B), and White LED (W) of color-tunable multi-LED packaged lighting device Pack.1 for generating light of general color rendering index CRI Ra 95 for nominal color temperatures (CCT) 2700K, 3000K, 4000K, 5000K, 5700K, and 6500K. TABLE 8 tabulates the measured optical and electrical characteristics for the device Pack.1 when operated to generate light of nominal CRI Ra 95 for nominal color temperatures (CCT) from 2700K to 6500K.

As can be seen from TABLE 7, the CCT of light generated by device Pack.1 is increased by a combination of: (i) increasing the blue light content generated by the blue LED, (ii) increasing the green light content generated by the PC Green LED, (iii) decreasing the red-light content generated by the PC Red LED, and (iv) decreasing white light generated by the White LED. TABLE 8 demonstrates that by selection of the drive current to the PC Red LED, PC Green LED, Blue LED, and White LED, the color-tunable multi-LED packaged lighting device (Pack.1) can generate light with a CCT from 2700 K to 6500K with a general color rendering index CRI Ra of 95 and CRI R9 of at least 80 with a luminous efficacy from about 110 to about 115 lm/W.

TABLE 7

Pack.1: Forward drive current $I_F$ for PC Red LED (Red), PC Green LED (Green), Blue LED (Blue), and White LED (White) for generating light of nominal CRI Ra 95 for nominal CCTs from 2700K to 6500K

| CCT | Forward drive current $I_F$ (mA) | | | |
|---|---|---|---|---|
| (K) | Red | Green | Blue | White |
| 2700 | 143 | 48 | 0 | 144 |
| 3000 | 130 | 58 | 11 | 136 |
| 4000 | 100 | 78 | 34 | 120 |
| 5000 | 78 | 88 | 54 | 106 |
| 5700 | 70 | 92 | 65 | 101 |
| 6500 | 60 | 95 | 78 | 97 |

TABLE 8

Pack.1: Measured characteristics for generating light of nominal CRI Ra 95 for nominal color temperatures (CCT) from 2700K to 6500K

| CCT | Flux | Power | LE | CIE | | CCT | CRI | | |
|---|---|---|---|---|---|---|---|---|---|
| (K) | (lm) | (W) | (lm/W) | x | Y | (K) | Ra | R9 | Δuv |
| 2700 | 109.8 | 0.99 | 110.7 | 0.4595 | 0.4140 | 2731 | 95.6 | 79.8 | 0.0013 |
| 3000 | 110.0 | 0.98 | 111.7 | 0.4334 | 0.4024 | 3047 | 96.7 | 86.6 | −0.0002 |
| 4000 | 112.4 | 0.98 | 114.7 | 0.3824 | 0.3805 | 3975 | 97.3 | 92.8 | 0.0012 |
| 5000 | 110.2 | 0.98 | 113.9 | 0.3459 | 0.3553 | 4983 | 96.0 | 94.2 | 0.0015 |
| 5700 | 110.3 | 0.97 | 113.5 | 0.3299 | 0.3434 | 5612 | 96.0 | 92.9 | 0.0023 |
| 6500 | 109.7 | 0.98 | 112.0 | 0.3133 | 0.3275 | 6483 | 95.0 | 93.3 | 0.0021 |

TABLE 8 tabulates Δuv values for the device Pack.1 operated to generate light with a nominal CRI Ra of 95 for nominal CCTs of 2700K, 3000K, 4000K, 5000K, 5700K, and 6500K. As can be seen from the table, Δuv varies from −0.0002 to 0.0023.

It will be evident from the foregoing that color-tunable multi-LED lighting devices according to embodiments of the invention can generate white light of different CCTs and different CRI Ra (e.g., CRI Ra 90 and CRI Ra 95) by changing the forward drive current to the four LEDs (i.e., Red, Green, Blue, and White). Moreover, devices according to the invention have a high luminous efficacy compared with current color-tunable multi-LED packaged lighting devices. This combination of features represents a considerable breakthrough in lighting industry. and significantly reduces the number of SKUs (Stock Keeping Units) of LED devices needed for different lighting applications.

A color-tunable multi-LED packaged lighting device, denoted Pack.2, comprises the device of FIGS. 13A to 13C and comprises a 3838 four cavity package containing a PC Red LED in a first cavity, a PC Green LED in the second cavity, a blue LED in the third cavity, and a PC white LED in the fourth cavity. Details of the PC Red LED, PC Green LED, blue LED, and PC white LED are the same as that of color-tunable multi-LED packaged lighting device Pack.1. In contrast to Pack.1, each InGaN violet to blue LED chip comprises a multi-junction LED chip comprising six junctions, that is each LED chip comprises six LEDs connected in series. The LED chip has a nominal power of 0.5 W and a forward drive voltage of about 18V.

TABLE 9 tabulates measured optical characteristics of the PC Red LED (R), PC Green LED (G), Blue LED (B), and White LED (W) of lighting device Pack.2. As will be noted from TABLE 9, the PC Red LED generates red light with a dominant wavelength ($\lambda_d$) of 619 nm and a flux of 14.9 lm (LE=33.1 lm/W), the PC Green LED generates green light with a dominant wavelength of 547 nm and a flux of 85.8 lm (LE=190.7 lm/W), and the blue LED generates blue light with a dominant wavelength of 456 nm and a flux of 7.6 lm (LE=16.7 lm/W). The white LED generates warm white (WW) light with a nominal CCT of 3000K (actual CCT 2990K, Δuv=0.0015), a General Color Rendering Index (CRI Ra) of about 70, and a flux of 66.0 lm (LE=143.8 lm/W).

TABLE 9

Pack.2: Measured optical characteristics of PC Red LED (R), PC Green LED (G), Blue LED (B), and White LED (W)
Measurement: 0.5 W and $I_F$ = 25 mA

| LED | $\lambda_d$ (nm) | CIE | | Flux (lm) | LE (lm/W) |
|---|---|---|---|---|---|
| | | x | y | | |
| R | 619 | 0.6598 | 0.3133 | 14.9 | 33.1 |
| G | 547 | 0.2890 | 0.6331 | 85.8 | 190.7 |
| B | 456 | 0.1518 | 0.0279 | 7.6 | 16.7 |
| W | 585 | 0.4399 | 0.4089 | 66.0 | 143.8 |

Figure 19:
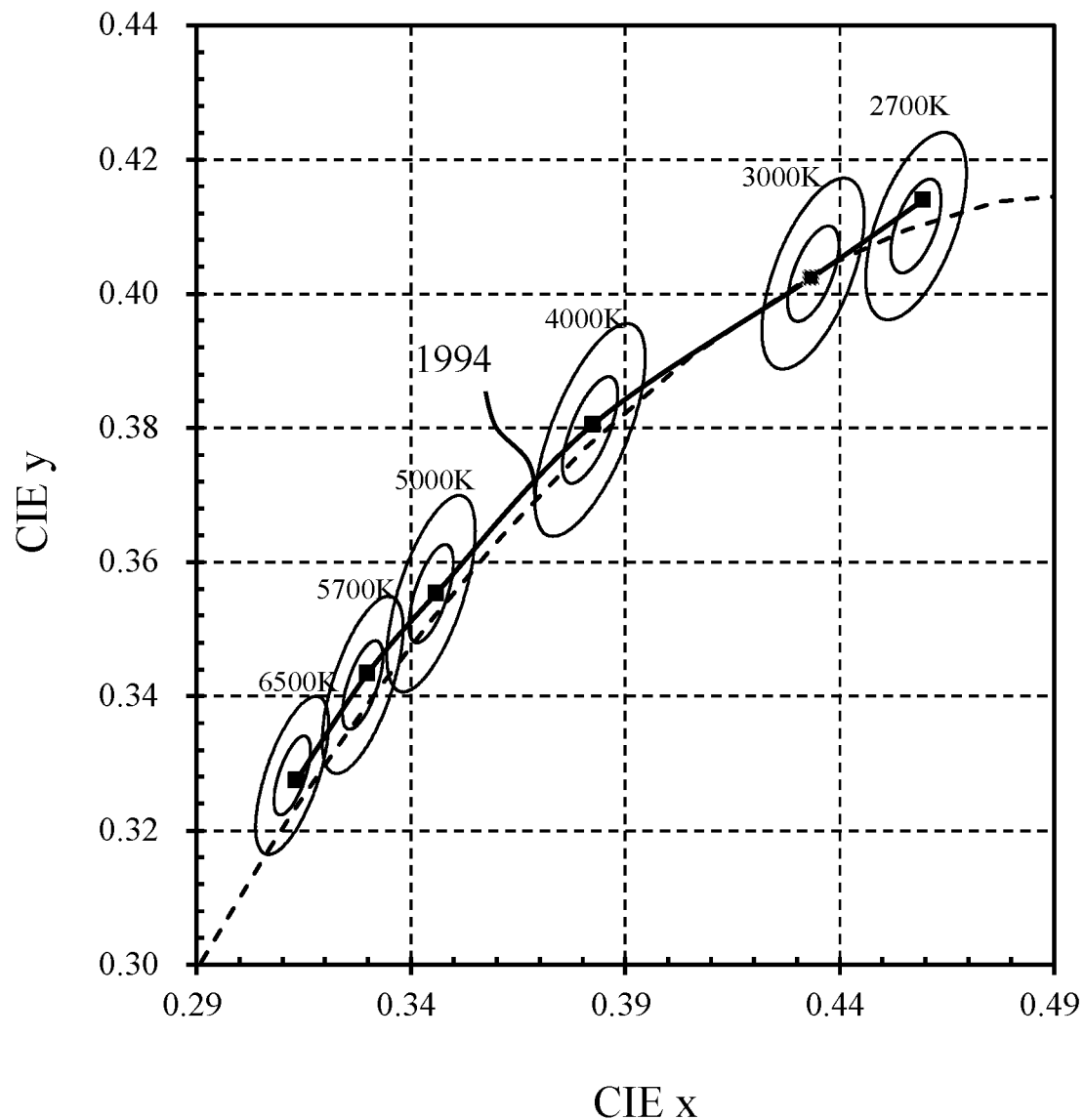

FIG. 19 is a CIE 1931 chromaticity diagram illustrating the chromaticity (color point) of light generated by the PC Red LED (square), the PC Green LED (diamond), the Blue LED (triangle), the White LED (cross), ANSI CCT center points (solid circle), color gamut of device (solid line), and black body locus (dashed line).

The CIE chromaticity diagram of FIG. 19 shows the chromaticity (color point) 1976 (square) of red light generated by the PC Red LED, the chromaticity (color point) 1978 (diamond) of green light generated by the PC Green LED, the chromaticity (color point) 1980 (triangle) of blue light generated by the Blue LED, and the chromaticity (color point) 1982 (cross) of light generated by the White LED. Straight lines 1984 connecting the points 1976, 1978, and 1980 define a triangle that represents the gamut of colors/color temperatures (chromaticity) of light that lighting device Pack.2 can generate—i.e., the device can generate any color/color temperature of light lying on or within the triangle. It is to be noted that lowest CCT of light that the device can generate that lies on the black body locus (dashed line) is about 1762K which corresponds to the point of intersection 1986 (CIE 0.5530, 0.4060) of line 1984 connecting color points 1976 and 1978 with the black body locus.

TABLE 10 tabulates forward drive current (IF) for PC Red LED (R), PC Green LED (G), Blue LED (B), and White LED (W) of lighting device Pack.2 for generating light of nominal general color rendering index CRI Ra 90 for nominal color temperatures (CCT) 2700K, 3000K, 3500K, 4000K, 5000K, 5700K, and 6500K. TABLE 11 tabulates the measured optical and electrical characteristics for the device Pack.2 when operated to generate light of nominal CRI Ra of 90 for nominal color temperatures (CCT) from 2700K to 6500K. As can be seen from TABLE 10, the CCT of light generated by device Pack.2 is increased by a combination of: (i) increasing the blue light content generated by the blue LED, (ii) increasing the green light content generated by the PC Green LED, (iii) decreasing the red-light content generated by the PC Red LED, and (iv) decreasing white light generated by the White LED. TABLE 11 demonstrates that by selection of the drive voltages to the PC Red LED, PC Green LED, Blue LED, and White LED, the color-tunable multi-LED packaged lighting device (Pack.2) can generate white light with a CCT from 2700 K to 6500K with a general color rendering index CRI Ra of 90 and CRI R9 of at least 50 with a luminous efficacy from about 124 lm/W to about 145 lm/W. TABLE 11 also includes the measured CCT of light generated by Pack.2.

TABLE 10

Pack.2: Forward drive current $I_F$ for PC Red LED (Red), PC Green LED (Green), Blue LED (Blue), and White LED (White) for generating light of nominal CRI Ra 90 for nominal CCTs from 2700K to 6500K
Measurement: 0.5 W and $V_F \approx 18$ V

| CCT | Forward drive current $I_F$ (mA) | | | |
|---|---|---|---|---|
| (K) | Red | Green | Blue | White |
| 2700 | 12.5 | 2.8 | 0.16 | 14.2 |
| 3000 | 11.1 | 3.7 | 0.70 | 14.2 |
| 3500 | 8.9 | 4.4 | 1.30 | 13.2 |
| 4000 | 7.9 | 5.2 | 1.95 | 11.6 |
| 5000 | 7.0 | 6.8 | 3.25 | 9.6 |
| 5700 | 6.1 | 7.5 | 4.00 | 9.0 |
| 6500 | 6.0 | 8.1 | 4.80 | 7.7 |

TABLE 11

Pack.2: Measured characteristics for generating light of nominal CRI Ra 90 for nominal color temperatures (CCT) from 2700K to 6500K

| CCT | Flux | Power | LE | CIE | | CCT | CRI | | |
|---|---|---|---|---|---|---|---|---|---|
| (K) | (lm) | (W) | (lm/W) | x | Y | (K) | Ra | R9 | Δuv |
| 2700 | 63.0 | 0.507 | 124.2 | 0.4572 | 0.4136 | 2761 | 90.8 | 55.4 | 0.0013 |
| 3000 | 65.7 | 0.506 | 129.8 | 0.4329 | 0.4052 | 3078 | 90.7 | 56.5 | 0.0010 |
| 3500 | 64.7 | 0.469 | 138.0 | 0.4079 | 0.3941 | 3471 | 90.6 | 58.4 | 0.0009 |
| 4000 | 63.0 | 0.446 | 141.2 | 0.3841 | 0.3805 | 3930 | 91.0 | 64.1 | 0.0007 |
| 5000 | 64.0 | 0.443 | 144.6 | 0.3466 | 0.3577 | 4965 | 90.9 | 71.4 | 0.0024 |
| 5700 | 64.3 | 0.443 | 145.2 | 0.3294 | 0.3439 | 5633 | 90.1 | 71.5 | 0.0028 |
| 6500 | 63.3 | 0.441 | 143.6 | 0.3130 | 0.3289 | 6489 | 90.5 | 80.7 | 0.0030 |

As described herein, Δuv (Delta uv) is a metric that quantifies how close light of a given color temperature is to the black body locus. TABLE 11 tabulates Δuv values for the device Pack.2 operated to generate light with a nominal CRI Ra of 90 for nominal CCTs of 2700K, 3000K, 3500K, 4000K, 5000K, 5700K, and 6500K. As can be seen from the table, Δuv varies from 0.0007 to 0.003.

Multi-LED Packages

Figure 20A:
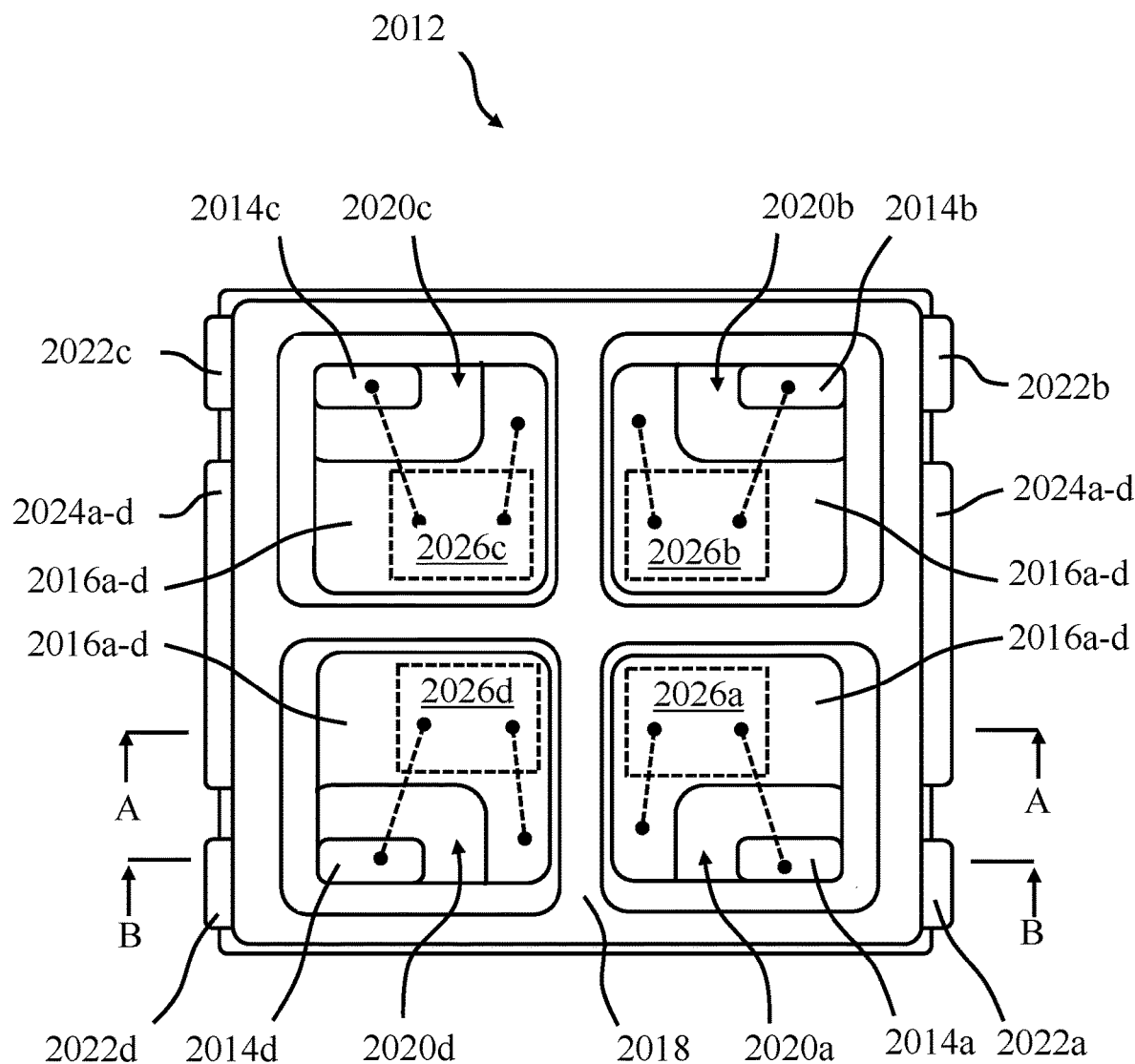
Figure 20B:
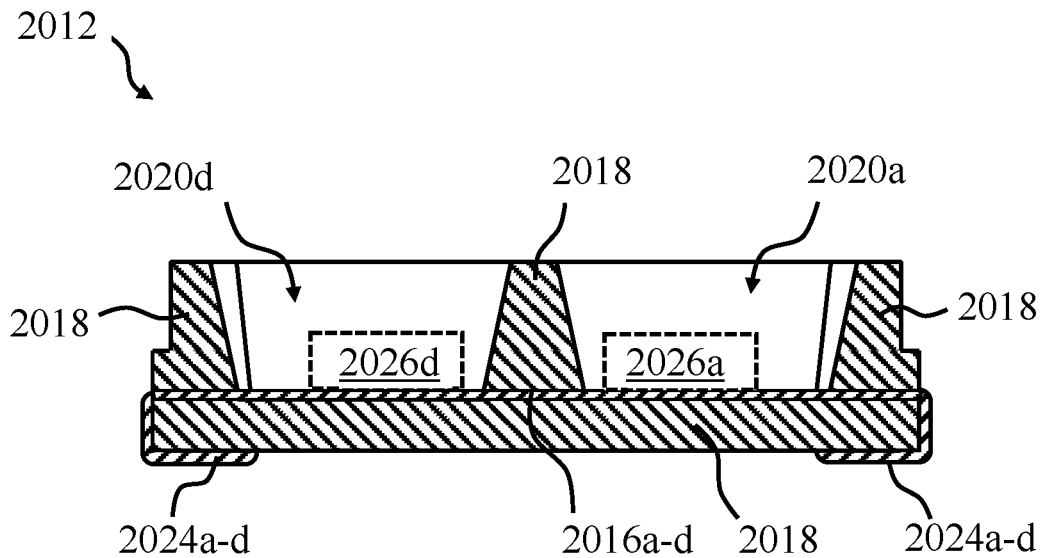
Figure 20C:
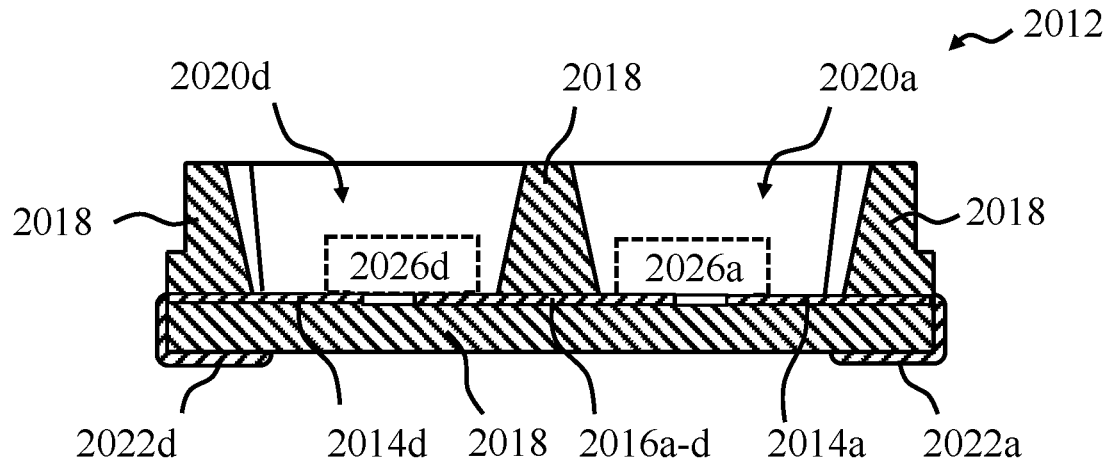
Figure 20D:
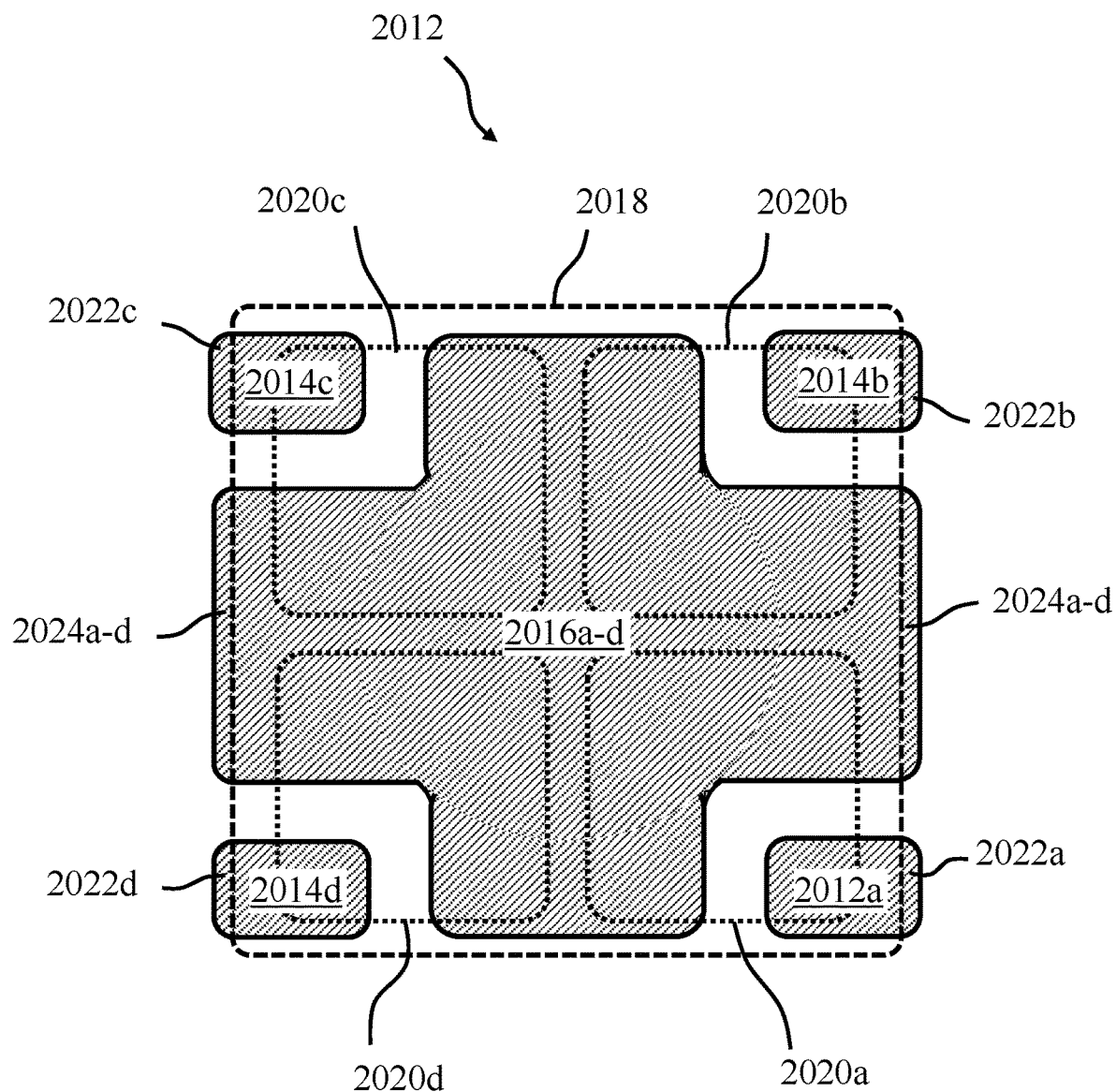

FIGS. 20A to 20D are schematic representation of a multi-LED, multi-cavity, package 2012 in accordance with an embodiment of the invention comprising a common cathode terminal arrangement in which FIG. 20A shows a top view, FIG. 20B shows a sectional side view through A-A, FIG. 20C shows a sectional side view through B-B, and FIG. 20D is a top view of the lead frame of the multi-LED package.

As shown in FIGS. 20A to 20D, the multi-LED package 2012 comprises a lead frame 2014a-2014d, 2016a-d and a housing 2018 molded onto the lead frame. The housing 2018 comprises a first cavity (cup) 2020a for receiving a respective first LED chip 2026a, a second cavity (cup) 2020b for receiving a respective second LED chip 2026b, a third cavity (cup) 2020c for receiving a respective third LED chip 2026c, and a fourth cavity 2020d for receiving a respective fourth LED chip 2026d. The LED chips 2026a-2026d are indicated in FIG. 20A-20C by a dashed rectangle and bond wires connecting the LED chips to the lead frame are indicated by dashed lines.

Referring to FIG. 20D, the various regions of the lead frame 2014a-2014d, 2016a-d are indicated by cross-hatching and the relative position of the housing 2018 and the cavities 2020a-2020d are respectively indicated by dashed and dotted lines. The lead frame comprises a central cross-shaped cathode region 2016a-d and four rectangular anode regions 2014a-2014d located at the empty corners of the cross-shaped region 2016a-d. As can be seen from FIG. 20D, each cavity 2020a-2220d comprises on its floor, a respective L-shaped region of the cross-shaped cathode region 2016a-d which constitutes a common cathode connection to each cavity. The L-shaped cathode region on the floor of each cavity, in addition to providing a common (shared) cathode connection, provides a thermally conductive mounting pad for the LED chip, thereby improving thermal dissipation from the LED chips. As can be seen from FIG. 20D, each cavity 2020a-2020d comprises on its floor, a respective rectangular anode region 2014a-2014d which constitutes an anode connection to the cavity. As illustrated in FIGS. 20A-20D, each respective anode region of the lead frame 2014a-2014d extends beyond an outer edge of the housing 2018 and provides a respective anode electrical terminal 2022a-2022d for each cavity 2020a-2020d. Similarly, the cathode region of the lead frame 2016a-d extends beyond opposing edges of the housing and provides a common cathode electrical terminal 2024a-d on opposite edges of the housing.

As described herein, in embodiments, the multi-LED (e.g., four-LED) package may comprise a single cathode electrical terminal 2024a-d that is common to each LED chip and a respective anode electrical terminal 2022a-2022d for each LED chip. In other embodiments of the invention, the multi-LED package may comprise a respective pair of anode and cathode electrical terminals for each LED. Such an arrangement can be beneficial when using multiple multi-LED packages as it allows the LED chips to be connected in series.

Figure 21A:
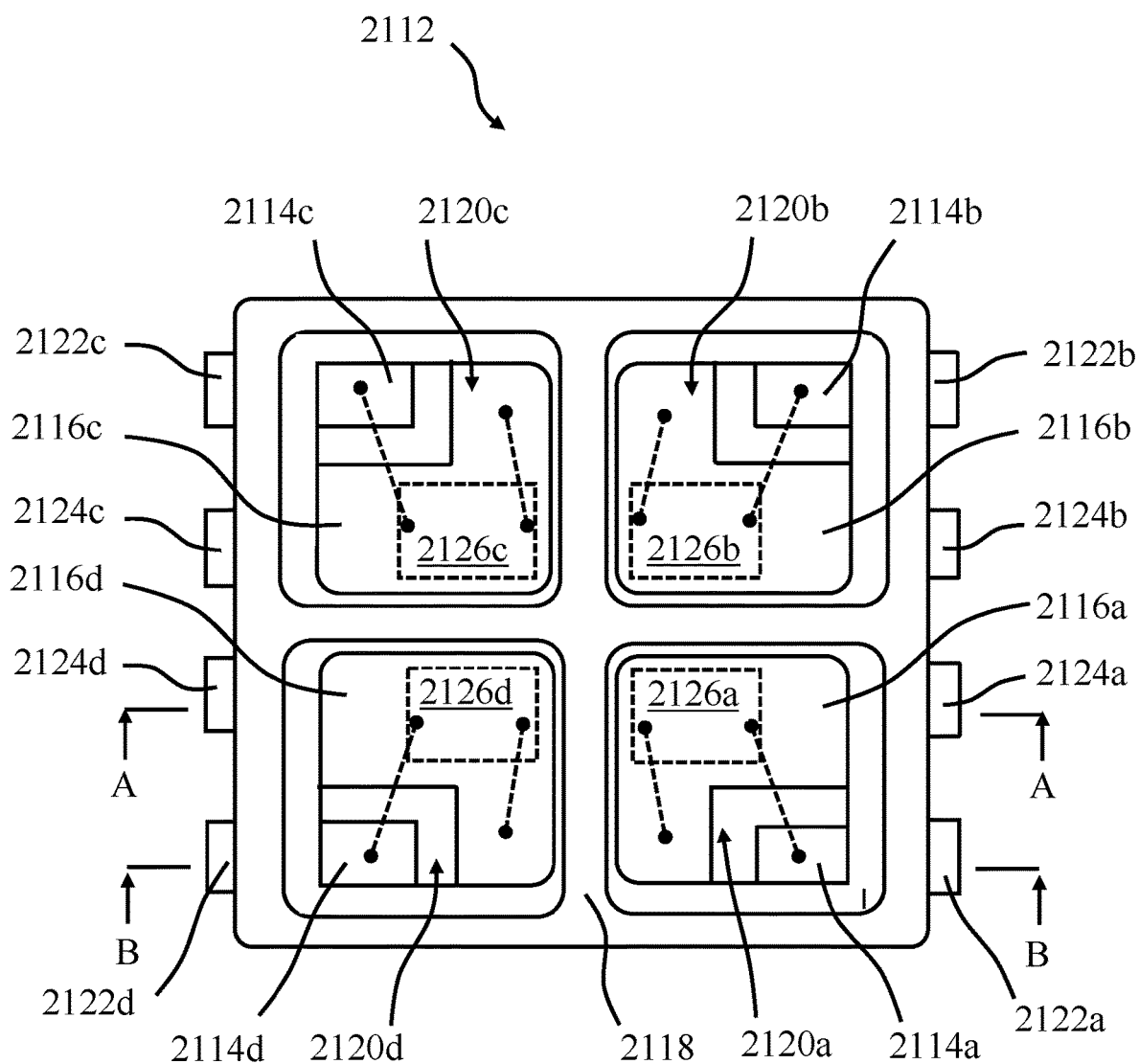
Figure 21B:
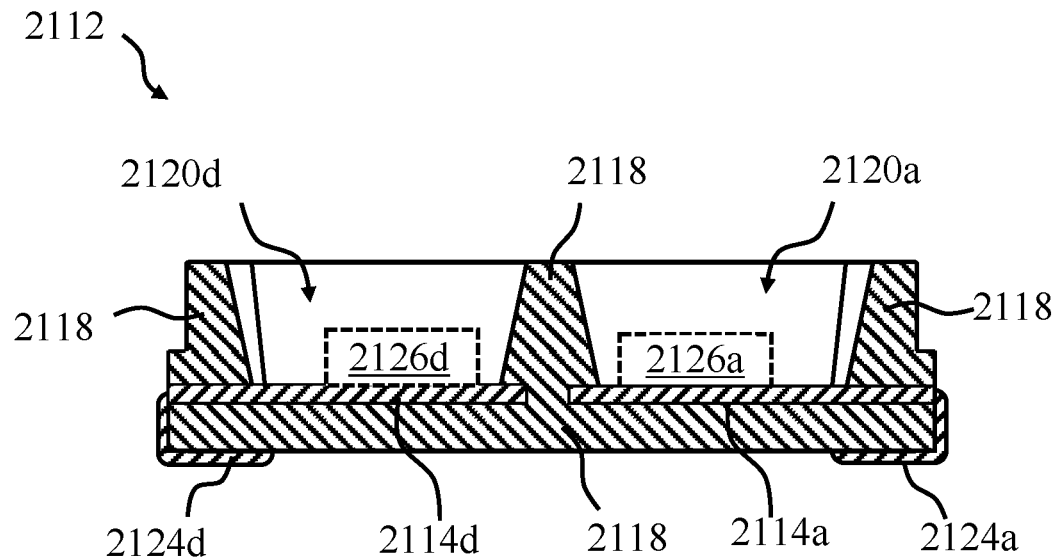
Figure 21C:
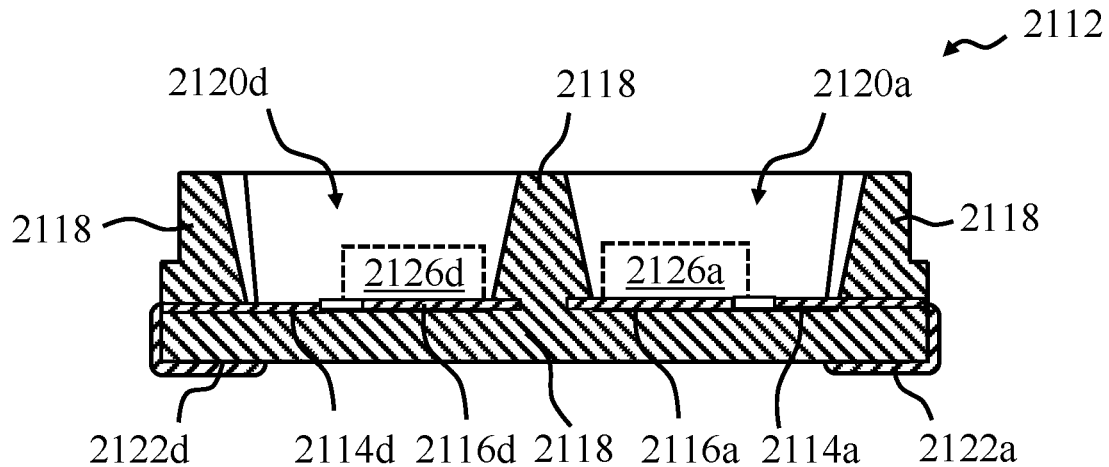
Figure 21D:
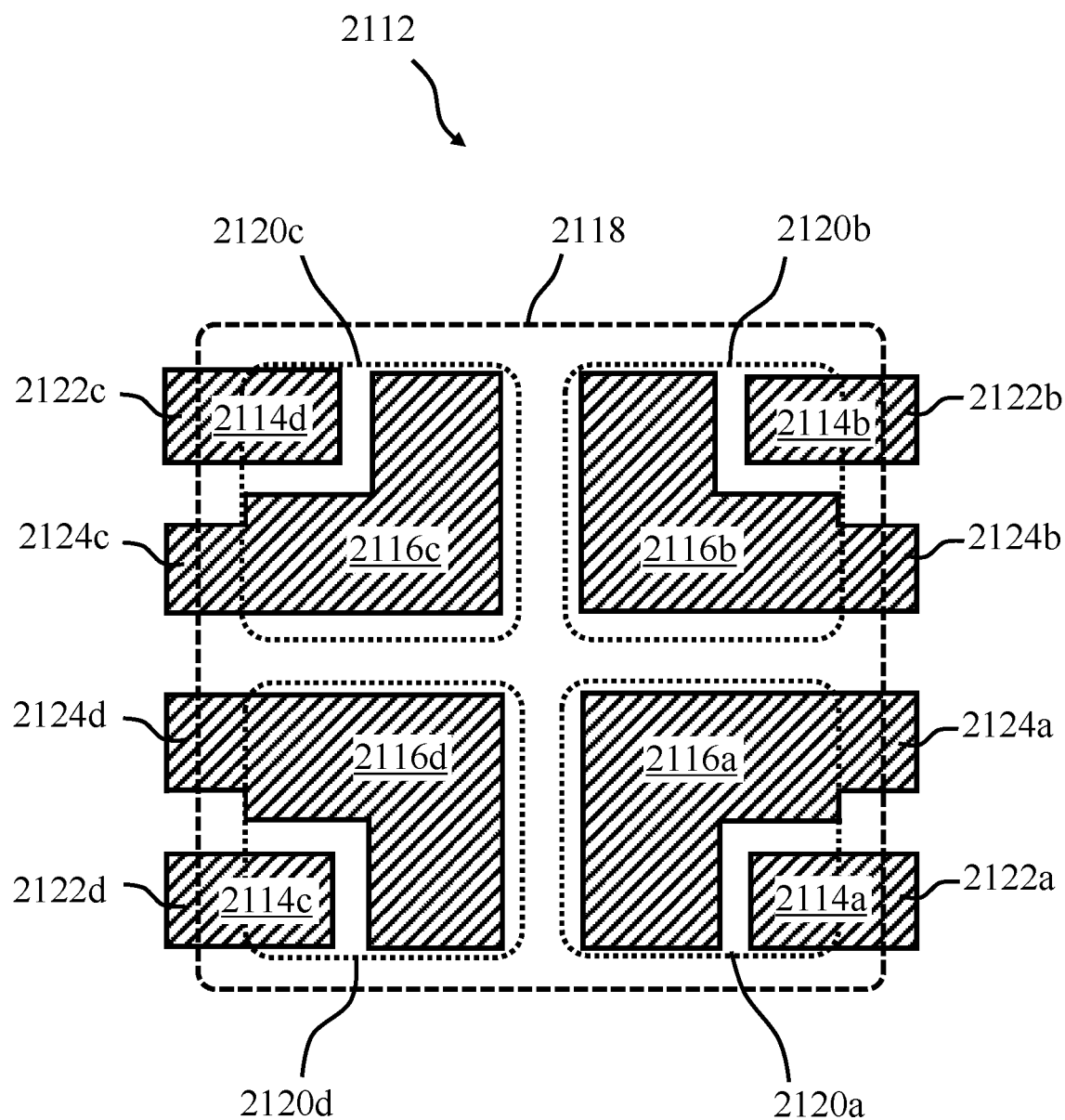

FIGS. 21A to 21D are schematic representations of a multi-LED, four-LED, package in accordance with an embodiment of the invention comprising a respective pair of anode and cathode electrical terminals for each LED in which FIG. 21A shows a top view, FIG. 21B shows a sectional side view through A-A, FIG. 21C shows a sectional side view through B-B, and FIG. 21D is a plan view of the lead frame of the multi-LED package.

As shown in FIGS. 21A to 21D, the multi-LED package 2112 comprises a lead frame 2114a-2114d, 2116a-2116d and a housing 2118 molded onto the lead frame. The housing 2118 comprises a first cavity 2120a for receiving a respective first LED chip 2126a, a second cavity 2120b for receiving a respective second LED chip 2126b, a third cavity 2120c for receiving a respective third LED chip 2126c, and a fourth cavity 2120d for receiving a respective fourth LED chip 2126d. The LED chips 2126a-2126d are indicated in FIG. 21A to 21C by a dashed rectangle and bond wires connecting the LED chips to the lead frame are indicated by dashed lines.

Referring to FIG. 21D, the various regions of the lead frame 2114a-2114d, 2116a-2116d are indicated by cross-hatching and the relative position of the housing 2118 and the cavities 2120a-2120d are respectively indicated by dashed and dotted lines. The lead frame comprises four L-shaped cathode region 2116a-2116d arranged as a cross and four rectangular anode regions 2114a-2114d with a respective anode region located at the empty corners of a respective L-shaped region. As can be seen from FIG. 21D, each cavity 2120a-2120d comprises on its floor, a respective L-shaped cathode region 2116a-2116d and a respective rectangular shaped anode region 2114a-2114d. The L-shaped cathode region on the floor of each cavity, in addition to providing a cathode connection, provides a thermally conductive mounting pad for the LED chip, thereby improving thermal dissipation from the LED chips. As can be seen from FIG. 21D, each cavity 2120a-2120d comprises on its floor, a respective rectangular anode region 2114a-2114d which constitutes an anode connection to the cavity. As illustrated in FIGS. 21A to 21D, each anode region of the lead frame 2114a-2114d extends beyond an outer edge of the housing 2118 and provides a respective anode electrical terminal 2122a-2122d for each cavity 2120a-2120d. Similarly, each cathode region of the lead frame 2116-2116d extends beyond the outer edge of the housing 2118 and provides a respective cathode electrical terminal 2124a-2124d on the same edge of the housing as the anode electrical terminal.

Figure 22A:
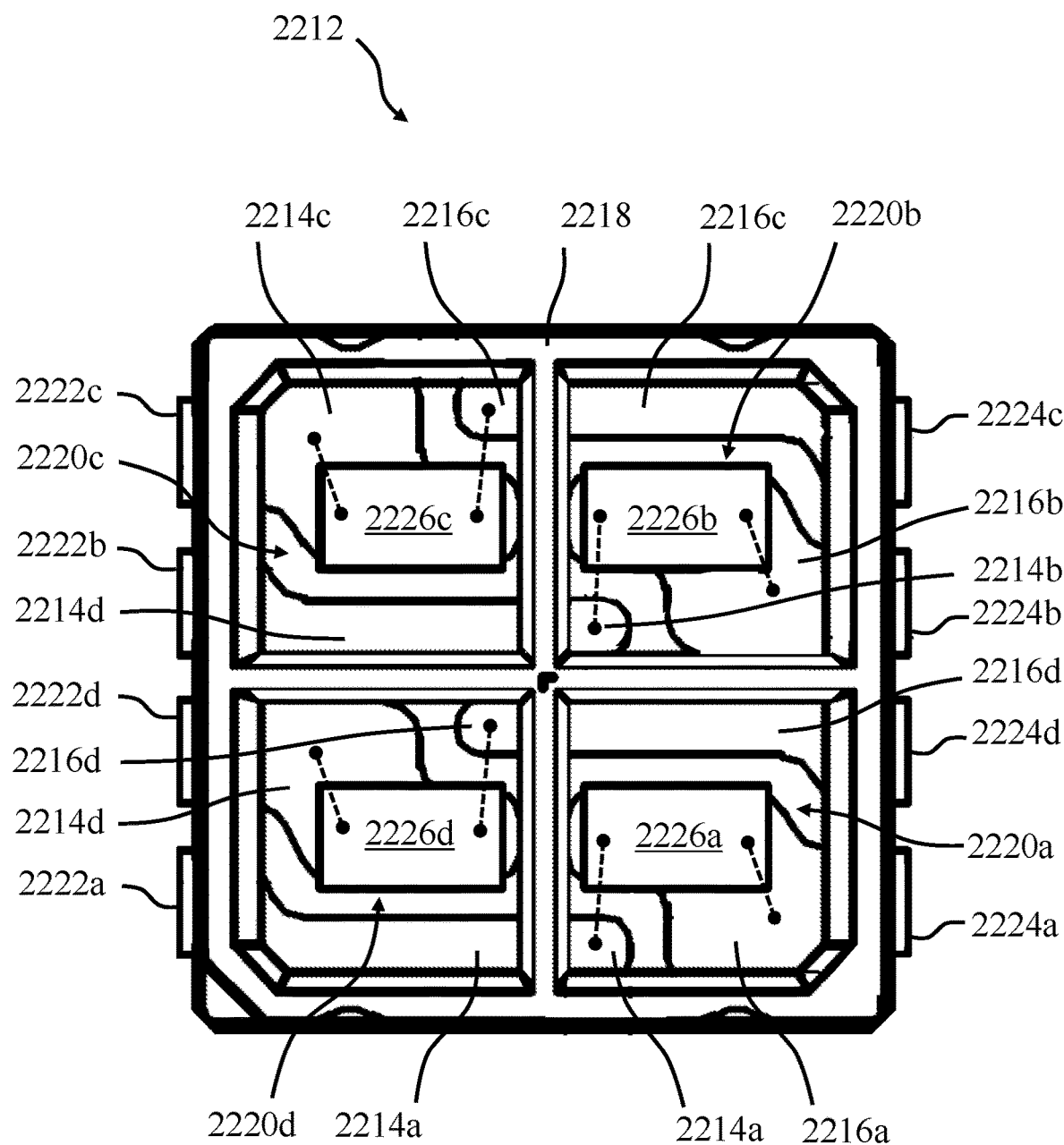
Figure 22B:
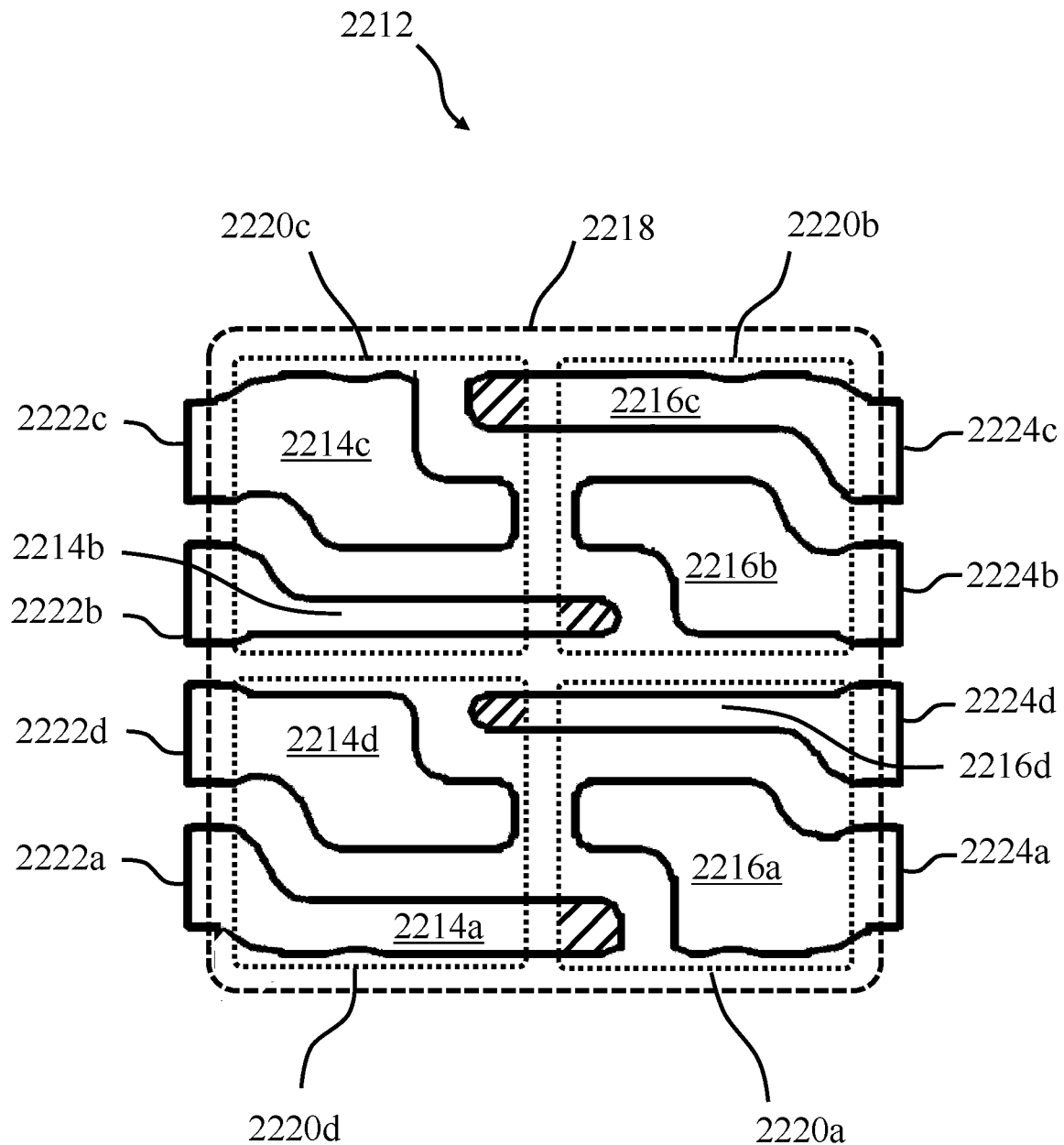

FIGS. 22A and 22B are schematic representations of a multi-LED (Four-LED) package in accordance with another embodiment of the invention in which FIG. 22A shows a top view, and FIG. 22B is top view of the lead frame of the multi-LED package 2212. This embodiment is similar to the multi-LED package of FIGS. 21A-21D, except that the lead frame regions 2214a-2214d and 2216a-2216d are configured such that each anode terminal 2222a-2222d is aligned with and located on an opposing edge of the housing to its respective cathode terminal 2224a-2224d. Such a packaging arrangement can be advantageous in linear lighting arrangements utilizing a plurality of multi-LED packages in which it is preferred to serially connect LEDs of each cavity.

As shown in FIGS. 22A and 22B the multi-LED package 2212 comprises a lead frame 2214a-2214d, 2216a-2216d and a housing 2218 molded onto the lead frame. The housing 2218 comprises a first cavity 2220a for receiving a respective first LED chip 2226a, a second cavity 2220b for receiving a respective second LED chip 2226b, a third cavity 2220c for receiving a respective third LED chip 2226c, and a fourth cavity 2220d for receiving a respective fourth LED chip 2226d. The LED chips 2226a-2226d are indicated in FIGS. 22A and 22B by a dashed rectangle and bond wires connecting the LED chips to the lead frame are indicated by dashed lines. Referring to FIG. 22B, the various regions of the lead frame 2214a-2214d, 2216a-2216d are shown and the relative position of the housing 2218 and the cavities 2220a-2220d are respectively indicated by dashed and dotted lines. The lead frame comprises four cathode regions 2216a-2216d and four anode regions 2214a-2214d. For the first and second cavities 2220a and 2220b, the cathode regions 2216a and 2216b are zigzag shaped and the anode regions 2214a and 2214b are elongate in form. The first and second cavities 2220a and 2220b comprise on their floor, a respective zigzag shaped cathode region 2216a and 2216b and a respective square shaped end portion (indicated by cross hatching) of the elongate anode region 2214a and 2214b. In this embodiment, the elongate anode region 2214a extends from the first cavity 2220a through the fourth cavity 2220d to the opposite edge of the package to that of the corresponding cathode region 2216a. Similarly, the elongate anode region 2214b extends from the second cavity 2220b through the third cavity 2220c to the opposite edge of the package to that of the corresponding cathode region 2216b. In this way, an anode region (for instance, elongate) extends from one cavity to an adjacent cavity. It may be that an anode region is able to extend between at least two, three or more cavities. For the third and fourth cavities 2220c and 2220d, the cathode regions 2216c and 2216d are elongate in form and the anode regions 2214c and 2214d are zigzag shaped. The third and fourth cavities 2220c and 2220d comprise on their floor, a respective square shaped end portion (indicated by cross hatching) of the elongate cathode region 2216c and 2216d. In this embodiment, the elongate cathode region 2216c extends from the third cavity 2220c through the second cavity 2220b to the opposite edge of the package to that of the corresponding anode region 2212c. Similarly, in this embodiment, the elongate cathode region 2216d extends from the fourth cavity 2220d through the first cavity 2220a to the opposite edge of the package to that of the corresponding anode region 2222a. In this way, a cathode region (for instance, elongate) is able to extend from one cavity to an adjacent cavity. The zigzag shaped region on the floor of each cavity, in addition to providing an electrical connection, provides a thermally conductive mounting pad for the LED chip, thereby improving thermal dissipation from the LED chips. As illustrated in FIGS. 22A and 22B, each anode region of the lead frame extends beyond an outer edge of the housing 2218 and provides a respective anode electrical terminal 2222a-2222d for each cavity 2220a-2220d. As illustrated, each of the anode terminals 2222a-2222d is located along the lefthand edge of the package. Similarly, each cathode region of the lead frame extends beyond the outer edge of the housing and provides a respective cathode electrical terminal 2224a-2224d on the opposite edge of the housing to that of the anode electrical terminal. As illustrated, each of the cathode terminals 2224a-2224d is located along the righthand edge of the package. In at least this embodiment, for example, the anode and cathode terminals are aligned (or in the same linear path, for instance).

LIST OF REFERENCE NUMERALS

Figure 1B:
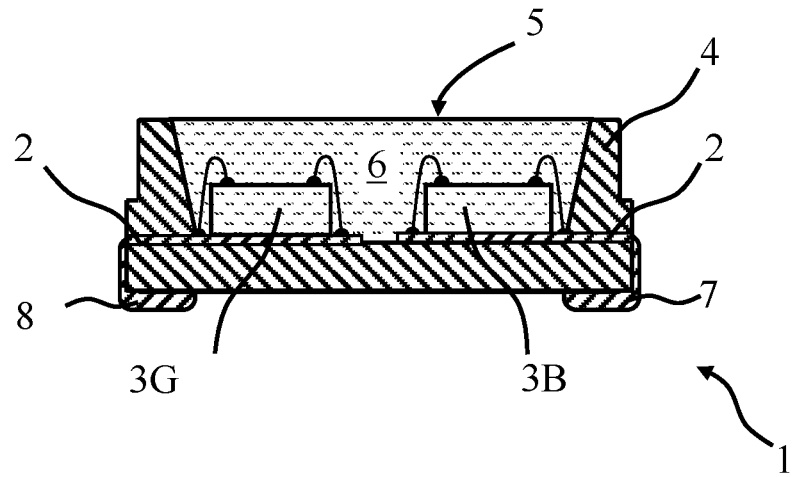

FIG. 1:
1 Multi-LED package
2 Lead frame
3 Direct-Emitting LED chip
3R Direct-Emitting Red LED chip
3G Direct-Emitting Green LED chip
3B Direct-Emitting Blue LED chip
4 Housing
5 Cavity, cup, recess
6 Light-transmissive encapsulant
7 Anode electrical terminal
7R Anode electrical terminal Red LED 7G Anode electrical terminal Green LED
7B Anode electrical terminal Blue LED
8 Cathode electrical terminal
8R Cathode electrical terminal Red LED
8G Cathode electrical terminal Green LED
8B Cathode electrical terminal Blue LED
FIGS. 2 to 22 (#=Figure Number)
10 Red-light emitting device
12 Package
14 Anode lead frame
14a Anode lead frame—first cavity
14b Anode lead frame—second cavity
14c Anode lead frame—third cavity
14d Anode lead frame—fourth cavity
14e Common cathode lead frame—cavities 1-4
16 Cathode lead frame
16a-d Cathode lead frame—common to cavities 1-4
16a Cathode lead frame—first cavity
16b Cathode lead frame—second cavity
16c Cathode lead frame—third cavity
16d Cathode lead frame—fourth cavity
18 Housing
18A Housing base portion
18B Housing side wall portion
20 Cavity, cup, recess
20a First cavity (First recess)
20b Second cavity (Second recess)
20c Third cavity (Third Recess)
20d Fourth cavity (Fourth Recess)
22 Anode electrical terminal
22a Anode electrical terminal first cavity
22b Anode electrical terminal second cavity
22c Anode electrical terminal third cavity
22d Anode electrical terminal fourth cavity
24 Cathode electrical terminal
24a Cathode electrical terminal first cavity
24b Cathode electrical terminal second cavity
24c Cathode electrical terminal third cavity
24d Cathode electrical terminal fourth cavity
26 Violet to blue LED chip
28 Bond wire
30 Red photoluminescence layer
30A First red photoluminescence layer
30B Second red photoluminescence layer
32 Light reflective layer
34 Chromaticity (color point)
36 White standard illuminant CIE (1/3, 1/3)
38 Line
40 Dominant wavelength $\lambda_d$
42 Complimentary wavelength $\lambda_c$
44 Blue peak—Com 2—Single-Layer PC Red LED (KSF only)
45 Red peak—Com 2—Single-Layer PC Red LED (KSF only)
46 Blue peak—Dev.1—Single-Layer PC Red LED
47 Red peak—Dev.1—Single-Layer PC Red LED
48 Blue peak—Dev.2—Double-Layer PC Red LED
49 Red peak—Dev.2—Double-Layer PC Red LED
50 Color-tunable multi-LED packaged light emitting device
52 Red LED
54 Green LED
56 Blue LED
57 Chromaticity (color point)
57R Chromaticity (color point)—Red LED
57G Chromaticity (color point)—Green LED
57B Chromaticity (color point)—Red LED
57W Chromaticity (color point)—White LED
57CW Chromaticity (color point)—Cool White (CW) LED
57WW Chromaticity (color point)—Warm White (WW) LED
58 Straight line connecting chromaticity (color points)
59 White LED
60 Green photoluminescence layer
62 Green to Red photoluminescence layer
64 CW (Cool White) LED
66a First LED
66b Second LED
66c Third LED
66d Fourth LED
68 Color-tunable linear light emitting device
70 Substrate (circuit board)
72 Anode electrical connector
74 Cathode electrical connector
76 Chromaticity (color point)—Red PC LED (Pack.1)
78 Chromaticity (color point)—Green PC LED (Pack.1)
80 Chromaticity (color point)—Blue LED (Pack.1)
82 Chromaticity (color point)—White LED (Pack.1)
84 Straight line connecting chromaticity (color points)
86 Chromaticity (color point) of lowest CCT
88 Arrow—Blue region of spectrum
90 Arrow—Green region of spectrum
92 Arrow—Red region of spectrum
94 Light emission locus
96 Chromaticity (color point) of highest CCT

The invention claimed is:

1. A lighting device comprising:
a first LED having a wavelength of maximum intensity from 620 nm to 640 nm;
a second LED having a wavelength of maximum intensity from 500 nm to 565 nm;
a third LED having a wavelength of maximum intensity from 430 nm to 480 nm; and
a fourth LED for generating light comprising a CCT in a range from 1800K to 5000K;
wherein the first LED comprises a phosphor-converted LED comprising a narrowband red phosphor with a FWHM less than 55 nm, and a broadband red phosphor.

2. The lighting device of claim 1, wherein light generated by the device is tunable within a range of CCTs from 1800K to 6500K.

3. The lighting device of claim 1, wherein light generated by the device has a CRI Ra from 80 to 98.

4. The lighting device of claim 1, wherein the narrowband red phosphor is selected from the group consisting of: $K_2SiF_6:Mn^{4+}$, $K_2GeF_6:Mn^{4+}$, and $K_2TiF_6:Mn^{4+}$.

5. The lighting device of claim 1, comprising a layer comprising the narrowband red phosphor and the broadband red phosphor.

6. The lighting device of claim 1, comprising a first layer comprising the narrowband red phosphor and a second layer comprising the broadband red phosphor.

7. The lighting device of claim 1, wherein the first LED generates light with a color purity of least 90%.

8. The lighting device of claim 1, wherein the second LED comprises a phosphor-converted LED, and a green phosphor.

9. The lighting device of claim 1, wherein the fourth LED comprises a fourth LED chip having a wavelength of maximum intensity from 400 nm to 480 nm, and green to red phosphors.

10. The lighting device of claim 1, wherein at least one of the first LED, second LED, third LED or fourth LED comprises an LED flip chip or an LED chip comprising a plurality of serially connected LEDs.

11. The lighting device of claim 1, comprising a package comprising a lead frame; and a housing comprising a first cup having the first LED, a second cup having the second LED, a third cup having the third LED, and a fourth cup having the fourth LED; and wherein the lead frame comprises a common cathode electrode to each cup and a respective anode electrode to each cup.

12. The lighting device of claim 1, comprising a package comprising a lead frame; and a housing comprising a first cup having the first LED, a second cup having the second LED, a third cup having the third LED, and a fourth cup having the fourth LED; and wherein the lead frame comprises a respective cathode electrode to each cup and a respective anode electrode to each cup.

13. The lighting device of claim 12, wherein each cup comprises an anode terminal connected to the anode electrode and a cathode terminal connected to the cathode electrode and wherein the anode and cathode terminals for each recess are located on opposing edges of the housing across from one another.

14. The lighting device of claim 1, wherein at least one of the first LED, second LED, third LED or fourth LED comprises a chip scale packaged LED.

15. A lighting device comprising:
a first LED, second LED, third LED, and fourth LED for generating light of a different chromaticity,
wherein light generated by the device comprises a combination of light generated by the first LED, second LED, third LED, and fourth LED and wherein a CCT of light generated by the device is tunable within a range of CCTs,
wherein a chromaticity of light generated by the device is within 0.006 Δuv of the black body locus, and
wherein the first LED comprises a phosphor-converted red LED comprising a narrowband red phosphor with a FWHM of less than 55 nm, and a broadband red phosphor.

16. The lighting device of claim 15, wherein the narrowband red phosphor is selected from the group consisting of: $K_2SiF_6:Mn^{4+}$, $K_2GeF_6:Mn^{4+}$, and $K_2TiF_6:Mn^{4+}$ and wherein the broadband red phosphor is selected from the group consisting of: a nitride-phosphor of general composition $CaAlSiN_3:Eu^{2+}$, a nitride-based phosphor of general composition $(Sr,Ca)AlSiN_3:Eu^{2+}$, a nitride-based phosphor of general composition $(Sr,Ba)_2Si_5N_8:Eu^{2+}$, a sulfide-based phosphor material of general composition $MSe_{1-x}S_x:Eu$ wherein M is at least one of Mg, Ca, Sr, Ba and Zn and $0<x<1.0$, and a silicate-based phosphor of general composition $(Sr,Ba,Y)_3(Si,Al)O_5:Eu$.

17. The lighting device of claim 15, wherein the first LED has a wavelength of maximum intensity from 620 nm to 640 nm;
the second LED has a wavelength of maximum intensity from 500 nm to 565 nm;
the third LED has a wavelength of maximum intensity from 430 nm to 480 nm: and
the fourth LED is for generating light with a CCT of at least 1800K.

18. The lighting device of claim 15, wherein the range of CCTs is from 1800K to at least 6500K.

19. The lighting device of claim 15, wherein light generated by the device has a CRI Ra from 80 to 98.

20. A lighting arrangement comprising a circuit board and a plurality of lighting devices,
wherein each of said lighting devices comprises:
a first LED having a wavelength of maximum intensity from 620 nm to 640 nm;
a second LED having a wavelength of maximum intensity from 500 nm to 565 nm;
a third LED having a wavelength of maximum intensity from 430 nm to 480 nm; and
a fourth LED for generating light comprising a CCT in a range from 1800K to 5000K;
wherein the first LED comprises a phosphor-converted LED comprising a narrowband red phosphor with a FWHM less than 55 nm, and a broadband red phosphor.

21. The lighting arrangement of claim 20, wherein the circuit board comprises a flexible circuit board.

22. The lighting device of claim 1, wherein the broadband red phosphor is selected from the group consisting of a nitride-based phosphor of general composition $CaAlSiN_3:Eu^{2+}$, a nitride-based phosphor of general composition $(Sr,Ca)AlSiN_3:Eu^{2+}$, a nitride-based phosphor of general composition $(Sr,Ba)_2Si_5N_8:Eu^{2+}$, a sulfide-based phosphor material of general composition $MSe_{1-x}S_x:Eu$ wherein M is at least one of Mg, Ca, Sr, Ba and Zn and $0<x<1.0$, and a silicate-based phosphor of general composition $(Sr,Ba,Y)_3(Si,Al)O_5:Eu$.

* * * * *